United States Patent
Utsumi et al.

(10) Patent No.: US 8,900,788 B2
(45) Date of Patent: Dec. 2, 2014

(54) RESIST COMPOSITION FOR IMMERSION EXPOSURE AND METHOD OF FORMING RESIST PATTERN

(75) Inventors: Yoshiyuki Utsumi, Kawasaki (JP); Yasuhiro Yoshii, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 708 days.

(21) Appl. No.: 12/445,192

(22) PCT Filed: Oct. 12, 2007

(86) PCT No.: PCT/JP2007/070002
§ 371 (c)(1),
(2), (4) Date: Apr. 10, 2009

(87) PCT Pub. No.: WO2008/047729
PCT Pub. Date: Apr. 24, 2008

(65) Prior Publication Data
US 2010/0009291 A1    Jan. 14, 2010

(30) Foreign Application Priority Data

Oct. 18, 2006 (JP) .................................. 2006-283966
May 22, 2007 (JP) .................................. 2007-135781

(51) Int. Cl.
G03F 7/039 (2006.01)
G03F 7/20 (2006.01)
G03F 7/30 (2006.01)

(52) U.S. Cl.
USPC ........ 430/270.1; 430/311; 430/326; 430/907; 430/910

(58) Field of Classification Search
None
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 2006/0008736 A1 | 1/2006 | Kanda et al. | |
| 2006/0078823 A1 | 4/2006 | Kanda et al. | |
| 2006/0246373 A1 | 11/2006 | Wang | |
| 2007/0148589 A1 | 6/2007 | Kanda et al. | |
| 2007/0178405 A1* | 8/2007 | Kanda et al. | 430/270.1 |

FOREIGN PATENT DOCUMENTS

| JP | H09-208554 | 8/1997 |
|---|---|---|
| JP | H11-035551 | 2/1999 |
| JP | H11-035552 | 2/1999 |
| JP | H11-035573 | 2/1999 |
| JP | H11-322707 | 11/1999 |
| JP | 2006-048029 A | 2/2006 |
| JP | 2006-133712 A | 5/2006 |
| JP | 2006-243264 A | 9/2006 |
| JP | 2006-309245 A | 11/2006 |
| JP | 2007-065024 A | 3/2007 |
| JP | 2007-163606 A | 6/2007 |
| JP | 2007-279663 A | 10/2007 |
| KR | 10-2006-0049917 | 5/2006 |
| WO | WO 2004-074242 | 9/2004 |

OTHER PUBLICATIONS

International Search Report issued for corresponding PCT Application No. PCT/JP2007/070002, dated Nov. 6, 2007.
Office Action issued on counterpart Korean Patent Application No. 10-2009-7008301, dated Jan. 21, 2011.
D. Gil et al., "First Microprocessors with Immersion Lithography," Optical Microlithography XVIII, Proceedings of SPIE (U.S.), vol. 5754, pp. 119-128 (2005).
Borodovsky, Yan, "Marching to the beat of Moore's Law," Proceedings of SPIE vol. 6153, pp. 615301-1 to 615301-19 (2006).
Kodama et al., "Synthesis of Novel Fluoropolymer for 157nm Photoresists by Cyclo-polymerization," Proceedings of SPIE, vol. 4690, pp. 76-83.

* cited by examiner

*Primary Examiner* — Sin J. Lee
(74) *Attorney, Agent, or Firm* — Knobbe Martens Olson & Bear LLP

(57) ABSTRACT

A resist composition for immersion exposure, including: a base component (A) which exhibits changed solubility in an alkali developing solution under action of an acid, and contains no structural unit (c1) represented by the general formula (c1-1) shown below; an acid generator component (B) which generates an acid upon exposure; and a fluorine-containing resin component (C) which contains the structural unit (c1)

[Chemical Formula 1]

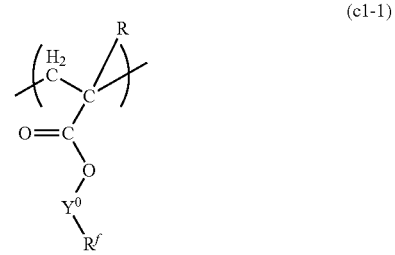

(c1-1)

(in the formula (c1-1), R represents a hydrogen atom, a lower alkyl group, a halogen atom, or a halogenated lower alkyl group; $R^f$ represents a fluorinated alkyl group; and $Y^0$ represents an alkylene group).

9 Claims, 3 Drawing Sheets

RESIST COMPOSITION FOR IMMERSION EXPOSURE AND METHOD OF FORMING RESIST PATTERN

RELATED APPLICATIONS

This application is the U.S. National Phase filing under 35 U.S.C. §371 of PCT/JP2007/070002, filed Oct. 12, 2007, which designated the United States and was published in a language other than English, which claims priority under 35 U.S.C. §119(a)-(d) to Japanese Patent Application No. 2006-283966, filed Oct. 18, 2006, and Japanese Patent Application No. 2007-135781, filed May 22, 2007. The contents of these applications are incorporated herein by reference in their entireties.

TECHNICAL FIELD

The present invention relates to a resist composition for immersion exposure used in liquid immersion lithography, and a method of forming a resist pattern.

BACKGROUND ART

Lithography techniques include processes in which, for example, a resist film formed from a resist material is formed on top of a substrate, the resist film is selectively exposed with irradiation such as light, an electron beam or the like through a mask in which a predetermined pattern has been formed, and then a developing treatment is conducted, thereby forming a resist pattern of the prescribed shape in the resist film.

For miniaturization of semiconductor devices, shortening of the wavelength of the exposure light source, and increasing of the numerical aperture (NA) of the projector lens have progressed. Currently, exposure apparatuses in which an ArF excimer laser having a wavelength of 193 nm is used as an exposure light source and NA=0.84 have been developed. As shortening the wavelength of the exposure light source progresses, it is required to improve various lithography properties of the resist material, such as the sensitivity to the exposure light source and a resolution capable of reproducing patterns of minute dimensions. As resist materials which fulfill the aforementioned requirements, there is used a chemically-amplified resist containing a base resin that displays changed solubility in an alkali developing solution under action of an acid, and an acid generator that generates an acid upon exposure.

Resins (acrylic resins) that contain structural units derived from (meth)acrylate esters within the main chain are now widely used as base resins for chemically-amplified resists that use ArF excimer laser lithography, as they exhibit excellent transparency in the vicinity of 193 nm.

Here, the term "(meth)acrylic acid" is a generic term that includes either or both of the acrylic acid having a hydrogen atom bonded to the α-position and the methacrylic acid having a methyl group bonded to the α-position. The term "(meth)acrylate ester" is a generic term that includes either or both of an acrylate ester having a hydrogen atom bonded to the α-position and a methacrlyate ester having a methyl group bonded to the α-position. The term "(meth)acrylate" is a generic term that includes either or both of an acrylate having a hydrogen atom bonded to the α-position and a methacrylate having a methyl group bonded to the α-position.

As a technique for further improving the resolution, a lithography method called liquid immersion lithography (hereinafter, frequently referred to as "immersion exposure") is known in which exposure (immersion exposure) is conducted in a state where the region between the objective lens of an exposure apparatus and the resist layer formed on a wafer is filled with a solvent (immersion solvent) that has a larger refractive index than the refractive index of air (see for example, Non-Patent Document 1).

According to this type of immersion exposure, it is considered that even if an exposure light source with the same wavelength as those conventionally used is used, high resolution equivalent to the resolution obtained by using an exposure light source with a shorter wavelength or by using a larger NA lens can be obtained, with no lowering of the depth of focus. Furthermore, immersion exposure can be conducted using a conventional exposure apparatus. As a result, it is expected that immersion exposure will enable the formation of resist patterns of high resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion exposure is effective in forming patterns having various shapes. Further, immersion exposure is expected to be capable of being used in combination with currently studied super-resolution techniques, such as phase shift method and modified illumination method. Currently, as the immersion exposure technique, a technique using an ArF excimer laser as an exposure source is being actively studied, and water is mainly used as the immersion solvent.

In recent years, fluorine-containing compounds have been attracting attention for their properties such as water repellency and transparency, and active research and development of fluorine-containing compounds have been conducted in various fields. For example, in the field of resist materials, currently, an acid-labile group such as a methoxymethyl group, tert-butyl group or tert-butoxycarbonyl group is being introduced into a fluorine-containing polymeric compound, in order that the fluorine-containing polymeric compound is used as a base resin for a chemically-amplified positive resist. However, when such a fluorine-containing polymeric compound is used as a base resin for a chemically-amplified positive resist, a disadvantage is caused in that, for example, a large amount of gas (out-gas) is generated after exposure, and the resistance against dry-etching gas (etching resistance) is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2).

[Non-Patent Document 1] Proceedings of SPIE, Vol. 5754, pp. 119-128 (2005).

[Non-Patent Document 2] Proceedings of SPIE, Vol. 4690, pp. 76-83 (2002).

DISCLOSURE OF THE INVENTION

Problems to be Solved by the Invention

In immersion exposure, it is required to use a resist material which exhibits not only general lithography properties (e.g., sensitivity, resolution, etching resistance and the like), but also properties suited for liquid immersion lithography. For example, when the immersion medium is water, and immersion exposure is performed using a scanning-type immersion exposure apparatus as disclosed in Non-Patent Document 1, the performance (water tracking ability) in which the immersion solvent moves following the movement of the lens is required. When the water tracking ability is low, the exposure speed becomes low, and as a result, there is a possibility that the productivity is adversely affected. It is presumed that the water tracking ability can be improved by enhancing the hydrophobicity of the resist film (rendering the resist film hydrophobic). However, if the resist film is simply rendered hydrophobic, then adverse effects are seen on the lithography properties and, for example, the resolution and sensitivity tend to deteriorate, and the quantity of scum generated tends to increase.

Thus, in immersion exposure, the development of materials having an appropriate level of hydrophobicity has become an important issue.

However, currently, materials that combine favorable lithography properties with the properties required for immersion exposure and the like are almost unknown.

The present invention takes the above circumstances into consideration, with an object of providing a resist composition for immersion exposure having hydrophobicity suitable for immersion exposure as well as favorable lithography properties, and a method of forming a resist pattern.

Means for Solving the Problems

A first aspect of the present invention to solve the above problems is a resist composition for immersion exposure, including: a base component (A) which exhibits changed solubility in an alkali developing solution under action of an acid, and contains no structural unit (c1) represented by the general formula (c1-1) shown below; an acid generator component (B) which generates an acid upon exposure; and a fluorine-containing resin component (C) which contains the structural unit (c1).

[Chemical Formula 1]

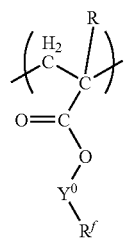

(c1-1)

(In the formula (c1-1), R represents a hydrogen atom, a lower alkyl group, a halogen atom, or a halogenated lower alkyl group; $R^f$ represents a fluorinated alkyl group; and $Y^0$ represents an alkylene group.)

A second aspect of the present invention to solve the above problems is a positive resist composition for immersion exposure, including: a base component (A') which exhibits increased solubility in an alkali developing solution under action of an acid, and contains no structural unit (c0) represented by the general formula (c0-1) shown below; an acid generator component (B) which generates an acid upon exposure; and a fluorine-containing polymeric compound (C') which contains the structural unit (c0) and a structural unit (c11) derived from an acrylate ester which contains an acid dissociable, dissolution inhibiting group.

[Chemical Formula 2]

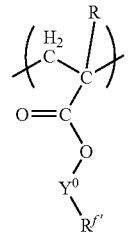

(c0-1)

(In the formula (c0-1), R represents a hydrogen atom, a lower alkyl group, or a halogenated lower alkyl group; $R^{f1}$ represents a fluorinated hydrocarbon group which may or may not contain a substituent group, with the proviso that if a hydroxyl group is included as the substituent group, a fluorine atom or a fluorinated alkyl group is not bonded to the carbon atom to which the hydroxyl group is bonded; and $Y^0$ represents an alkylene group.)

A third aspect of the present invention is a method of forming a resist pattern, which includes: forming a resist film on a substrate using the resist composition for immersion exposure of the first aspect; conducting immersion exposure of the resist film; and developing the resist film to form a resist pattern.

A fourth aspect of the present invention is a method of forming a resist pattern, which includes: forming a resist film on a substrate using the positive resist composition for immersion exposure of the second aspect; conducting immersion exposure of the resist film; and developing the resist film to form a resist pattern.

In the present specification and claims, the term "alkyl group" is a concept containing a linear, branched, and cyclic monovalent saturated hydrocarbon group, unless another specific definition is provided.

The term "lower alkyl group" means an alkyl group of 1 to 5 carbon atoms.

The term "lower alkyl group" in "halogenated lower alkyl group" is as defined above in the "lower alkyl group".

The term "structural unit" means a monomer unit that contributes to the formation of a resin (polymer, or polymeric compound).

The term "exposure" is used as a general concept involving irradiation with any form of radiation.

EFFECTS OF THE INVENTION

According to the present invention, there can be provided a resist composition for immersion exposure which has excellent lithography properties and has hydrophobicity suitable for immersion exposure; and a method of forming a resist pattern.

Figure 1:
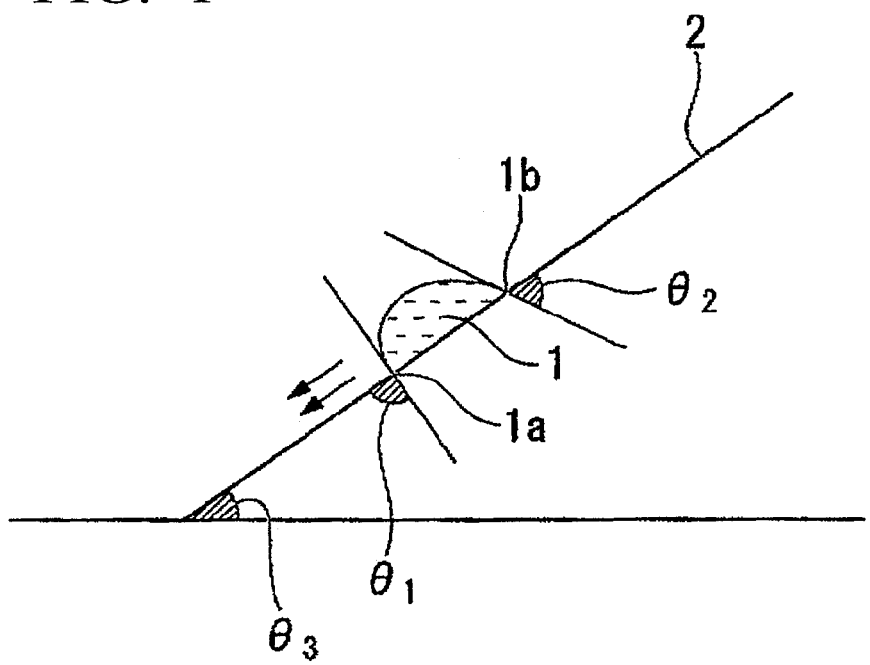
FIG. 1 is an explanation drawing of an advancing angle ($\theta_1$), a receding angle ($\theta_2$), and a sliding angle ($\theta_3$).

BRIEF DESCRIPTION OF THE REFERENCE NUMERALS 1 droplet, 1a bottom edge, 1b top edge, 2 flat surface, $\theta_1$ advancing angle, $\theta_2$ receding angle, $\theta_3$ sliding angle

BEST MODE FOR CARRYING OUT THE INVENTION

<<Resist Composition for Immersion Exposure>>

The resist composition for immersion exposure of the first aspect of the present invention includes: a base component (A) (hereinafter, referred to as component (A)) which exhibits changed solubility in an alkali developing solution under action of an acid, and which contains no structural unit (c1) represented by the above general formula (c1-1); an acid generator component (B) (hereinafter, referred to as component (B)) which generates an acid upon exposure; and a fluorine-containing resin component (C) (hereinafter, referred to as component (C)) which contains the structural unit (c1).

<<Positive Resist Composition for Immersion Exposure>>

The positive resist composition for immersion exposure of the second aspect of the present invention includes: a base component (A') (hereinafter, referred to as component (A')) which exhibits increased solubility in an alkali developing solution under action of an acid, and which contains no structural unit (c0) represented by the above general formula (c0-1); an acid generator component (B) (hereinafter, referred to as component (B)) which generates an acid upon exposure; and a fluorine-containing polymeric compound (C') (hereinafter, referred to as component (C')) which contains the structural unit (c0) and a structural unit (c11) derived from an acrylate ester which contains an acid dissociable, dissolution inhibiting group.

<Component (A)>

The component (A) is not particularly limited as long as it contains no structural unit (c1), and it may be appropriately selected from any of the multitude of base components which have been conventionally proposed for use in a chemically-amplified resist composition, such as a base component used within resist compositions for ArF excimer lasers, KrF excimer lasers, or the like (and preferably for ArF excimer lasers).

Also, the component (A) may be a low molecular weight compound which exhibits changed solubility in an alkali developing solution under action of an acid, may be a resin which exhibits changed solubility in an alkali developing solution under action of an acid, or may be a mixture of them.

The structural unit (c1) will be described in more detail below in the section of "Component (C)".

<Component (A')>

The component (A') is not particularly limited as long as it exhibits increased solubility in an alkali developing solution under action of an acid and contains no structural unit (c0), and it may be appropriately selected from any of the multitude of base components which have been conventionally proposed for use in a chemically-amplified resist composition, such as a base component used within resist compositions for ArF excimer lasers, KrF excimer lasers or the like (and preferably ArF excimer lasers). The structural unit (c0) will be described in more detail below in the section of "Component (C')".

Here, in the components (A) and (A'), the term "base component" means an organic compound which has a film-forming performance.

Preferable examples of the base component include an organic compound whose molecular weight is 500 or more.

When the molecular weight of the organic compound is 500 or more, the film-forming performance can be improved, and a nano-level resist pattern can easily be formed.

The organic compounds whose molecular weight is 500 or more can be classified broadly into a low molecular weight organic compound (hereinafter, referred to as low molecular weight compound) whose molecular weight is within the range of 500 to less than 2,000, and a resin (polymer, or polymeric compound) whose molecular weight is 2,000 or more. As the low molecular weight compound, a non-polymer is typically used. In the case of using a resin (polymer, polymeric compound), the polystyrene equivalent molecular weight determined by gel permeation chromatography (GPC) is used as the "molecular weight". Hereinafter, in the case of merely using the term "resin", it means a resin with a molecular weight of 2,000 or more.

The resist composition for immersion exposure of the first aspect of the present invention may be a negative resist composition or a positive resist composition.

If the resist composition for immersion exposure of the first aspect of the present invention is a negative resist composition, as the component (A), a base component which exhibits decreased solubility in an alkali developing solution under action of an acid is used. As the base component, an alkali soluble resin is typically used.

In the case that the resist composition for immersion exposure of the first aspect of the present invention is a negative resist composition, a cross-linking agent component is further added to the negative resist composition. In the negative resist composition, when an acid is generated from the component (B) upon exposure in the formation of a resist pattern, the action of this acid causes a cross-linking reaction between the component (A) and the cross-linking agent component, and the alkali soluble resin becomes insoluble in an alkali developing solution. Therefore, in the formation of a resist pattern, when a resist film obtained by applying the negative resist composition on the substrate is subjected to selective exposure, the exposed area becomes insoluble in an alkali developing solution, while the unexposed area remains alkali-soluble, and hence a resist pattern can be formed by a developing treatment with an alkali.

As the alkali-soluble resin, it is preferable to use a resin having a structural unit derived from at least one of an α-(hydroxyalkyl)acrylic acid and a lower alkyl ester of α-(hydroxyalkyl)acrylic acid, because it enables formation of a satisfactory resist pattern with minimal swelling. Here, the term "α-(hydroxyalkyl)acrylic acid" means one or both of acrylic acid in which a hydrogen atom is bonded to the carbon atom at the α-position to which the carboxyl group bonded, and an α-hydroxyalkylacrylic acid in which a hydroxyalkyl group (preferably a hydroxyalkyl group of 1 to 5 carbon atoms) is bonded to the carbon atom at the α-position.

As a cross-linking agent component, usually, an amino-based cross-linking agent such as a glycoluril that contains a methylol group or an alkoxymethyl group is preferable, because it enables an excellent resist pattern with minimal swelling to be formed. The blend quantity of the cross-linking agent component is preferably within the range of 1 to 50 parts by weight, relative to 100 parts by weight of the alkali-soluble resin.

If the resist composition for immersion exposure of the first aspect of the present invention is a positive resist composition, a base component which contains an acid dissociable, dissolution inhibiting group and exhibits increased solubility in an alkali developing solution under action of an acid can be used as the component (A). The resist composition including such a base component is insoluble in an alkali developing solution before exposure, and when an acid is generated from the component (B) upon exposure in the formation of a resist pattern, an acid dissociable, dissolution inhibiting group dissociates under action of this acid, and the component (A) changes to be soluble in an alkali developing solution. Therefore, in the formation of a resist pattern, when a resist film obtained by applying the positive resist composition on the substrate is subjected to selective exposure, the exposed area becomes soluble in an alkali developing solution, while the unexposed area remains alkali-insoluble, and hence a resist pattern can be formed by a developing treatment with an alkali.

In the resist composition for immersion exposure of the first aspect of the present invention, the component (A) is preferably a base component which exhibits increased solubility in an alkali developing solution under action of an acid, because it excels in the effects of the present invention. Of these, the component (A) is particularly preferably a base component which contains an acid dissociable, dissolution inhibiting group and exhibits increased solubility in an alkali developing solution. That is, the resist composition for immersion exposure of the first aspect of the present invention is preferably a positive resist composition.

The base component may be a resin (A1) (hereinafter, sometimes referred to as component (A1)) which exhibits increased solubility in an alkali developing solution under action of an acid, or may be a low molecular weight compound (A2) (hereinafter, sometimes referred to as component (A2)) which exhibits increased solubility in an alkali developing solution under action of an acid.

In terms of miscibility with the component (C), availability or the like, the component (A) is preferably the component (A1).

In the positive resist composition for immersion exposure of the second aspect of the present invention, a base component which contains an acid dissociable, dissolution inhibiting group and exhibits increased solubility in an alkali developing solution under action of an acid can be preferably used as the component (A'). The resist composition including such a base component is insoluble in an alkali developing solution before exposure, and when an acid is generated from the component (B) upon exposure in the formation of a resist pattern, then an acid dissociable, dissolution inhibiting group dissociates under action of this acid, and the entire component (A') increases solubility in an alkali solution and changes from an alkali-insoluble state to an alkali-soluble state.

Therefore, in the formation of a resist pattern, when a resist film obtained by applying the positive resist composition on the substrate is subjected to selective exposure, the exposed area becomes soluble in an alkali developing solution, while the unexposed area remains alkali-insoluble, and hence a resist pattern can be formed by a developing treatment with an alkali.

In the positive resist composition for immersion exposure of the second aspect of the present invention, the component (A') may be a resin (A1) which exhibits increased solubility in an alkali developing solution under action of an acid, may be a low molecular weight compound (A2) which exhibits increased solubility in an alkali developing solution under action of an acid, or may be a mixture of them.

In terms of miscibility with the component (C'), availability or the like, the component (A') is preferably the component (A1).

[Component (A1)]

As the component (A1), any of the multitude of base resins which have been conventionally proposed for use in a chemically-amplified positive resist composition can be used, and examples of the base resin include resins containing an alkali-soluble group (hydroxyl group, carboxyl group or the like) in which a part or all of the alkali-soluble groups are protected with acid dissociable, dissolution inhibiting groups. Examples of the resin containing an alkali-soluble group include novolak resins; resins (polyhydroxystyrene, hydroxystyrene-styrene copolymer or the like) which contain a structural unit derived from hydroxystyrene; resins containing a structural unit derived from an acrylate ester; and resins containing a structural unit derived from cycloolefin.

In the present invention, the component (A1) is preferably a resin containing a structural unit derived from an acrylate ester. The resin exhibits a high degree of transparency particularly relative to an ArF excimer laser, and thus can be suitably used in lithography using an ArF excimer laser.

In the component (A1), the proportion of the structural unit derived from an acrylate ester is preferably 20 mol % or more, more preferably 50 mol % or more, still more preferably 80 mol % or more, and may be 100 mol %, based on the combined total of all structural units constituting the component (A1).

Here, the term "structural unit derived from an acrylate ester" in the present specification and claims means a structural unit formed by cleavage of the ethylenic double bond of an acrylate ester.

The term "acrylate ester" is a concept containing an acrylate ester in which a hydrogen atom is bonded to the carbon atom at the α-position, and an α-substituted acrylate ester in which a hydrogen atom bonded to the carbon atom at the α-position is substituted with a substituent group (an atom or group other than a hydrogen atom). Examples of the substituent group include a lower alkyl group, a halogen atom, and a halogenated lower alkyl group. The term "α-position (carbon atom at the α-position)" in the structural unit derived from an acrylate ester means the carbon atom to which the carbonyl group is bonded, if not otherwise specified.

In the acrylate ester, specific examples of the lower alkyl group as the substituent group at the α-position include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

Examples of the halogen atom include a fluorine atom, a chlorine atom, an iodine atom, and a bromine atom.

In the acrylate ester, specific examples of the halogenated lower alkyl group as the substituent group at the α-position include groups in which a part of or all of the hydrogen atoms of the aforementioned lower alkyl group are substituted with halogen atoms. As the halogen atoms with which hydrogen atoms of the lower alkyl group are substituted, a fluorine atom, a chlorine atom, a bromine atom, or an iodine atom can be used.

In the present invention, the group which is bonded to the α-position of the acrylate ester is preferably a hydrogen atom, a lower alkyl group or a halogenated lower alkyl group; more preferably a hydrogen atom or a lower alkyl group; and most preferably a hydrogen atom or a methyl group, in terms of industrial availability.

—Structural Unit (a1)

In the present invention, the component (A1) preferably contains the structural unit (a1) derived from an acrylate ester which contains an acid dissociable, dissolution inhibiting group.

As the acid dissociable, dissolution inhibiting group in the structural unit (a1), any of the groups that have been proposed as acid dissociable, dissolution inhibiting groups for the base resins of chemically-amplified resists can be used, provided the group has an alkali dissolution-inhibiting effect that renders the entire component (A1) alkali-insoluble prior to dissociation, and then following dissociation by action of an acid, causes the entire component (A1) to change to an alkali-soluble state. Generally, groups that form either a cyclic or chain-like tertiary alkyl ester with the carboxyl group of the (meth)acrylic acid or the like; and acetal-type acid dissociable, dissolution inhibiting groups such as alkoxyalkyl groups are widely known.

Here, the term "tertiary alkyl ester" means a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(O)—O—). In the tertiary alkyl ester, the bond of the oxygen atom to the tertiary carbon atom is cleaved under action of an acid.

Here, the chain-like or cyclic alkyl group may contain a substituent group.

Hereinafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of the tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

Here, the term "aliphatic" is a relative concept used in relation to the term "aromatic", and defines a group, a compound or the like that contains no aromaticity.

The term "aliphatic branched" means a branched structure having no aromaticity.

The "aliphatic branched, acid dissociable, dissolution inhibiting group" is not limited to groups (hydrocarbon groups) composed of carbon atoms and hydrogen atoms, and is preferably a hydrocarbon group. Further, the "hydrocarbon group" may be either saturated or unsaturated, and is preferably saturated.

Examples of aliphatic branched, acid dissociable, dissolution inhibiting groups include tertiary alkyl groups of 4 to 8 carbon atoms, and specific examples thereof include a tert-butyl group, a tert-pentyl group and a tert-heptyl group.

The term "aliphatic cyclic group (alicyclic group)" means a monocyclic or polycyclic group which has no aromaticity.

The "aliphatic cyclic group" within the structural unit (a1) may or may not contain a substituent group. Examples of the substituent group include a lower alkyl group of 1 to 5 carbon atoms, a fluorine atom, a fluorinated lower alkyl group of 1 to 5 carbon atoms, and an oxygen atom (=O).

The basic ring of the "aliphatic cyclic group" exclusive of substituent groups is not limited to groups (hydrocarbon groups) composed of carbon atoms and hydrogen atoms, but is preferably a hydrocarbon group.

Further, the "hydrocarbon group" may be either saturated or unsaturated, and is preferably saturated. The "aliphatic cyclic group" preferably contains 4 to 20 carbon atoms, and more preferably 5 to 12 carbon atoms. Also, it is preferably a polycyclic group.

Examples of the aliphatic cyclic group include groups in which one or more hydrogen atoms have been removed from a mono cycloalkane or a polycycloalkane such as a bicycloalkane, tricycloalkane or tetracycloalkane in which a lower alkyl group, a fluorine atom or a fluorinated lower alkyl group may or may not be included as a substituent group. Specific examples include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cyclic alkyl group can be used. Specific examples thereof include a 2-methyl-2-adamantyl group and a 2-ethyl-2-adamantyl group. Further, in structural units represented by general formulae (a1"-1) to (a1"-6) shown below, groups bonded to the oxygen atom of the carbonyloxy group (—C(O)—O—), that is, groups having an aliphatic cyclic group such as an adamantyl group, a cyclohexyl group, a cyclopentyl group, a norbornyl group, a tricyclodecanyl group or a tetracyclodecanyl group, and a branched alkylene group having a tertiary carbon atom bonded thereto, can be used.

[Chemical Formula 3]

(a1"-1)

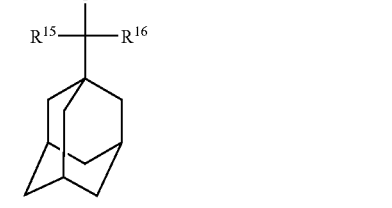

(a1"-2)

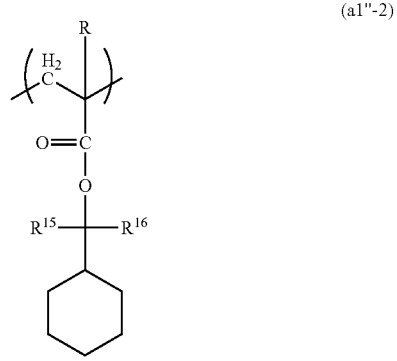

(a1"-3)

-continued (a1"-4)

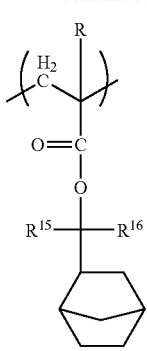

(a1"-5)

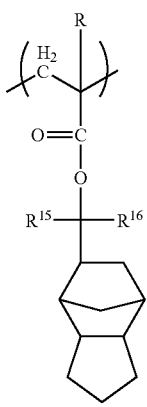

(a1"-6)

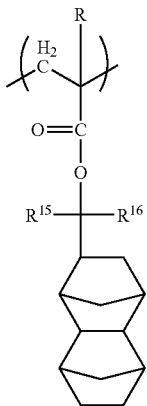

(In the formulae, R represents a hydrogen atom, a halogen atom, a lower alkyl group or a halogenated lower alkyl group; and $R^{15}$ and $R^{16}$ each independently represents an alkyl group (which may be linear or branched, and is preferably an alkyl group of 1 to 5 carbon atoms).)

In the general formulae (a1"-1) to (a1"-6), the lower alkyl group or halogenated lower alkyl group for R are the same as the lower alkyl group or halogenated lower alkyl group which can be bonded to the α-position of the acrylate ester described above.

An "acetal-type acid dissociable, dissolution inhibiting group" is generally substituted for a hydrogen atom at the terminal of an alkali-soluble group such as a carboxy group or a hydroxyl group, thereby being bonded to an oxygen atom. When an acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of the acetal-type acid dissociable, dissolution inhibiting group include groups represented by the general formula (p1) shown below.

[Chemical Formula 4]

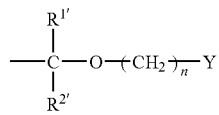

(p1)

(In the formula, $R^{1'}$ and $R^{2'}$ each independently represents a hydrogen atom or a lower alkyl group; n represents an integer of 0 to 3; and Y represents a lower alkyl group or an aliphatic cyclic group.)

In the above formula, n is preferably an integer of 0 to 2, more preferably 0 or 1, and most preferably 0.

As the lower alkyl group for $R^{1'}$ and $R^{2'}$, the same lower alkyl groups as those described above for R can be used. As the lower alkyl group for $R^{1'}$ or $R^{2'}$, a methyl group or an ethyl group is preferable, and a methyl group is most preferable.

In the present invention, at least one of $R^{1'}$ and $R^{2'}$ is preferably a hydrogen atom. That is, it is preferable that the acid dissociable, dissolution inhibiting group (p1) be a group represented by the general formula (p1-1) shown below.

[Chemical Formula 5]

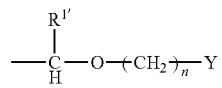

(p1-1)

(In the formula, $R^{1'}$, n, and Y are the same as $R^{1'}$, n, and Y described above in the general formula (p1).)

As the lower alkyl group for Y, the same lower alkyl groups as those described above for R can be used.

As the aliphatic cyclic group for Y, any of the aliphatic monocyclic or polycyclic groups which have been proposed for conventional ArF resists or the like can be used by being appropriately selected. For example, the same groups described above in the "aliphatic cyclic group" can be used.

Further, as the acetal-type, acid dissociable, dissolution inhibiting group, groups represented by the general formula (p2) shown below can also be used.

[Chemical Formula 6]

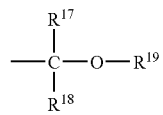

(p2)

(In the formula, $R^{17}$ and $R^{18}$ each independently represents a linear or branched alkyl group or a hydrogen atom; and $R^{19}$ represents a linear, branched or cyclic alkyl group. Alternatively, $R^{17}$ and $R^{19}$ each may independently represent a linear or branched alkylene group, wherein the terminal of $R^{17}$ is bonded to the terminal of $R^{19}$ thereby forming a ring.)

The alkyl group for $R^{17}$ and $R^{18}$ preferably has 1 to 15 carbon atoms, and may be either linear or branched. Of these, as the alkyl group for $R^{17}$ and $R^{18}$, an ethyl group or a methyl group is more preferable, and a methyl group is most preferable. Particularly, it is preferable that one of $R^{17}$ and $R^{18}$ be a hydrogen atom, and the other be a methyl group.

$R^{19}$ represents a linear, branched or cyclic alkyl group, preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Specific examples of the cyclic alkyl group include groups in which one or more hydrogen atoms have been removed from a monocycloalkane or a polycycloalkane such as a bicycloalkane, tricycloalkane or tetracycloalkane, in which a fluorine atom or a fluorinated alkyl group may or may not be included as a substituent group. Specific examples thereof include groups in which one or more hydrogen atoms have been removed from a monocycloalkane such as cyclopentane or cyclohexane, and a polycycloalkane such as adamantane, norbornane, isobornane, tricyclodecane, or tetracyclododecane. Of these, groups in which one or more hydrogen atoms have been removed from adamantane are preferable.

Also, in the general formula (p2), $R^{17}$ and $R^{19}$ each may independently represent a linear or branched alkylene group (and preferably an alkylene group of 1 to 5 carbon atoms), wherein the terminal of $R^{19}$ is bonded to the terminal of $R^{17}$.

In this case, a cyclic group is formed by $R^{17}$, $R^{19}$, the oxygen atom to which $R^{19}$ is bonded, and the carbon atom to which the oxygen atom and $R^{17}$ are bonded. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), it is preferable to use at least one member selected from the group consisting of structural units represented by the general formula (a1-0-1) shown below and structural units represented by the general formula (a1-0-2) shown below.

[Chemical Formula 7]

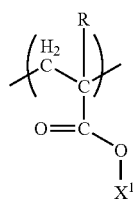

(a1-0-1)

(In the formula, R represents a hydrogen atom, a halogen atom, a lower alkyl group, or a halogenated lower alkyl group; and $X^1$ represents an acid dissociable, dissolution inhibiting group.)

[Chemical Formula 8]

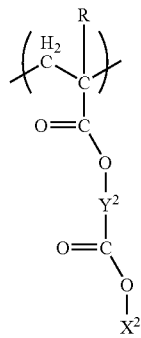

(a1-0-2)

(In the formula, R represents a hydrogen atom, a halogen atom, a lower alkyl group or a halogenated lower alkyl group; $X^2$ represents an acid dissociable, dissolution inhibiting group; and $Y^2$ represents an alkylene group or an aliphatic cyclic group.)

In the general formula (a1-0-1), the lower alkyl group or halogenated lower alkyl group for R are the same as the lower alkyl group or halogenated lower alkyl group which may be bonded to the α-position of the acrylate ester described above.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and of these, tertiary alkyl ester-type acid dissociable, dissolution inhibiting groups are preferable.

In the general formula (a1-0-2), R is the same as R described above in the general formula (a1-0-1).

$X^2$ is the same as $X^1$ described above in the general formula (a1-0-1).

$Y^2$ is preferably an alkylene group of 1 to 4 carbon atoms or a divalent aliphatic cyclic group. As the aliphatic cyclic group, the same aliphatic cyclic groups as those described above in the explanation of "aliphatic cyclic group" can be used, except that two or more hydrogen atoms have been removed.

Specific examples of the structural unit (a1) include structural units represented by the general formulae (a1-1) to (a1-4) shown below.

[Chemical Formula 9]

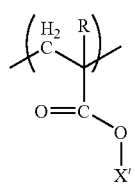

(a1-1)

-continued

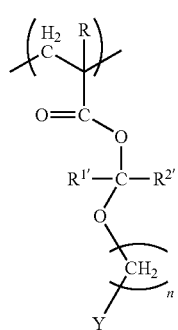
(a1-2)

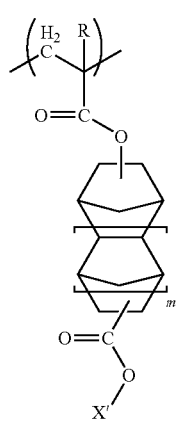
(a1-3)

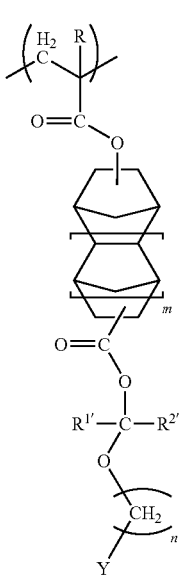
(a1-4)

(In the above formulae, X' represents a tertiary alkyl ester-type acid dissociable, dissolution inhibiting group; Y represents a lower alkyl group of 1 to 5 carbon atoms or an aliphatic cyclic group; n represents an integer of 0 to 3; m represents an integer of 0 or 1; R is the same as R in the above general formula (a1-0-1); and $R^{1'}$ and $R^{2'}$ each independently represents a hydrogen atom or a lower alkyl group of 1 to 5 carbon atoms.)

It is preferable that at least one of $R^{1'}$ and $R^{2'}$ represent a hydrogen atom, and it is more preferable that both of $R^{1'}$ and $R^{2'}$ represent hydrogen atoms. n is preferably 0 or 1.

Examples of the tertiary alkyl ester-type acid dissociable, dissolution inhibiting group for X' are the same tertiary alkyl ester-type acid dissociable, dissolution inhibiting groups as those described above for $X^1$.

Examples of the aliphatic cyclic group for Y include the same groups as those described above in the explanation of "aliphatic cyclic group".

Specific examples of the structural unit represented by the general formulae (a1-1) and (a1-4) shown above include the following.

[Chemical Formula 10]

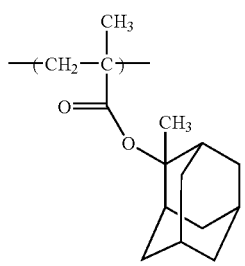
(a1-1-1)

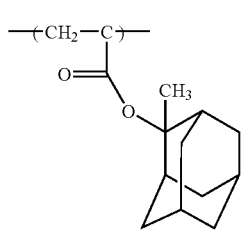
(a1-1-2)

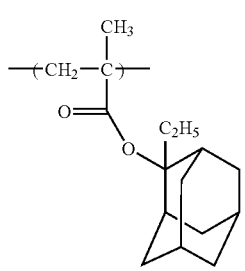
(a1-1-3)

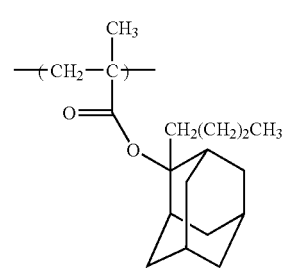
(a1-1-4)

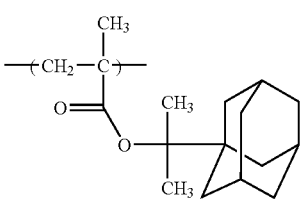
(a1-1-5)

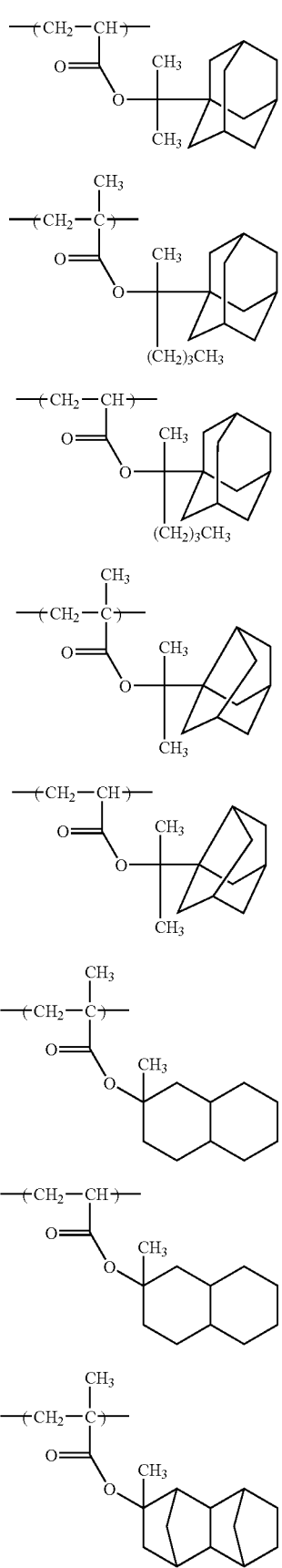
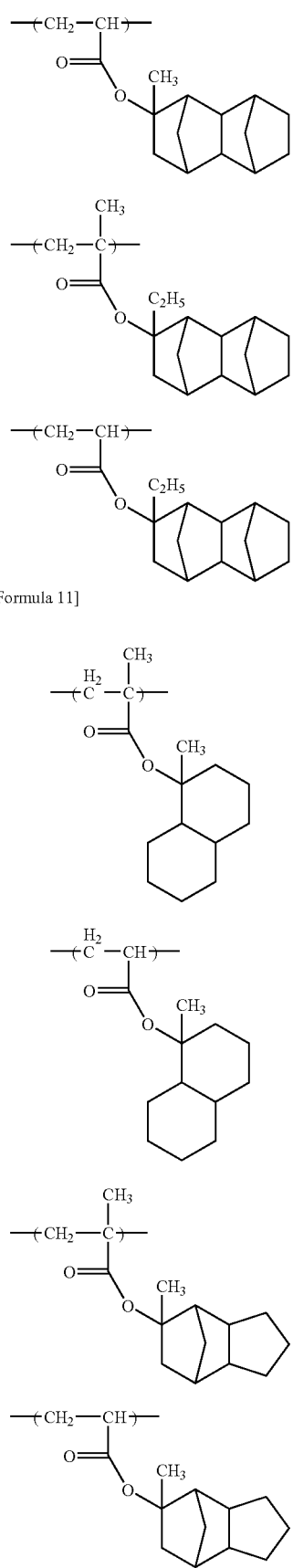
[Chemical Formula 11]

-continued
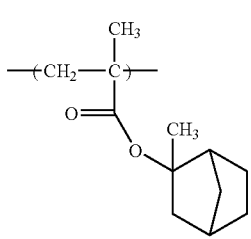 (a1-1-21)
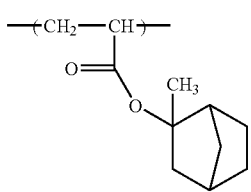 (a1-1-22)
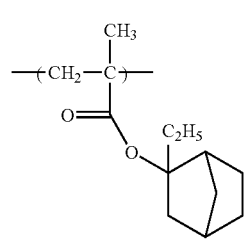 (a1-1-23)
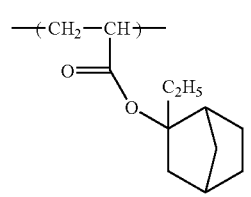 (a1-1-24)
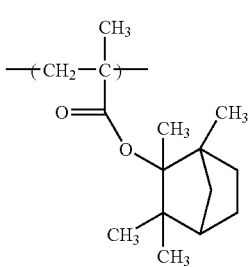 (a1-1-25)
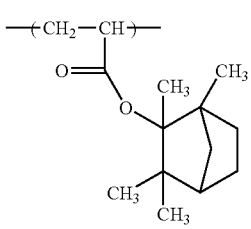 (a1-1-26)
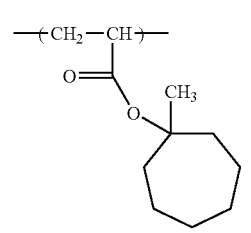 (a1-1-27)
-continued
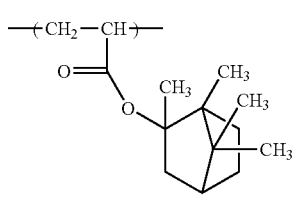 (a1-1-28)
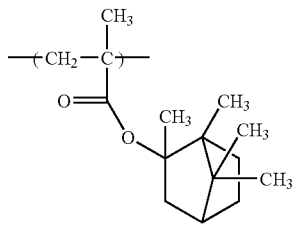 (a1-1-29)
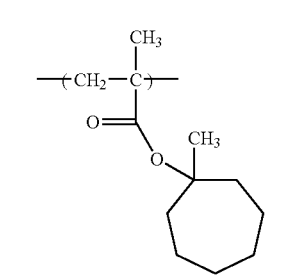 (a1-1-30)
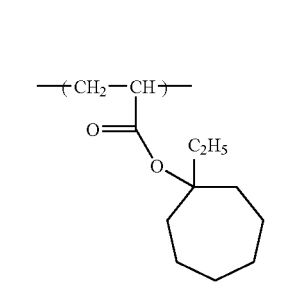 (a1-1-31)
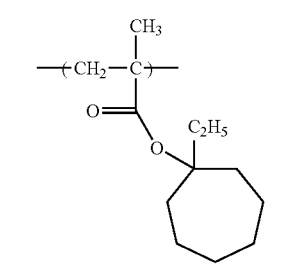 (a1-1-32)
[Chemical Formula 12]
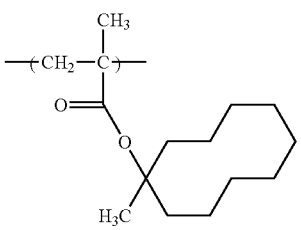 (a1-1-33)

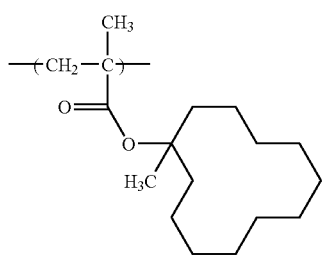
(a1-1-34)
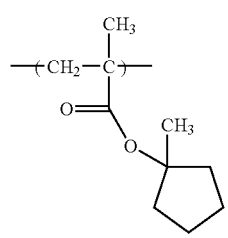
(a1-1-35)
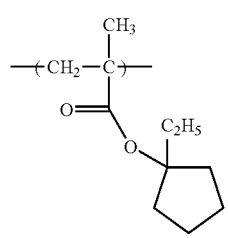
(a1-1-36)
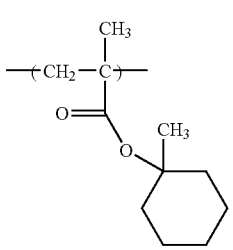
(a1-1-37)
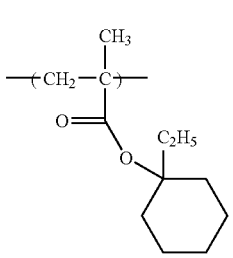
(a1-1-38)
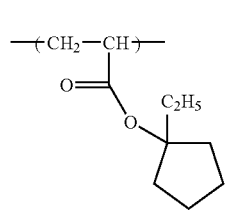
(a1-1-39)
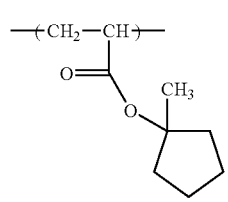
(a1-1-40)
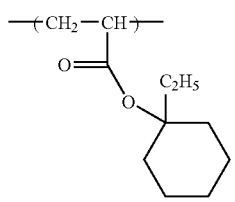
(a1-1-41)
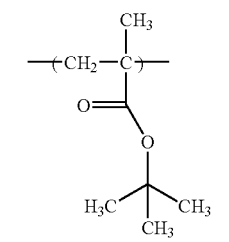
(a1-1-42)
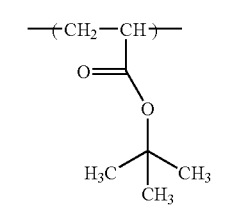
(a1-1-43)
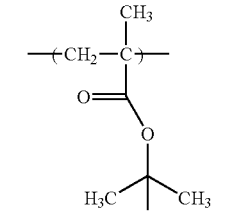
(a1-1-44)
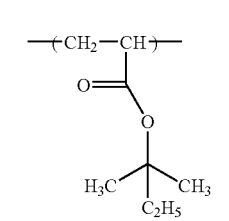
(a1-1-45)
[Chemical Formula 13]
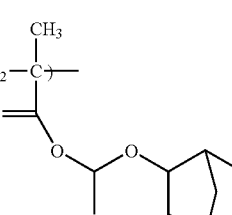
(a1-2-1)
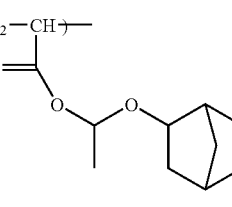
(a1-2-2)

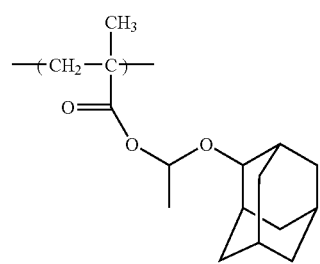
(a1-2-3)
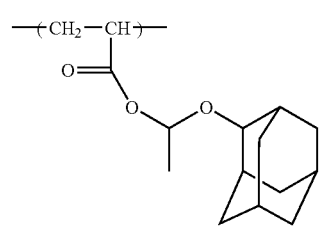
(a1-2-4)
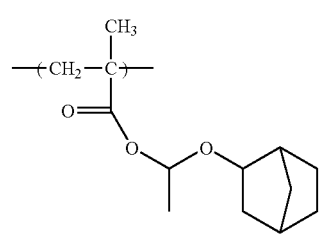
(a1-2-5)
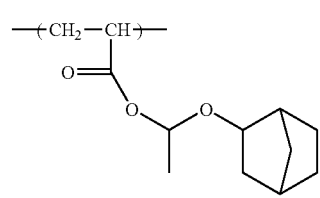
(a1-2-6)
[Chemical Formula 14]
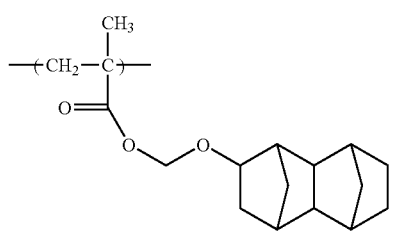
(a1-2-7)
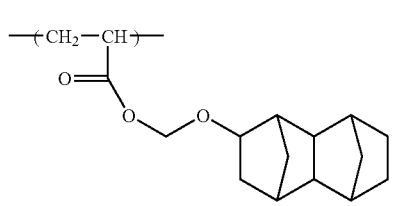
(a1-2-8)
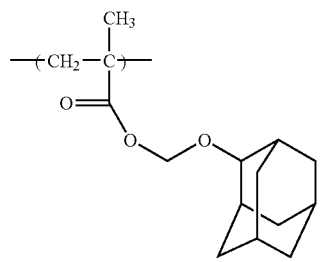
(a1-2-9)
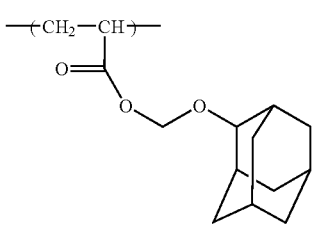
(a1-2-10)
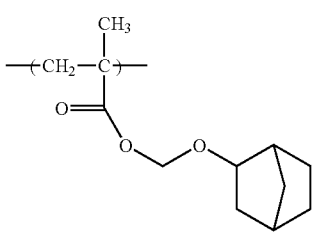
(a1-2-11)
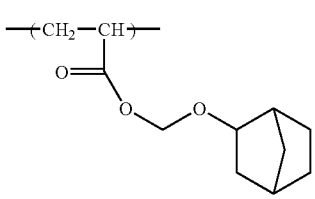
(a1-2-12)
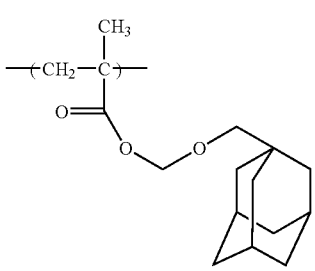
(a1-2-13)
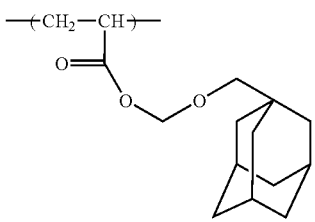
(a1-2-14)
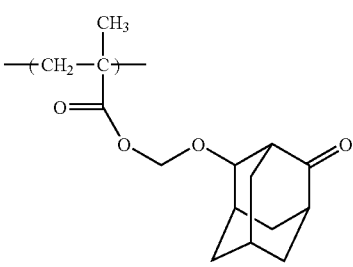
(a1-2-15)

-continued
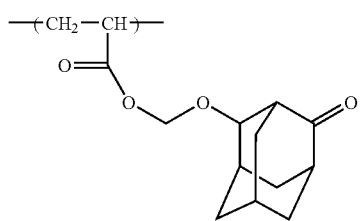 (a1-2-16)
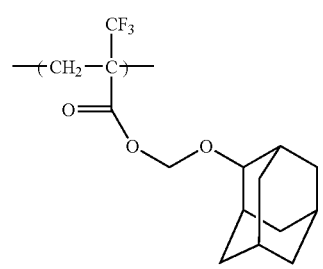 (a1-2-17)
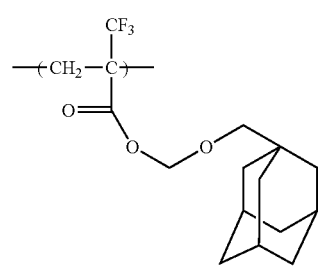 (a1-2-18)
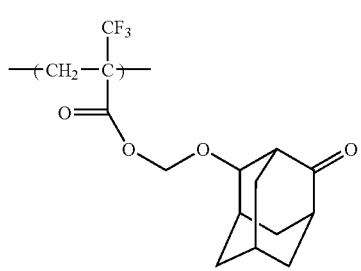 (a1-2-19)
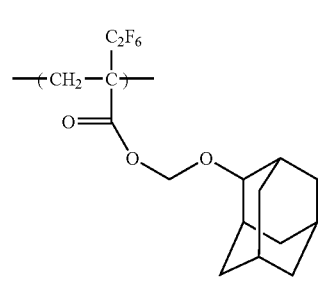 (a1-2-20)
[Chemical Formula 15]
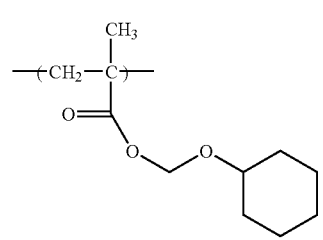 (a1-2-21)
-continued
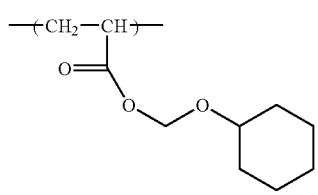 (a1-2-22)
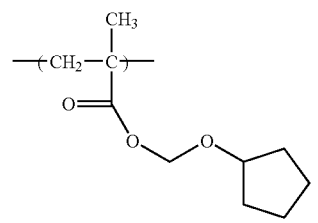 (a1-2-23)
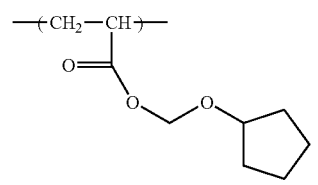 (a1-2-24)
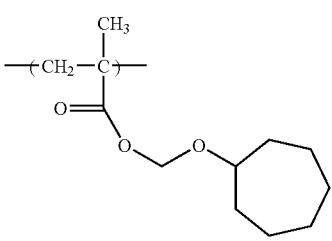 (a1-2-25)
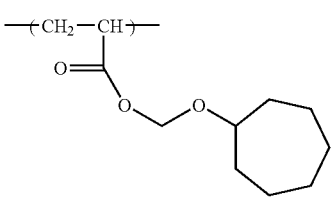 (a1-2-26)
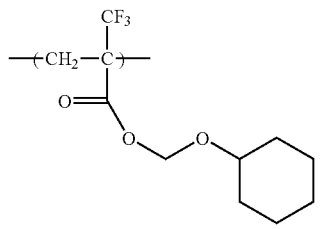 (a1-2-27)
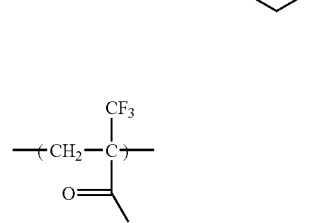 (a1-2-28)

[Chemical Formula 16]

[Chemical Formula 17]

-continued
(a1-3-2)
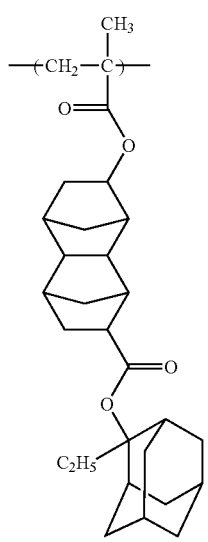
(a1-3-5)
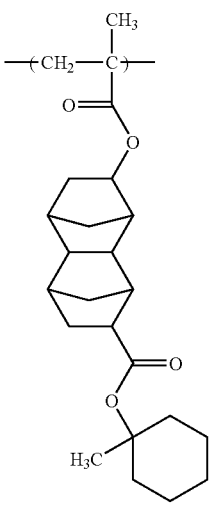
(a1-3-3)
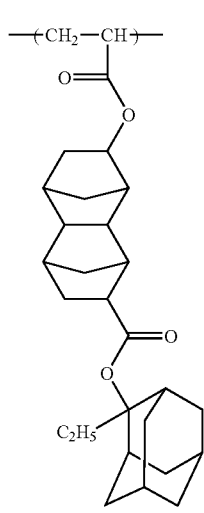
(a1-3-6)
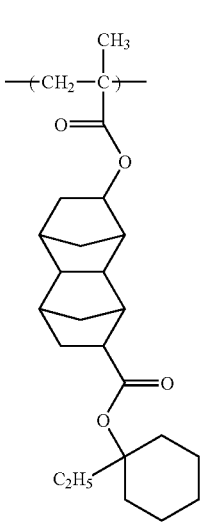
(a1-3-4)
(a1-3-7)
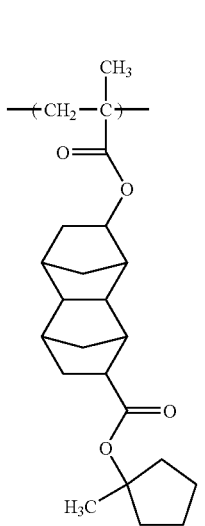

-continued
(a1-3-8)
(a1-3-11)
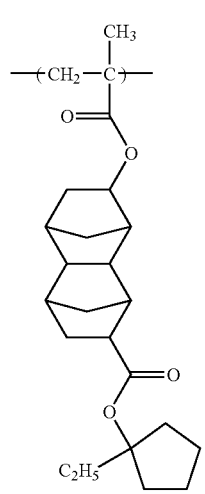
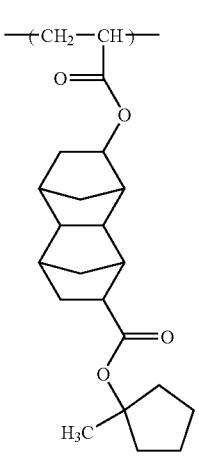
(a1-3-9)
(a1-3-12)
[Chemical Formula 18]
(a1-3-10)
(a1-3-13)

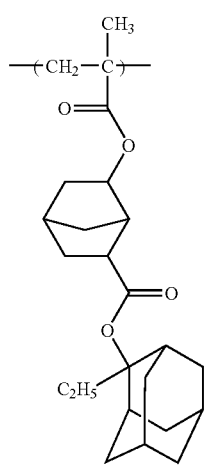
(a1-3-14)
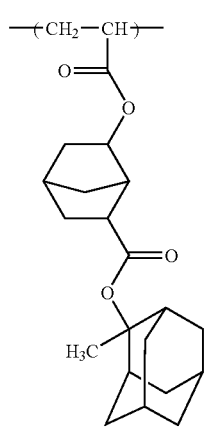
(a1-3-15)
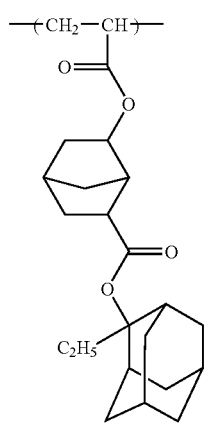
(a1-3-16)
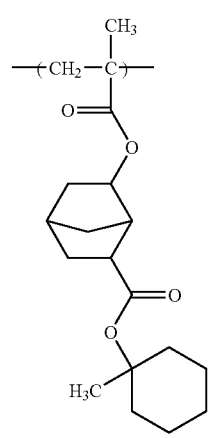
(a1-3-17)
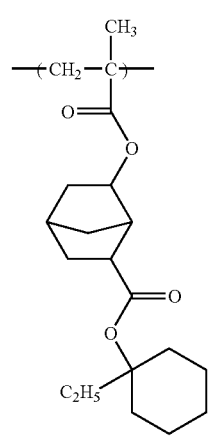
(a1-3-18)
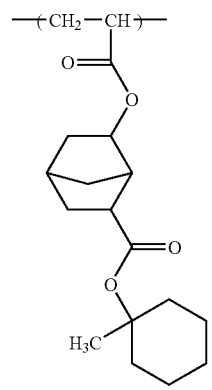
(a1-3-19)
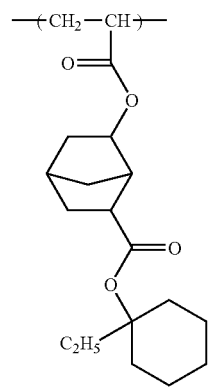
(a1-3-20)

(a1-3-21) 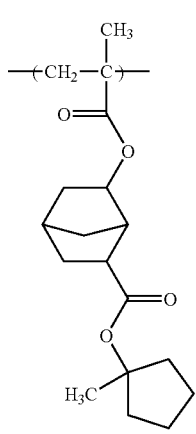
(a1-3-22) 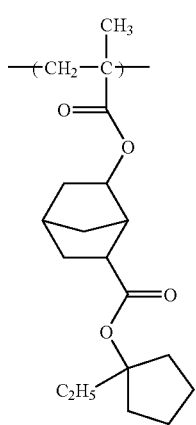
(a1-3-23) 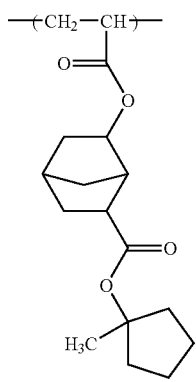
(a1-3-24) 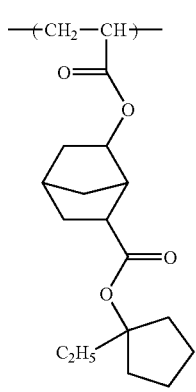
[Chemical Formula 19]
(a1-4-1) 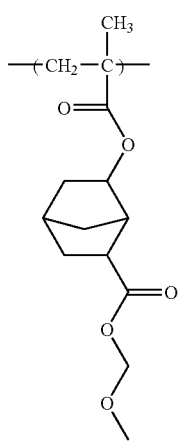
(a1-4-2) 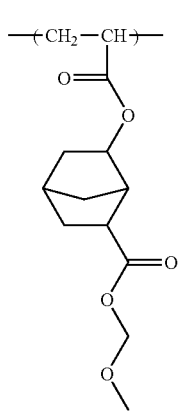
(a1-4-3) 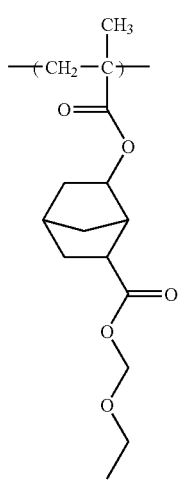

(a1-4-4)
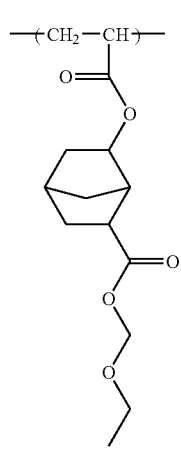
(a1-4-7)
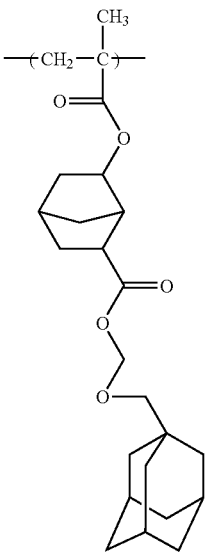
(a1-4-5)
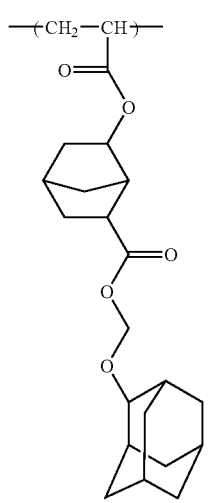
(a1-4-8)
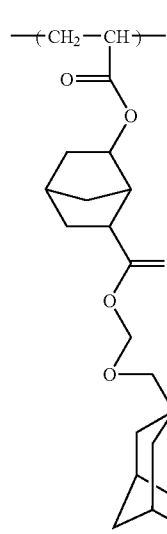
(a1-4-6)
(a1-4-9)
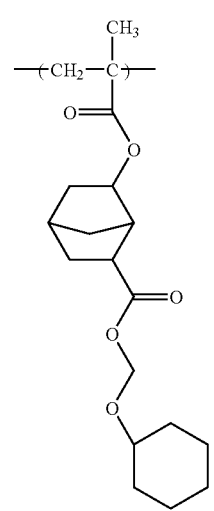

(a1-4-10)
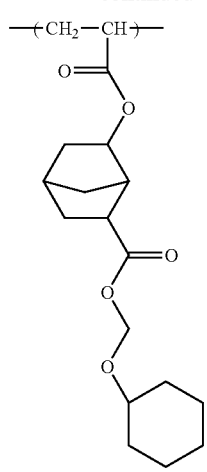
(a1-4-11)
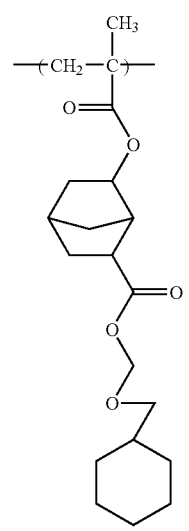
(a1-4-12)
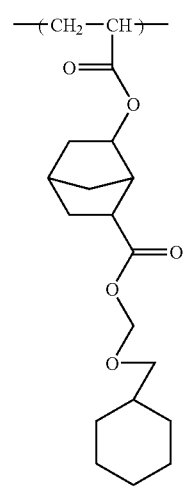
(a1-4-13)
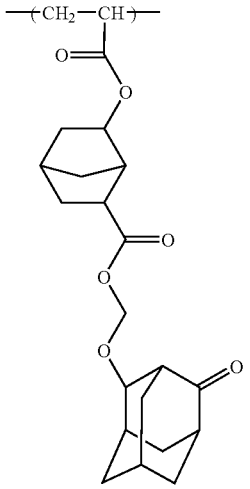
(a1-4-14)
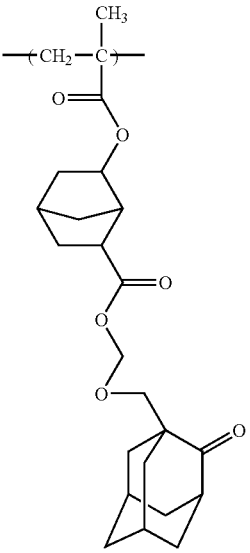
(a1-4-15)
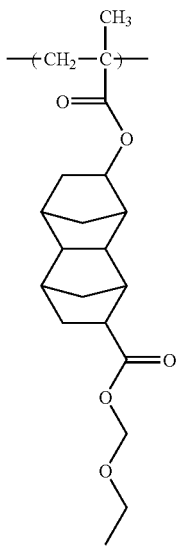

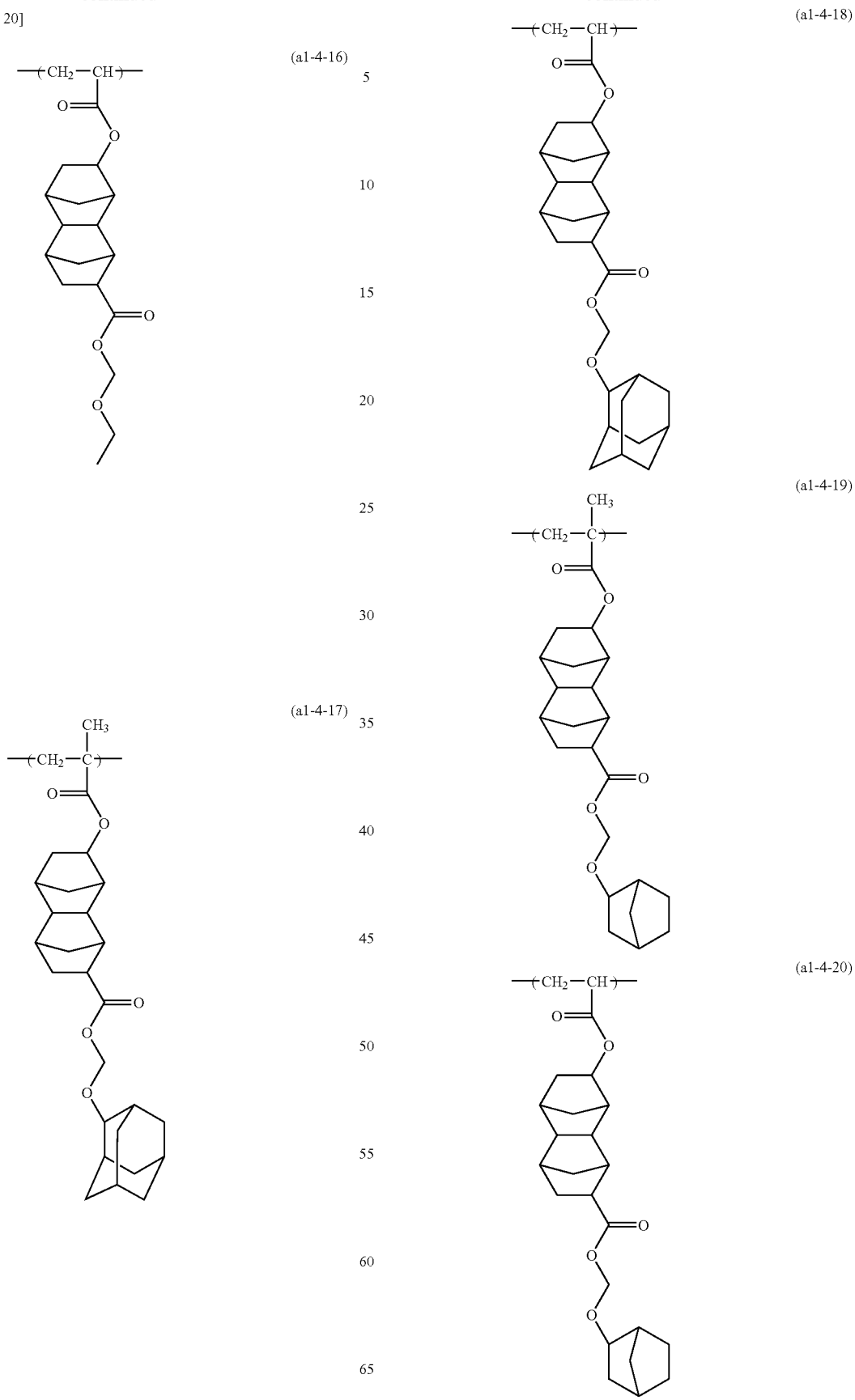

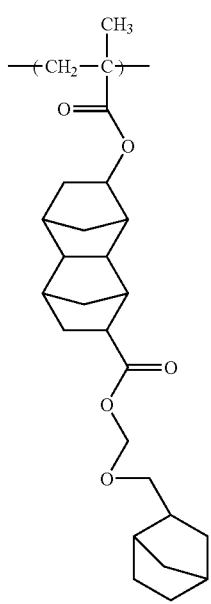
(a1-4-21)
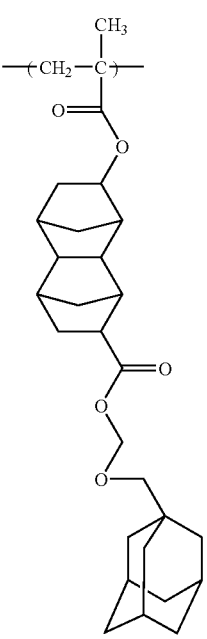
(a1-4-23)
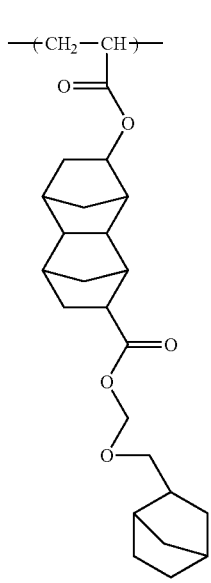
(a1-4-22)
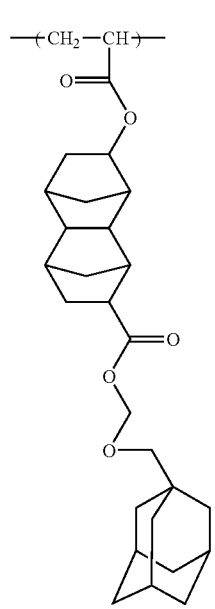
(a1-4-24)

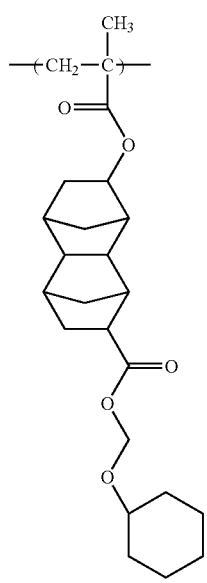
(a1-4-25)
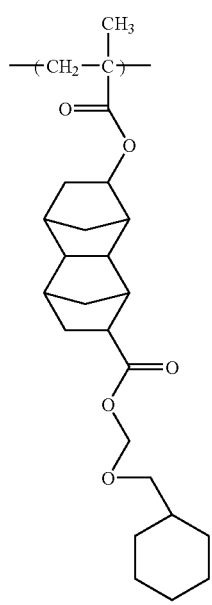
(a1-4-27)
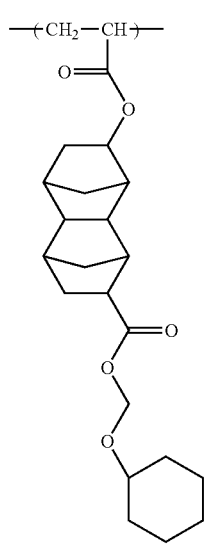
(a1-4-26)
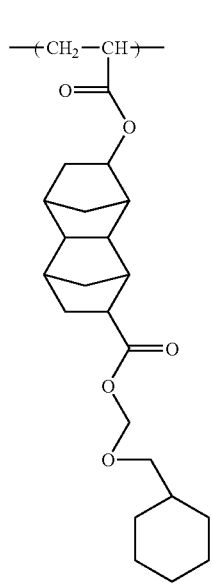
(a1-4-28)

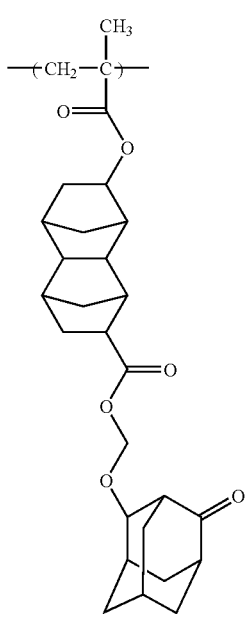

(a1-4-29)

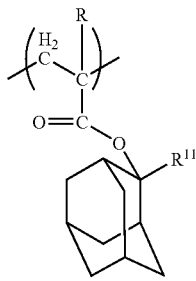

(a1-1-01)

(In the formula, R represents a hydrogen atom, a halogen atom, a lower alkyl group or a halogenated lower alkyl group; and $R^{11}$ represents a lower alkyl group.)

[Chemical Formula 22]

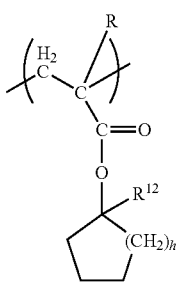

(a1-1-02)

(In the formula, R represents a hydrogen atom, a halogen atom, a lower alkyl group or a halogenated lower alkyl group; $R^{12}$ represents a lower alkyl group; and h represents an integer of 1 to 3.)

In the general formula (a1-1-01), R is the same as R described above in the general formula (a1-1). The lower alkyl group for $R^{11}$ is the same as the lower alkyl group described above for R. Of these, the lower alkyl group for $R^{11}$ is preferably a methyl group or an ethyl group, and most preferably a methyl group.

In the general formula (a1-1-02), R is the same as R described above in the general formula (a1-1). The lower alkyl group for $R^{12}$ is the same as the lower alkyl group described above for R. The lower alkyl group for $R^{12}$ is preferably a methyl group or an ethyl group, and most preferably an ethyl group. h is preferably 1 or 2, and most preferably 2.

In the component (A1), the proportion of the structural unit (a1) is preferably 10 to 80 mol %, more preferably 20 to 70 mol %, and still more preferably 25 to 50 mol %, based on the combined total of all structural units constituting the component (A1). When this proportion is not less than the lower limit in the above range, then a pattern can be easily formed using a resist composition which includes the structural unit (a1), whereas when the proportion is not more than the upper limit in the above range, a good quantitative balance with the other structural units can be attained.

—Structural Unit (a2)

The component (A1) preferably further contains a structural unit (a2) derived from an acrylate ester which contains a lactone-containing cyclic group, in addition to the above structural unit (a1).

(a1-4-30)

As the structural unit (a1), one type may be used alone, or two or more different types may be used in combination.

Among these, a structural unit represented by the general formula (a1-1) is preferable. More specifically, at least one structural unit selected from the group consisting of structural units represented by the formulae (a1-1-1) to (a1-1-6) or (a1-1-35) to (a1-1-41) can be preferably used.

Further, as the structural unit (a1), structural units represented by the general formula (a1-1-01) shown below which includes the structural units represented by formulae (a1-1-1) to (a1-1-4), and structural units represented by the general formula (a1-1-02) shown below which includes the structural units represented by formulae (a1-1-35) to (a1-1-41) are also preferable.

Here, the term "lactone-containing cyclic group" means a cyclic group containing a single ring (lactone ring) which has a "—O—C(O)—" structure. This lactone ring is counted as the first ring, and groups that contain only the lactone ring are referred to as monocyclic groups, whereas groups that also contain other ring structures are described as polycyclic groups regardless of the structure of the other rings.

In the case of using the component (A1) to form a resist film, the lactone-containing cyclic group of the structural unit (a2) is effective at improving the adhesion between the resist film and a substrate, and improving compatibility with the developing solution.

The structural unit (a2) can be used arbitrarily without any particular restriction.

Specific examples of the lactone-containing monocyclic group include a group in which one hydrogen atom is eliminated from γ-butyrolactone. Furthermore, specific examples of the lactone-containing polycyclic group include a group in which one hydrogen atom is eliminated from a bicycloalkane, a tricycloalkane, or a tetracycloalkane which contains a lactone ring.

Specific examples of the structural unit (a2) include structural units represented by the general formulae (a2-1) to (a2-5) shown below.

[Chemical Formula 23]

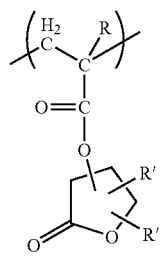
(a2-1)

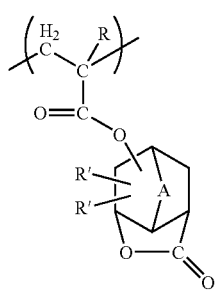
(a2-2)

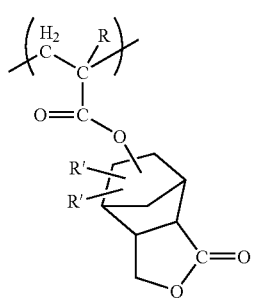
(a2-3)

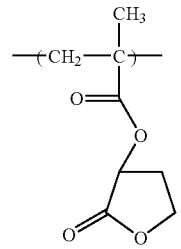
(a2-4)

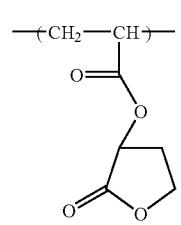
(a2-5)

(In the formulae, R represents a hydrogen atom, a halogen atom, a lower alkyl group or a halogenated lower alkyl group; R' each independently represents a hydrogen atom, a lower alkyl group or an alkoxy group of 1 to 5 carbon atoms; m represents an integer of 0 or 1; and A represents an alkylene group of 1 to 5 carbon atoms or an oxygen atom.)

R in the general formulae (a2-1) to (a2-5) is the same as R described above in the structural unit (a1).

The lower alkyl group for R' is the same as the lower alkyl group described above for R in the structural unit (a1).

In the general formulae (a2-1) to (a2-5), R' is preferably a hydrogen atom in terms of industrial availability.

Specific examples of the alkylene group of 1 to 5 carbon atoms for A include a methylene group, an ethylene group, an n-propylene group and an isopropylene group.

Specific examples of the structural unit represented by the general formulae (a2-1) to (a2-5) include the following.

[Chemical Formula 24]

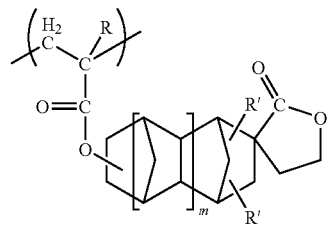
(a2-1-1)

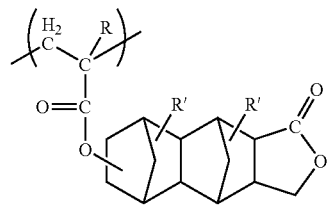
(a2-1-2)

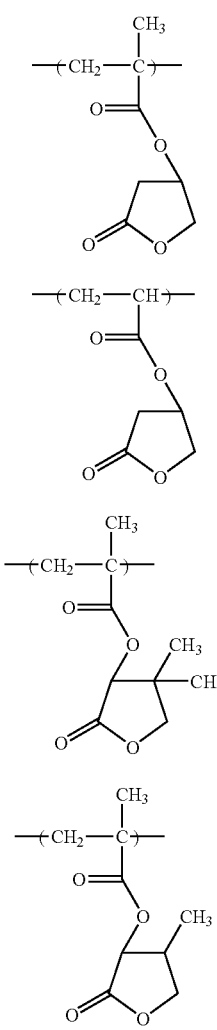
(a2-1-3)
(a2-1-4)
(a2-1-5)
(a2-1-6)
[Chemical Formula 25]
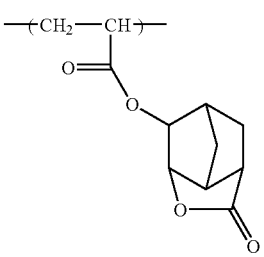
(a2-2-1)
(a2-2-2)
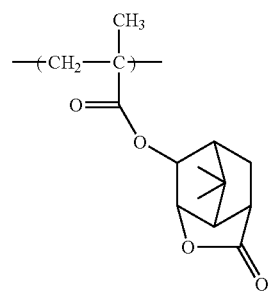
(a2-2-3)
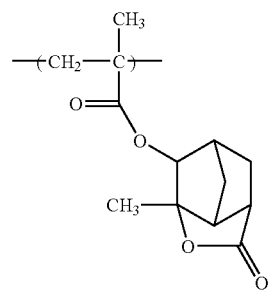
(a2-2-4)
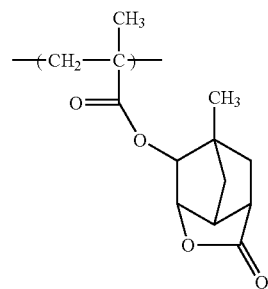
(a2-2-5)
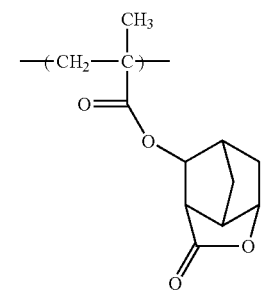
(a2-2-6)
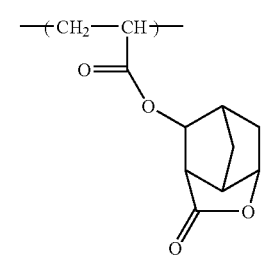
(a2-2-7)

(a2-2-8)
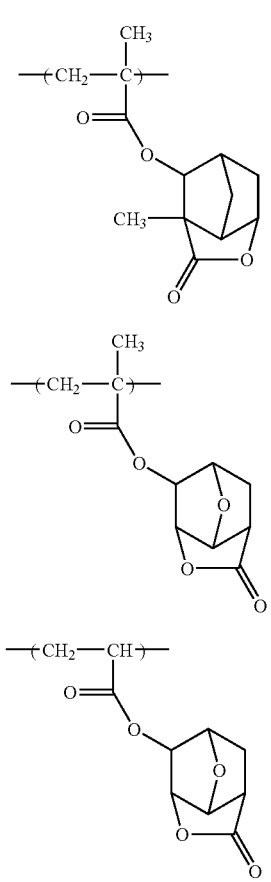
(a2-2-9)
(a2-2-10)
[Chemical Formula 26]
(a2-3-1)
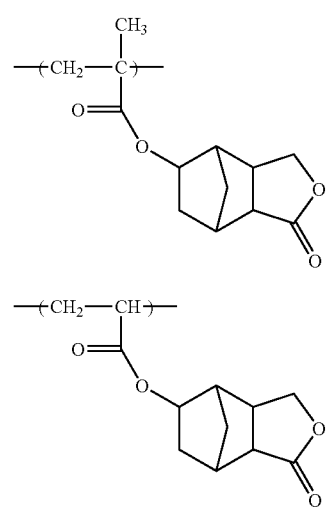
(a2-3-2)
(a2-3-3)
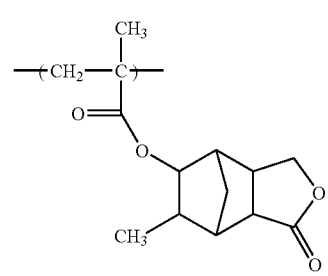
(a2-3-4)
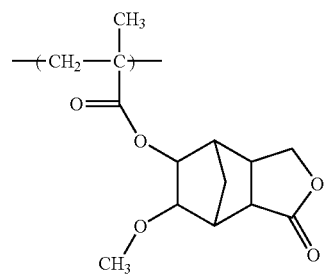
(a2-3-5)
(a2-3-6)
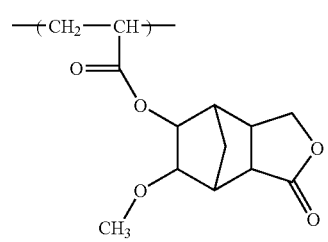
(a2-3-7)
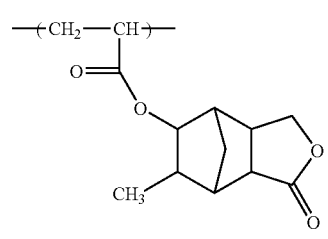
(a2-3-8)
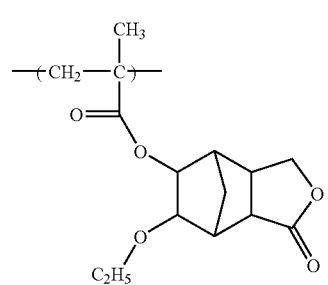
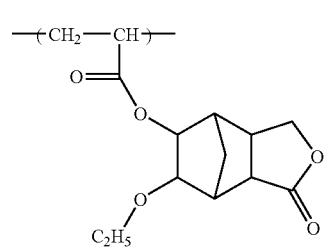
(a2-3-9)
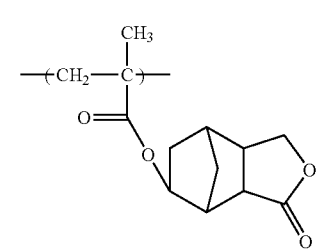

(a2-3-10)
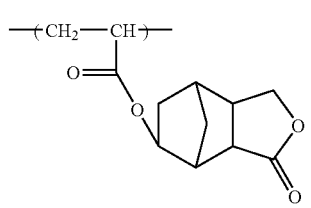
[Chemical Formula 27]
(a2-4-1)
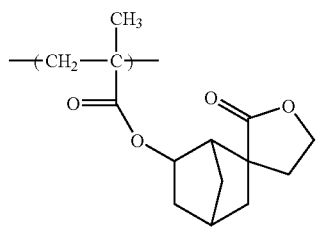
(a2-4-2)
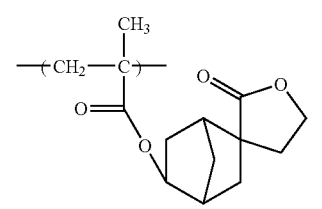
(a2-4-3)
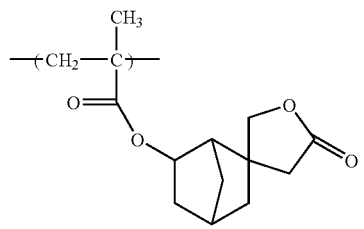
(a2-4-4)
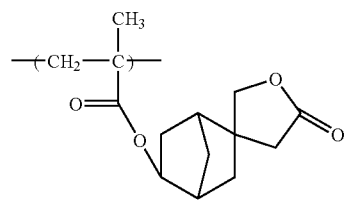
(a2-4-5)
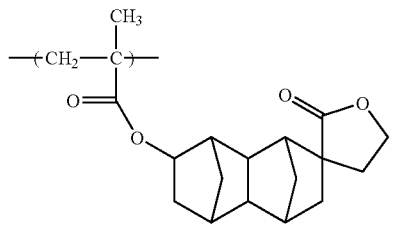
(a2-4-6)
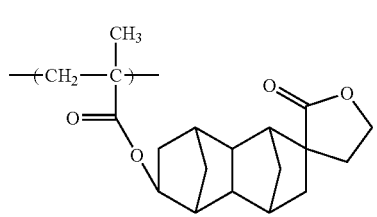
(a2-4-7)
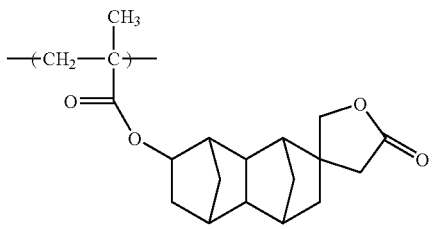
(a2-4-8)
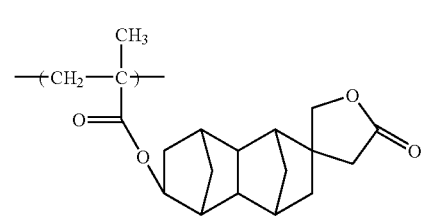
(a2-4-9)
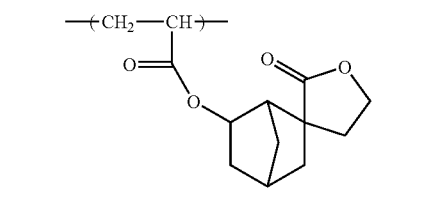
(a2-4-10)
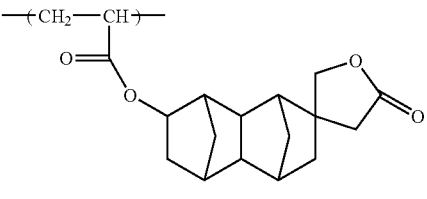
(a2-4-11)
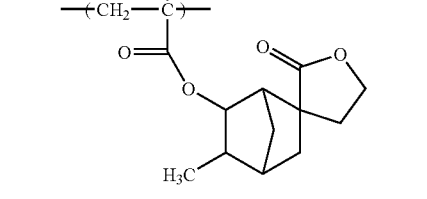
(a2-4-12)
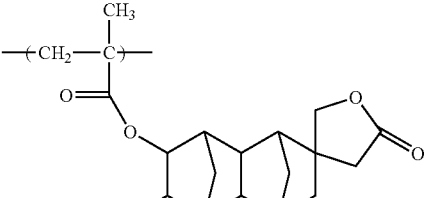
[Chemical Formula 28]
(a2-5-1)
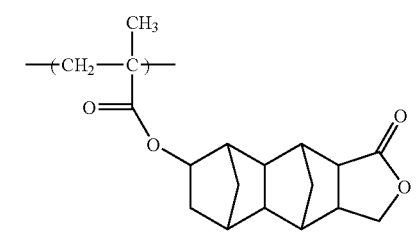

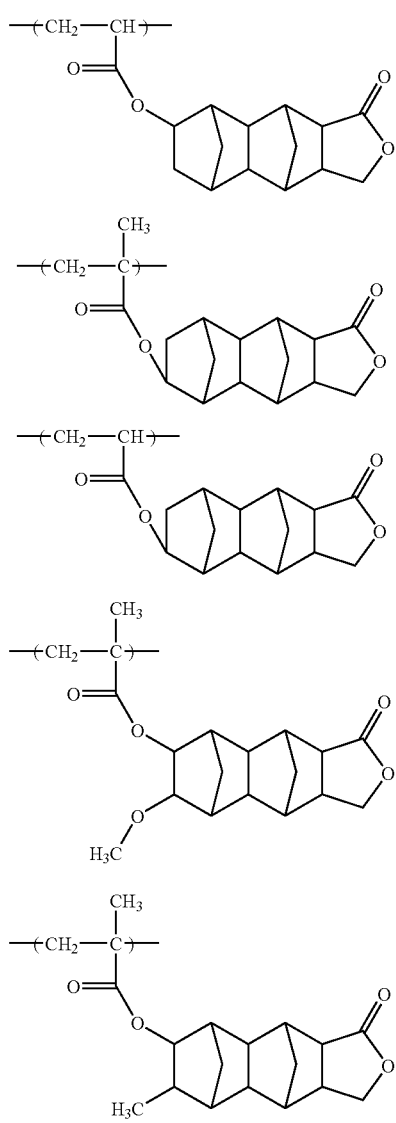

Of these, at least one structural unit selected from the group consisting of the structural units represented by the general formulae (a2-1) to (a2-5) is preferably used, and at least one structural unit selected from the group consisting of the structural units represented by the general formulae (a2-1) to (a2-3) is more preferably used. Of these, at least one kind selected from the group consisting of the structural units represented by the formulae (a2-1-1), (a2-1-2), (a2-2-1), (a2-2-2), (a2-3-1), (a2-3-2), (a2-3-9) and (a2-3-10) is particularly preferable.

In the component (A1), as the structural unit (a2), one type may be used alone, or two or more types may be used in combination.

In the component (A1), the proportion of the structural unit (a2) is preferably 5 to 60 mol %, more preferably 10 to 60 mol %, and still more preferably 20 to 55 mol %, based on the combined total of all structural units constituting the component (A1). When this proportion is not less than the lower limit in the above range, then the effects of improving adhesion of the resulting resist film with a substrate and improving compatibility with an aqueous developing solution, which are obtained by containing the structural unit (a2), can be sufficiently obtained. When the proportion is not more than the upper limit in the above range, a good quantitative balance with the other structural units can be attained.

—Structural Unit (a3)

Moreover, the component (A1) preferably includes a structural unit (a3) derived from an acrylate ester which has a polar group-containing aliphatic hydrocarbon group, in addition to the structural unit (a1), or the structural units (a1) and (a2). By including the structural unit (a3), hydrophilicity of the component (A1) is enhanced, and the compatibility with an alkali developing solution is enhanced, thereby improving the alkali solubility within the exposed portions of the resist. Therefore, the structural unit (a3) contributes to an improvement in resolution.

Examples of the polar group include a hydroxyl group, a cyano group, a carboxyl group, a hydroxyalkyl group, and a hydroxyalkyl group in which a part of the hydrogen atoms within the alkyl group is substituted with fluorine atoms. Of these, a hydroxyl group is particularly preferable.

Examples of the aliphatic hydrocarbon group include a linear or branched hydrocarbon group of 1 to 10 carbon atoms (preferably an alkylene group), and a polycyclic aliphatic hydrocarbon group (polycyclic group). The polycyclic group can be appropriately selected from the multitude of structural units proposed within resins in resist compositions for ArF excimer lasers or the like. The polycyclic group preferably has 7 to 30 carbon atoms.

Of these, a structural unit derived from an acrylate ester having the polycyclic aliphatic group which contains a hydroxyl group, a cyano group, a carboxyl group, or a hydroxyalkyl group (fluorinated alkyl alcohol) in which a part of the hydrogen atoms within an alkyl group has been substituted with fluorine atoms is more preferable. Examples of the polycyclic group include groups in which two or more hydrogen atoms have been removed from a polycycloalkane such as a bicycloalkane, a tricycloalkane, or a tetracycloalkane. Specific examples include a group in which two or more hydrogen atoms have been removed from a polycycloalkane such as adamantane, norbornane, isobornane, tricyclodecane, or tetracyclododecane. Of these polycyclic groups, a group in which two or more hydrogen atoms have been removed from adamantane, norbornane, or tetracyclododecane is industrially preferable.

As the structural unit (a3), for example, a structural unit derived from a hydroxyethyl ester of acrylic acid is preferable, when the hydrocarbon group within the polar group-containing aliphatic hydrocarbon group is a linear or branched hydrocarbon group of 1 to 10 carbon atoms. On the other hand, a structural unit represented by the general formula (a3-1), (a3-2), or (a3-3) shown below is preferable, when the hydrocarbon group is a polycyclic group.

[Chemical Formula 29]

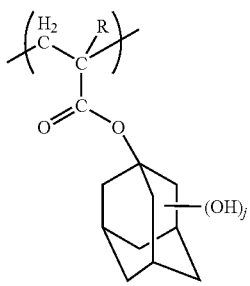

(a3-1)

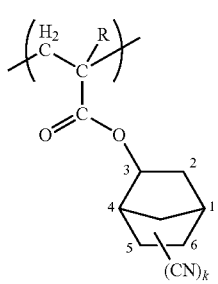
(a3-2)

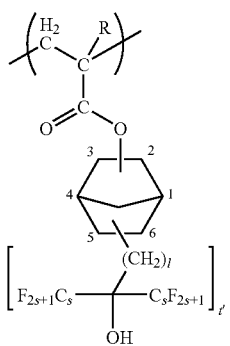
(a3-3)

(In the formulae, R is the same as R in the general formula (a1-0-1); j represents an integer of 1 to 3; k represents an integer of 1 to 3; t' represents an integer of 1 to 3; l represents an integer of 1 to 5; and s represents an integer of 1 to 3.)

In the general formula (a3-1), j is preferably 1 or 2, and more preferably 1. In the case that j is 2, a structural unit in which the hydroxyl groups are bonded to the 3-position and 5-position of the adamantyl group is preferable. In the case that j is 1, a structural unit in which the hydroxyl group is bonded to the 3-position of the adamantyl group is preferable.

Of these, it is preferable that j be 1, and the hydroxyl group be bonded to the 3-position of the adamantyl group.

In the general formula (a3-2), k is preferably 1. In the general formula (a3-2), a cyano group is preferably bonded to the 5-position or 6-position of the norbornyl group.

In the general formula (a3-3), t' is preferably 1. l is preferably 1. s is preferably 1. Further, in the general formula (a3-3), it is preferable that a 2-norbornyl group or 3-norbonyl group be bonded to the terminal of the carboxy group of the acrylic acid. It is preferable that a fluorinated alkyl alcohol within brackets [ ] in the formula (a3-3) be bonded to the 5-position or 6-position of the norbornyl group.

As the structural unit (a3), one type may be used alone, or two or more types may be used in combination.

In the component (A1), the proportion of the structural unit (a3) is preferably 5 to 50 mol %, more preferably 5 to 40 mol %, and still more preferably 5 to 25 mol %, based on the combined total of all structural units constituting the component (A1). When this proportion is not less than the lower limit in the above range, then the effects of improving hydrophilicity and improving solubility of the exposed portions in an alkali developing solution, which are obtained by containing the structural unit (a3), can be sufficiently obtained, whereas when the proportion is not more than the upper limit in the above range, a good quantitative balance with the other components can be attained.

—Structural Unit (a4)

The component (A1) may also have a structural unit (a4) which is different from the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

The structural unit (a4) is preferably, for example, a structural unit derived from an acrylate ester containing a non-acid dissociable aliphatic polycyclic group. Examples of the polycyclic group include the same groups as those described above in the structural unit (a1), and any of the multitude of conventional polycyclic groups used within the base component of resist compositions for ArF excimer lasers or KrF excimer lasers (and preferably for ArF excimer lasers) can be used.

In particular, at least one group selected from amongst a tricyclodecanyl group, an adamantyl group, a tetracyclododecanyl group, an isobornyl group, and a norbornyl group is preferable in terms of industrial availability and the like. These polycyclic groups may contain a linear or branched alkyl group of 1 to 5 carbon atoms as a substituent group.

Specific examples of the structural unit (a4) include a structural unit represented by the general formulae (a4-1) to (a4-5) shown below.

[Chemical Formula 30]

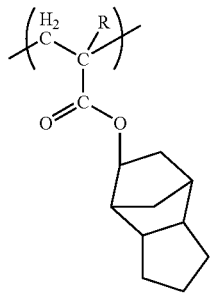
(a4-1)

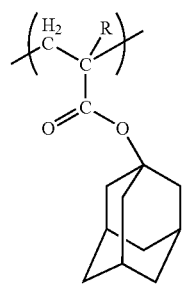
(a4-2)

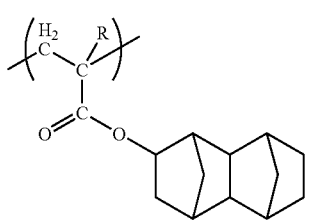
(a4-3)

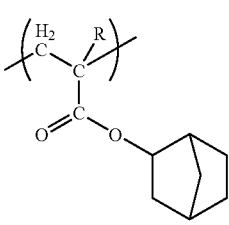
(a4-4)

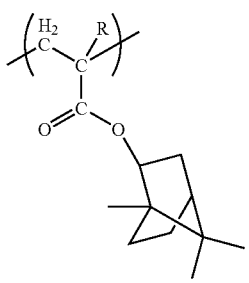
(a4-5)

(In the formulae, R is the same as R in the above general formula (a1-0-1).)

If the structural unit (a4) is included in the component (A1), the proportion of the structural unit (a4) is preferably 1 to 30 mol %, and more preferably 10 to 20 mol %, based on the combined total of all structural units constituting the component (A1).

In the present invention, the component (A1) preferably includes a copolymer which contains the structural units (a1), and (a2) and/or (a3). Examples of such a copolymer include a copolymer consisting of the above structural units (a1) and (a2), a copolymer consisting of the structural units (a1), (a2), and (a4), a copolymer consisting of the structural units (a1) and (a3), a copolymer consisting of the structural units (a1), (a3), and (a4), a copolymer consisting of the structural units (a1), (a2), and (a3), and a copolymer consisting of the structural units (a1), (a2), (a3), and (a4).

The component (A1) is particularly preferably a copolymer containing three kinds of the structural units represented by the general formula (A1-11) or (A1-12) shown below.

[Chemical Formula 31]

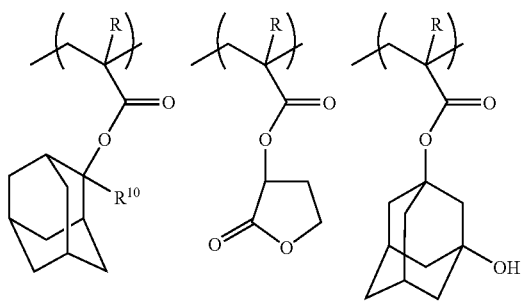
(A1-11)

(In the formula, R is the same as R in the above general formula (a1-0-1); and $R^{10}$ represents a lower alkyl group.)

[Chemical Formula 32]

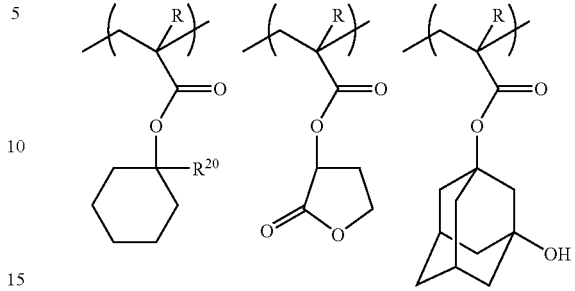
(A1-12)

(In the formula, R is the same as R in the above general formula (a1-0-1); and $R^{20}$ represents a lower alkyl group.)

In the formula (A1-11), R is the same as R in the above general formula (a1-0-1). The lower alkyl group for $R^{10}$ is the same as the lower alkyl group described above for R.

The lower alkyl group for $R^{10}$ is preferably a methyl group or an ethyl group, and most preferably an ethyl group.

In the formula (A1-12), R is the same as R in the above general formula (a1-0-1). The lower alkyl group for $R^{20}$ is the same as the lower alkyl group described above for R. The lower alkyl group for $R^{20}$ is preferably a methyl group or an ethyl group, and most preferably a methyl group.

The component (A1) can be obtained, for example, by a conventional radical polymerization or the like of the monomers corresponding with each of the structural units, using a radical polymerization initiator such as azobisisobutyronitrile (AIBN) or dimethyl azobis(isobutyl ate).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). When a hydroxyalkyl group in which a part of the hydrogen atoms of an alkyl group has been substituted with fluorine atoms is introduced into a copolymer in this manner, the copolymer thus obtained can have an advantageous effect of reducing the levels of developing defects and LER (line edge roughness: non-uniform irregularities within the line side walls).

The weight average molecular weight (Mw) (the polystyrene equivalent value determined by gel permeation chromatography (GPC)) of the component (A1) is not particularly limited, and is preferably 2,000 to 50,000, more preferably 3,000 to 30,000, and most preferably 5,000 to 20,000. By ensuring that the weight average molecular weight of the polymeric compound (A1) is not more than the upper limit, solubility sufficient for a resist relative to a resist solvent can be obtained. By ensuring that it is not less than the lower limit, excellent dry-etching resistance and excellent cross-sectional shape of the resist pattern can be obtained.

Further, the dispersity (Mw/Mn) is preferably within the range of 1.0 to 5.0, more preferably 1.0 to 3.0, and most preferably 1.2 to 2.5. Herein, Mn means the number average molecular weight.

[Component (A2)]

It is preferable that the component (A2) has a molecular weight within the range of 500 to less than 2,000, and contains an acid dissociable, dissolution inhibiting group described above in the component (A1) and a hydrophilic group. Specific examples thereof include compounds wherein a portion of the hydrogen atoms of the hydroxyl groups within a compound containing a plurality of phenol structures have been substituted with the aforementioned acid dissociable, dissolution inhibiting groups.

The component (A2) is preferably low molecular weight phenol compounds known as sensitizers or heat resistance improvement agents for non-chemically-amplified g-line or i-line resists in which a part of the hydrogen atoms of hydroxyl groups are substituted with the above acid dissociable, dissolution inhibiting group, and can be used by arbitrarily selecting from those.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, and 1-[1-(4-hydroxyphenyl)isopropyl]-4-[1,1-bis(4-hydroxyphenyl)ethyl]benzene; and dimers, trimers and tetramers of formalin condensation products of phenols such as phenol, m-cresol, p-cresol and xylenol. Of course, the low molecular weight phenol compounds are not restricted to these examples.

Also, there is no particular restriction on the acid dissociable, dissolution inhibiting group in the component (A2), and those described above can be used.

As the component (A), one kind can be used alone, or two or more kinds can be used in combination.

In the positive resist composition for immersion exposure of the present invention, the content of the component (A) may be adjusted according to the thickness of the resist film to be formed.

In the present invention, the component (A) preferably contains no fluorine atom. When the component (A) contains no fluorine atom, lithography properties are particularly improved.

<Component (B)>

There is no particular restriction on the component (B), and those proposed as acid generators for conventional chemically-amplified resists can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, for example, an acid generator represented by the general formula (b-0) shown below can be used.

[Chemical Formula 33]

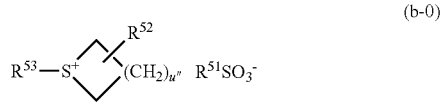

(b-0)

(In the formula, $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may contain a substituent group; and u" represents an integer of 1 to 3.)

In the general formula (b-0), $R^{51}$ represents a linear, branched or cyclic alkyl group, or a linear, branched or cyclic fluorinated alkyl group.

The number of carbon atoms in the linear or branched alkyl group for $R^{51}$ is preferably from 1 to 10, more preferably from 1 to 8, and most preferably from 1 to 4.

The number of carbon atoms in the cyclic alkyl group for $R^{51}$ is preferably 4 to 12, more preferably 5 to 10, and most preferably 6 to 10.

The number of carbon atoms within the linear or branched fluorinated alkyl group for $R^{51}$ is preferably 1 to 10, more preferably 1 to 8, and most preferably 1 to 4.

The number of carbon atoms in the cyclic fluorinated alkyl group for $R^{51}$ is preferably 4 to 12, more preferably 5 to 10, and most preferably 6 to 10.

Also, the fluorination rate of the fluorinated alkyl group (proportion of substituted fluorine atoms relative to all the hydrogen atoms before substitution in the alkyl group) is preferably within the range of 10 to 100%, more preferably 50 to 100%, and particularly preferably those wherein all hydrogen atoms are substituted with fluorine atoms, because the strength of the acid increases.

$R^{51}$ is most preferably a linear alkyl group or a linear fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom. Of these, a fluorine atom is preferable.

The alkyl group for $R^{52}$ is linear or branched, the number of carbon atoms within the alkyl group for $R^{52}$ is preferably 1 to 5, more preferably 1 to 4, and still more preferably 1 to 3.

The halogenated alkyl group for $R^{52}$ is a group in which a part of or all of the hydrogen atoms in an alkyl group are substituted with halogen atoms. As the alkyl group in the halogenated alkyl group, the same alkyl groups as "alkyl groups" for $R^{52}$ can be used. As the halogen atom with which the hydrogen atom is substituted, the same halogen atoms as those described above in the explanation of "halogen atoms" can be used. In the halogenated alkyl group, 50 to 100% of all the hydrogen atoms are preferably substituted with halogen atoms, and it is more preferable that all of the hydrogen atoms are substituted with halogen atoms.

The alkoxy group for $R^{52}$ is linear or branched, and the number of carbon atoms within the alkoxy group for $R^{52}$ is preferably 1 to 5, more preferably 1 to 4, and still more preferably 1 to 3.

Of these, $R^{52}$ is preferably a hydrogen atom.

$R^{53}$ represents an aryl group which may have a substituent group. Examples of the basic ring from which the substituent group is removed include a naphthyl group, a phenyl group and an anthracenyl group. Of these, a phenyl group is preferable in terms of the effects of the present invention and the excellent absorption of exposure light such as ArF excimer lasers.

Examples of the substituent group include a hydroxyl group and a lower alkyl group (which is linear or branched, preferably an alkyl group of 5 or less carbon atoms, and particularly preferably a methyl group).

The aryl group for $R^{53}$ is more preferably an aryl group which has no substituent group.

u" represents an integer of 1 to 3, preferably 2 or 3, and still more preferably 3.

Suitable examples of the acid generator represented by the general formula (b-0) include the following.

[Chemical Formula 34]

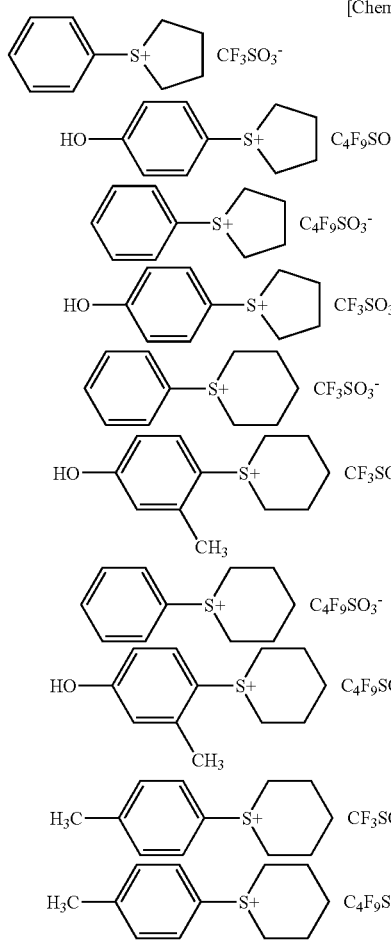

Also, as another onium salt-based acid generator which is different from the acid generator represented by the general formula (b-0), compounds represented by the general formula (b-1) or (b-2) shown below can be used.

[Chemical Formula 35]

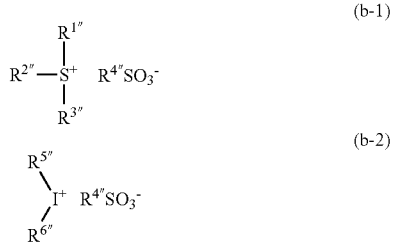

(In the formula, $R^{1'''}$ to $R^{3'''}$, $R^{5'''}$ and $R^{6'''}$ each independently represents an aryl group or an alkyl group; two of $R^{1'''}$ to $R^{3'''}$ may mutually be bonded to form a ring together with the sulfur atom in the formula; $R^{4'''}$ represents a linear, branched or cyclic alkyl group, or a linear, branched or cyclic fluorinated alkyl group; at least one of $R^{1'''}$ to $R^{3'''}$ represents an aryl group; and at least one of $R^{5'''}$ and $R^{6'''}$ represents an aryl group.)

In the general formula (b-1), $R^{1'''}$ to $R^{3'''}$ each independently represents an aryl group or an alkyl group. Here, two of $R^{1'''}$ to $R^{3'''}$ in the formula (b-1) may mutually be bonded to form a ring together with the sulfur atom in the formula.

Also, at least one of $R^{1'''}$ to $R^{3'''}$ represents an aryl group. Two or more of $R^{1'''}$ to $R^{3'''}$ are preferably aryl groups, and all of $R^{1'''}$ to $R^{3'''}$ are most preferably aryl groups.

There is no particular restriction on the aryl group for $R^{1'''}$ to $R^{3'''}$. For example, the aryl group is an aryl group of 6 to 20 carbon atoms, and a part of or all of the hydrogen atoms in the aryl group may or may not be substituted with an alkyl group, an alkoxy group, a halogen atom, a hydroxyl group or the like. The aryl group is preferably an aryl group of 6 to 10 carbon atoms because it can be synthesized inexpensively. Specific examples thereof include a phenyl group and a naphthyl group.

In the aryl group, the alkyl group with which hydrogen atoms may be substituted is preferably an alkyl group of 1 to 5 carbon atoms, and most preferably a methyl group, an ethyl group, a propyl group, an n-butyl group, or a tert-butyl group.

In the aryl group for $R^{1'''}$ to $R^{3'''}$, the alkoxy group with which hydrogen atoms may be substituted is preferably an alkoxy group of 1 to 5 carbon atoms, and most preferably a methoxy group or an ethoxy group.

In the aryl group, the halogen atom with which hydrogen atoms may be substituted is preferably a fluorine atom.

There is no restriction on the alkyl groups for $R^{1'''}$ to $R^{3'''}$. Examples thereof include a linear, branched, or cyclic alkyl group of 1 to 10 carbon atoms. The number of carbon atoms is preferably 1 to 5, in terms of excellent resolution. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Of these, a methyl group is preferable, because it excels in resolution, and can be synthesized inexpensively.

Of these, it is most preferable that $R^{1'''}$ to $R^{3'''}$ each be independently a phenyl group or a naphthyl group.

If two of $R^{1'''}$ to $R^{3'''}$ in the general formula (b-1) are mutually bonded to form a ring together with the sulfur atom in the formula, the ring including the sulfur atom preferably forms a 3- to 10-membered ring, and more preferably forms a 5- to 7-membered ring. Also, if two of $R^{1'''}$ to $R^{3'''}$ in the general formula (b-1) are mutually bonded to form a ring together with the sulfur atom in the formula, the other of $R^{1'''}$ to $R^{3'''}$ is preferably an aryl group. As the aryl group, the same aryl groups as those described above for $R^{1'''}$ to $R^{3'''}$ can be used.

$R^{4'''}$ represents a linear, branched or cyclic alkyl group, or a linear, branched or cyclic fluorinated alkyl group.

The number of carbon atoms within the linear or branched alkyl group for $R^{4'''}$ is preferably 1 to 10, more preferably 1 to 8, and most preferably 1 to 4.

Examples of the cyclic alkyl group for $R^{4'''}$ include the same cyclic groups as those described above in $R^{1'''}$. The number of carbon atoms within the cyclic alkyl group for $R^{4'''}$ is preferably 4 to 15, more preferably 4 to 10, and most preferably 6 to 10.

The number of carbon atoms within the linear or branched fluorinated alkyl group for $R^{4'''}$ is preferably 1 to 10, more preferably 1 to 8, and most preferably 1 to 4.

Examples of the cyclic fluorinated alkyl group for $R^{4'''}$ include the same cyclic groups as those described above in $R^{1'''}$. The number of carbon atoms within the cyclic fluorinated alkyl group for R$^{4'''}$ is preferably 4 to 15, more preferably 4 to 10, and most preferably 6 to 10.

Also, the fluorination rate of the fluorinated alkyl group (proportion of substituted fluorine atoms relative to all the hydrogen atoms before substitution in the alkyl group) is preferably within the range of 10 to 100%, more preferably 50 to 100%, and particularly preferably those wherein all of the hydrogen atoms are substituted with fluorine atoms (perfluoroalkyl group), because the strength of the acid increases.

R$^{4'''}$ is most preferably a linear or cyclic alkyl group, or a linear or cyclic fluorinated alkyl group.

In the general formula (b-2), R$^{5'''}$ and R$^{6'''}$ each independently represents an aryl group or an alkyl group. At least one of R$^{5'''}$ and R$^{6'''}$ represents an aryl group. Both of R$^{5'''}$ and R$^{6'''}$ preferably represent aryl groups.

As the aryl groups for R$^{5'''}$ and R$^{6'''}$, the same aryl groups as those for R$^{1'''}$ to R$^{3'''}$ above can be used.

As the alkyl groups for R$^{5'''}$ and R$^{6'''}$, the same alkyl group as those for R$^{1'''}$ to R$^{3'''}$ can be used.

Of these, it is most preferable that both of R$^{5'''}$ and R$^{6'''}$ be phenyl groups.

R$^{4'''}$ in the general formula (b-2) is the same as those described in R$^{4'''}$ in the general formula (b-1) shown above.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by methanesulfonate, n-propanesulfonate, n-butanesulfonate, or n-octanesulfonate.

Further, an onium salt-based acid generator in which the anion moiety in the general formula (b-1) or (b-2) is substituted with an anion moiety represented by a general formula (b-3) or (b-4) shown below can also be used. Here, the cation moiety is the same as those described above in the general formula (b-1) or (b-2).

[Chemical Formula 36]

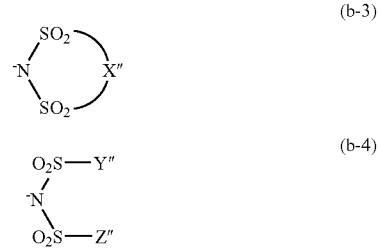

(In the formulae, X" represents an alkylene group of 2 to 6 carbon atoms in which at least one hydrogen atom is substituted with a fluorine atom; and Y" and Z" each independently represents an alkyl group of 1 to 10 carbon atoms in which at least one hydrogen atom is substituted with a fluorine atom.)

X" represents a linear or branched alkylene group in which at least one hydrogen atom is substituted with a fluorine atom. The number of carbon atoms in the alkylene group for X" is 2 to 6, preferably 3 to 5, and most preferably 3.

Y" and Z" each independently represents a linear or branched alkyl group in which at least one hydrogen atom is substituted with a fluorine atom. The number of carbon atoms in the alkyl group for Y" and Z" is 1 to 10, preferably 1 to 7, and more preferably 1 to 3.

The smaller the number of carbon atoms of the alkylene group for X" or the number of carbon atoms of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less, or an electron beam is improved. The proportion of fluorine atoms in the alkylene group or alkyl group, that is, the fluorination rate, is preferably within the range of 70 to 100%, and more preferably 90 to 100%. A perfluoroalkylene group or a perfluoroalkyl group wherein all hydrogen atoms are substituted with fluorine atoms is most preferable.

Furthermore, a sulfonium salt that contains a cation moiety represented by a general formula (b-5) or (b-6) shown below can be used as an onium salt-based acid generator.

[Chemical Formula 37]

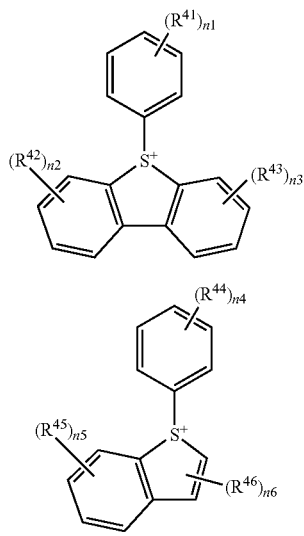

(In the formulae, $R^{41}$ to $R^{46}$ each independently represents an alkyl group, an acetyl group, an alkoxy group, a carboxyl group, a hydroxyl group or a hydroxyalkyl group; n1 to n5 each independently represents an integer of 0 to 3; and n6 represents an integer of 0 to 2.)

The alkyl group for $R^{41}$ to $R^{46}$ is preferably a lower alkyl group of 1 to 5 carbon atoms, more preferably a linear or branched alkyl group, and particularly preferably a methyl group, an ethyl group, a propyl group, an isopropyl group, an n-butyl group, or a tert-butyl group.

The alkoxy group for $R^{41}$ to $R^{46}$ is preferably an alkoxy group of 1 to 5 carbon atoms, more preferably a linear or branched alkoxy group, and particularly preferably a methoxy group or an ethoxy group.

The hydroxyalkyl group for $R^{41}$ to $R^{46}$ is preferably a group in which one or more hydrogen atoms within the above alkyl group have been substituted with hydroxyl groups, and examples thereof include a hydroxymethyl group, a hydroxyethyl group and a hydroxypropyl group.

n1 is preferably 0 to 2, and more preferably 0 or 1.

It is preferable that n2 and n3 each be independently 0 or 1, and it is more preferable that they be 0.

n4 is preferably 0 to 2, and more preferably 0 or 1.

n5 is preferably 0 or 1, and more preferably 0.

n6 is preferably 0 or 1, and more preferably 1.

There is no particular restriction on the anion moiety of a sulfonium salt that contains the cation moiety represented by the general formula (b-5) or (b-6), and anion moieties for onium salt-based acid generators which have been proposed may be used as the anion moieties. Examples of the anion moieties include an anion moiety ($R^{51}SO_3^-$) of the onium salt-based acid generator represented by the above general formula (b-0), an anion moiety ($R^{4"}SO_3^-$) of the onium salt-based acid generator represented by the above general formula (b-1) or (b-2); and an anion moiety represented by the general formula (b-3) or (b-4).

Of these, a fluorinated alkylsulfonate ion is preferable, a fluorinated alkylsulfonate ion of 1 to 4 carbon atoms is more preferable, and a linear perfluoroalkylsulfonate ion of 1 to 4 carbon atoms is particularly preferable. Specific examples thereof include a trifluoromethylsulfonate ion, a heptafluoro-n-propylsulfonate ion, and a nonafluoro-n-butylsulfonate ion.

Suitable examples of the sulfonium salt that contains a cation moiety represented by the formula (b-5) or (b-6) include the following.

[Chemical Formula 38]

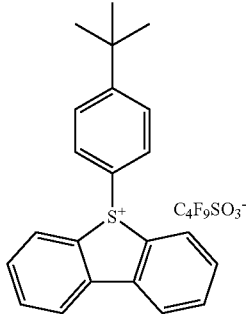
(b-5-1)

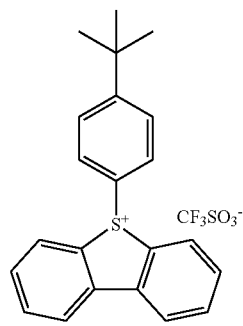
(b-5-2)

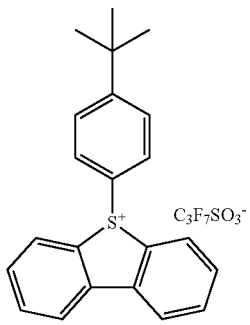
(b-5-3)

[Chemical Formula 39]

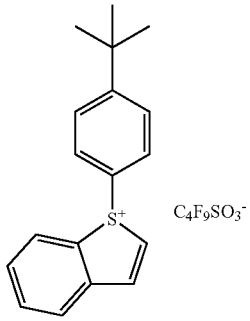
(b-6-1)

-continued
(b-6-2)
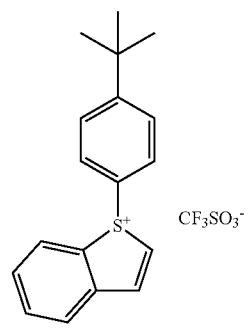
(b-6-3)
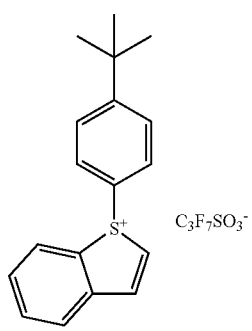
(b-6-4)
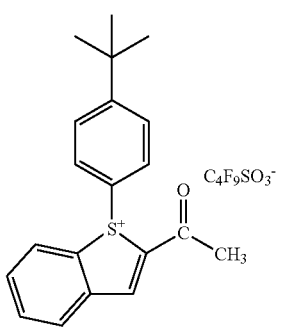
(b-6-5)
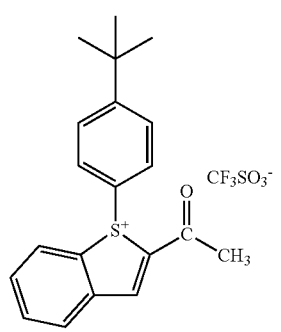
(b-6-6)
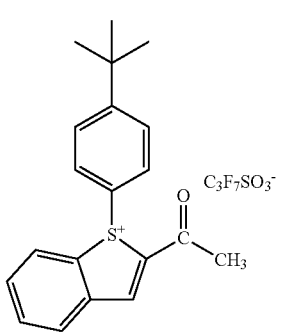
-continued
[Chemical Formula 40]
(b-6-7)
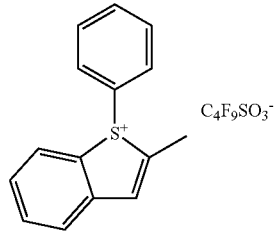
(b-6-8)
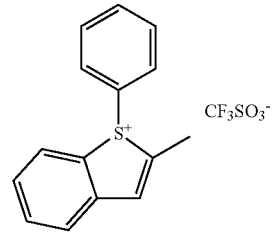
(b-6-9)
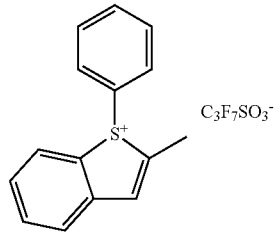
(b-6-10)
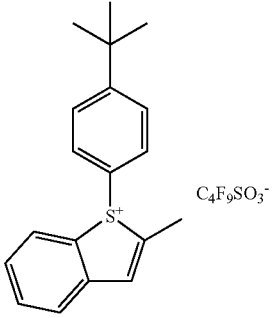
(b-6-11)
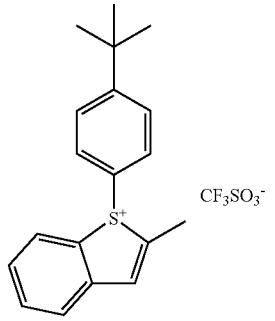

(b-6-12)

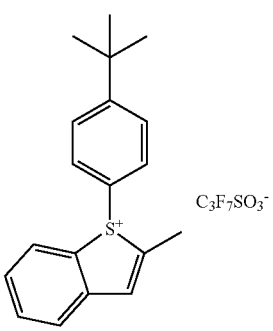

In the present specification, the term "oxime sulfonate-based acid generator" means a compound which has at least one of the groups represented by the general formula (B-1) shown below, and has a property that generates an acid upon exposure to radiation. These kinds of oxime sulfonate-based acid generators are widely used for a chemically-amplified resist composition, so any oxime sulfonate-based acid generator, arbitrarily selected from these, can be used.

[Chemical Formula 41]

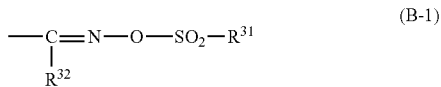
(B-1)

(In the general formula (B-1), $R^{31}$ and $R^{32}$ each independently represents an organic group.)

The organic group for $R^{31}$ or $R^{32}$ is a group containing carbon atoms, and may further contain atoms other than carbon atoms (for example, a hydrogen atom, an oxygen atom, a nitrogen atom, a sulfur atom or a halogen atom (a fluorine atom, a chlorine atom or the like)).

The organic group for $R^{31}$ is preferably a linear, branched or cyclic alkyl group or an aryl group. The alkyl group or aryl group may contain a substituent group.

There is no particular restriction on the substituent group, and examples thereof include a fluorine atom, and a linear, branched or cyclic alkyl group of 1 to 6 carbon atoms.

Here, the term "containing a substituent group" means that a part or all of the hydrogen atoms in an alkyl group or aryl group are substituted with substituent groups.

The alkyl group as the organic group for $R^{31}$ preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. The alkyl group as the organic group for $R^{31}$ is particularly preferably a partially or completely halogenated alkyl group (hereinafter, sometimes referred to as halogenated alkyl group). Here, a partially halogenated alkyl group means an alkyl group in which a part of the hydrogen atoms are substituted with halogen atoms, and a completely halogenated alkyl group means an alkyl group in which all of the hydrogen atoms are substituted with halogen atoms.

Examples of the halogen atoms include a fluorine atom, a chlorine atom, a bromine atom and an iodine atom. Of these, a fluorine atom is preferable. That is, the halogenated alkyl group is preferably a fluorinated alkyl group.

The aryl group as the organic group for $R^{31}$ preferably has 4 to 20 carbon atoms, more preferably 4 to 10 carbon atoms, and most preferably 6 to 10 carbon atoms. The aryl group as the organic group for $R^{31}$ is particularly preferably a partially or completely halogenated aryl group. Here, a partially halogenated aryl group means an aryl group in which a part of the hydrogen atoms are substituted with halogen atoms, and a completely halogenated aryl group means an aryl group in which all of the hydrogen atoms are substituted with halogen atoms.

Examples of the halogen atoms include a fluorine atom, a chlorine atom, a bromine atom and an iodine atom. Of these, a fluorine atom is preferable.

$R^{31}$ is particularly preferably an alkyl group of 1 to 4 carbon atoms containing no substituent group, or a fluorinated alkyl group of 1 to 4 carbon atoms.

The organic group for $R^{32}$ is preferably a linear, branched or cyclic alkyl group, an aryl group, or a cyano group. As the alkyl group or aryl group for $R^{32}$, the same alkyl groups or aryl groups as those described above for $R^{31}$ can be used.

$R^{32}$ is particularly preferably a cyano group, an alkyl group of 1 to 8 carbon atoms containing no substituent group, or a fluorinated alkyl group of 1 to 8 carbon atoms.

Preferred examples of the oxime sulfonate-based acid generator include compounds represented by the general formula (B-2) or (B-3) shown below.

[Chemical Formula 42]

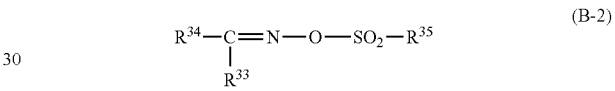
(B-2)

(In the general formula (B-2), $R^{33}$ represents a cyano group, an alkyl group containing no substituent group, or a halogenated alkyl group; and $R^{34}$ represents an aryl group; and $R^{35}$ represents an alkyl group containing no substituent group or a halogenated alkyl group.)

[Chemical Formula 43]

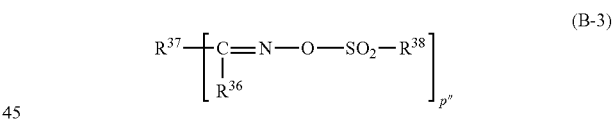
(B-3)

(In the general formula (B-3), $R^{36}$ represents a cyano group, an alkyl group containing no substituent group, or a halogenated alkyl group; $R^{37}$ represents a bivalent or trivalent aromatic hydrocarbon group; $R^{38}$ represents an alkyl group containing no substituent group, or a halogenated alkyl group; and p" represents an integer of 2 or 3.)

In the general formula (B-2), the number of carbon atoms in the alkyl group containing no substituent group or the halogenated alkyl group for $R^{33}$ is preferably 1 to 10, more preferably 1 to 8, and most preferably 1 to 6. As the halogen atoms with which hydrogen atoms within the alkyl group are substituted, a fluorine atom, a chlorine atom, a bromine atom, or an iodine atom can be used.

$R^{33}$ is preferably a halogenated alkyl group, and more preferably a fluorinated alkyl group.

The fluorinated alkyl group for $R^{33}$ is preferably a group in which 50% or more of the hydrogen atoms in an alkyl group are fluorinated, more preferably a group in which 70% or more of the hydrogen atoms in an alkyl group are fluorinated, and still more preferably a group in which 90% or more of the hydrogen atoms in an alkyl group are fluorinated. The fluorinated alkyl group for $R^{33}$ may be a group in which 100% of the hydrogen atoms in an alkyl group are fluorinated.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, or a phenanthryl group; and heteroaryl groups in which a part of the carbon atoms which constitute the rings of these groups are substituted with heteroatoms such as an oxygen atom, a sulfur atom, or a nitrogen atom. Of these, a fluorenyl group is preferable.

The aryl group for $R^{34}$ may contain a substituent group such as an alkyl group of 1 to 10 carbon atoms, a halogenated alkyl group of 1 to 10 carbon atoms and an alkoxy group of 1 to 10 carbon atoms. The alkyl group or halogenated alkyl group for the aforementioned substituent group preferably has 1 to 8 carbon atoms, and more preferably 1 to 4 carbon atoms. As the halogen atoms with which hydrogen atoms within an alkyl group are substituted, a fluorine atom, a chlorine atom, a bromine atom, or an iodine atom can be used. Also, the halogenated alkyl group for the substituent group is preferably a fluorinated alkyl group.

The alkyl group containing no substituent group or the halogenated alkyl group for $R^{35}$ preferably has 1 to 10 carbon atoms, more preferably 1 to 8 carbon atoms, and most preferably 1 to 6 carbon atoms. As the halogen atoms with which hydrogen atoms within an alkyl group are substituted, a fluorine atom, a chlorine atom, a bromine atom, or an iodine atom can be used.

$R^{35}$ is preferably a halogenated alkyl group, and more preferably a fluorinated alkyl group.

The fluorinated alkyl group for $R^{35}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated, because the strength of the generated acid increases. The fluorinated alkyl group for $R^{35}$ is most preferably a completely fluorinated alkyl group in which 100% of the hydrogen atoms are substituted with fluorine atoms.

In the general formula (B-3), as the alkyl group containing no substituent group or the halogenated alkyl group for $R^{36}$, the same alkyl groups containing no substituent group or halogenated alkyl groups as those described above for $R^{33}$ can be used.

Examples of the bivalent or trivalent aromatic hydrocarbon group for $R^{37}$ include aryl groups for $R^{34}$ in which one or two hydrogen atoms are further removed.

As the alkyl group containing no substituent group or the halogenated alkyl group for $R^{38}$, the same alkyl groups containing no substituent group or halogenated alkyl groups as those described above for $R^{35}$ can be used.

p" is preferably 2.

Specific examples of the oxime sulfonate-based acid generator include
α-(p-toluenesulfonyloxyimino)-benzylcyanide,
α-(p-chlorobenzenesulfonyloxyimino)-benzylcyanide,
α-(4-nitrobenzenesulfonyloxyimino)-benzylcyanide,
α-(4-nitro-2-trifluoromethylbenzenesulfonyloxyimino)-benzylcyanide,
α-(benzenesulfonyloxyimino)-4-chlorobenzylcyanide,
α-(benzenesulfonyloxyimino)-2,4-dichlorobenzylcyanide,
α-(benzenesulfonyloxyimino)-2,6-dichlorobenzylcyanide,
α-(benzenesulfonyloxyimino)-4-methoxybenzylcyanide,
α-(2-chlorobenzenesulfonyloxyimino)-4-methoxybenzylcyanide,
α-(benzenesulfonyloxyimino)-thien-2-ylacetonitrile,
α-(4-dodecylbenzenesulfonyloxyimino)-benzylcyanide,
α-[(p-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-4-thienylcyanide,
α-(methylsulfonyloxyimino)-1-cyclopentenylacetonitrile,
α-(methylsulfonyloxyimino)-1-cyclohexenylacetonitrile,
α-(methylsulfonyloxyimino)-1-cycloheptenylacetonitrile,
α-(methylsulfonyloxyimino)-1-cyclooctenylacetonitrile,
α-(trifluoromethylsulfonyloxyimino)-1-cyclopentenylacetonitrile,
α-(trifluoromethylsulfonyloxyimino)-cyclohexylacetonitrile,
α-(ethylsulfonyloxyimino)-ethylacetonitrile,
α-(propylsulfonyloxyimino)-propylacetonitrile,
α-(cyclohexylsulfonyloxyimino)-cyclopentylacetonitrile,
α-(cyclohexylsulfonyloxyimino)-cyclohexylacetonitrile,
α-(cyclohexylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile,
α-(n-butylsulfonyloxyimino)-1-cyclohexenylacetonitrile,
α-(methylsulfonyloxyimino)-phenylacetonitrile,
α-(methylsulfonyloxyimino)-p-methoxyphenylacetonitrile,
α-(trifluoromethylsulfonyloxyimino)-phenylacetonitrile,
α-(trifluoromethylsulfonyloxyimino)-p-methoxyphenylacetonitrile,
α-(ethylsulfonyloxyimino)-p-methoxyphenylacetonitrile,
α-(propylsulfonyloxyimino)-p-methylphenylacetonitrile, and
α-(methylsulfonyloxyimino)-p-bromophenylacetonitrile.

Also, oxime sulfonate-based acid generators disclosed in Japanese Unexamined Patent Application, First Publication No. Hei9-208554 ([Formula 18] and [Formula 19] in paragraphs [0012] to [0014]), and International Publication WO 2004/074242 (Examples 1 to 40 on pages 65 to 85) can be preferably used.

Further, suitable examples thereof include the following.

[Chemical Formula 44]

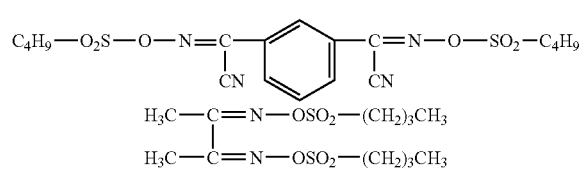

[Chemical Formula 45]

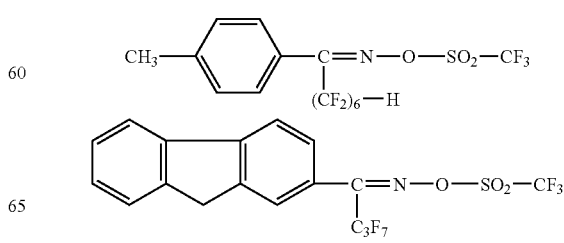

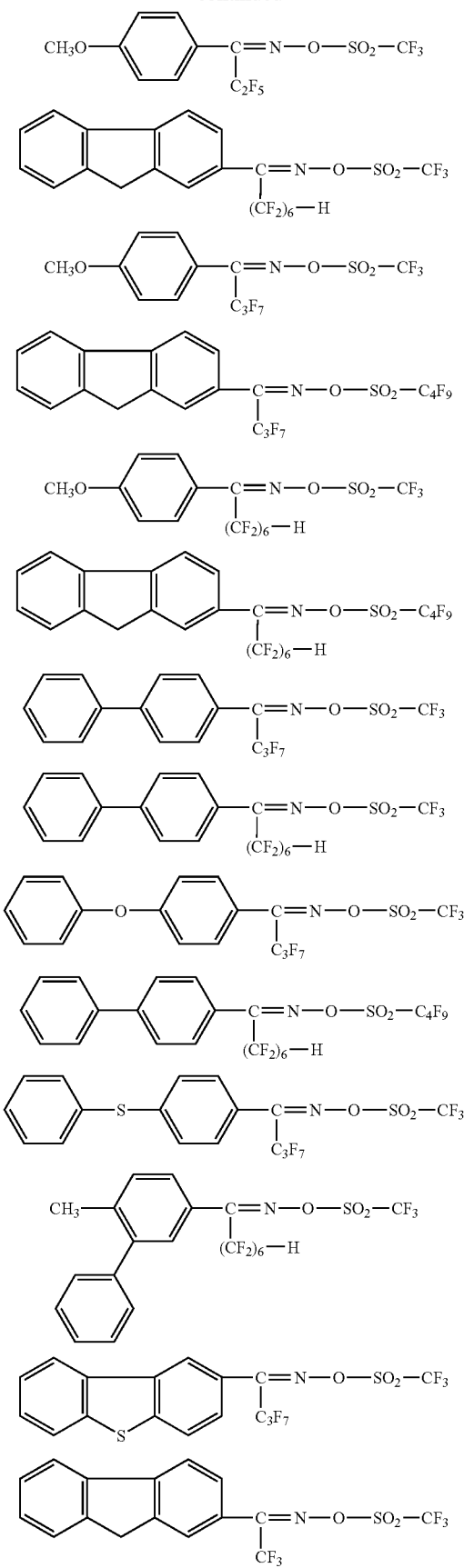

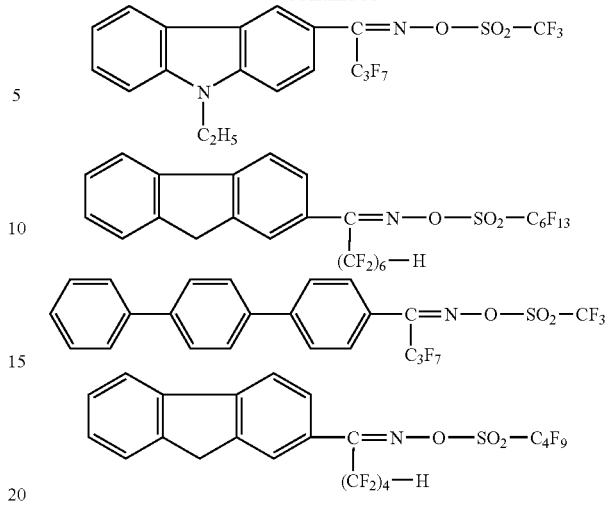

Of these compounds, the four compounds shown below are preferable.

[Chemical Formula 46]

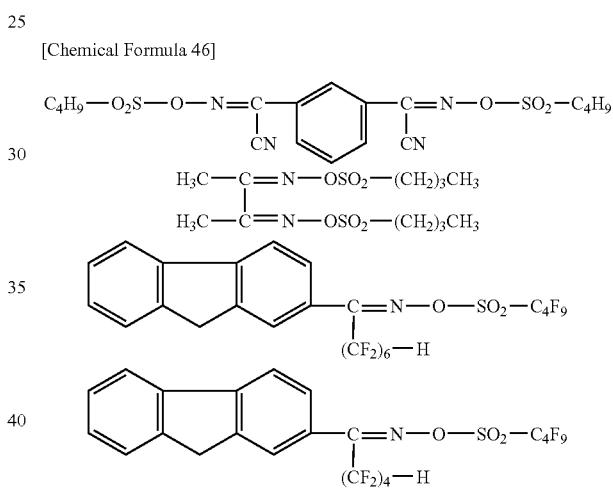

Among the diazomethane-based acid generators, specific examples of the bisalkyl- or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Application, First Publication No. Hei11-035551, Japanese Unexamined Patent Application, First Publication No. Hei11-035552, and Japanese Unexamined Patent Application, First Publication No. Hei11-035573 can be preferably used.

Examples of poly(bissulfonyl)diazomethanes include 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, which are disclosed in Japanese Unexamined Patent Application, First Publication No. Hei11-322707.

As the component (B), either a single acid generator may be used alone, or a combination of two or more different acid generators may be used.

In the present invention, of these, onium salts with a fluorinated alkylsulfonate ion as the anion are preferably used as the component (B).

The amount of the component (B) is 0.5 to 30 parts by weight, and preferably 1 to 10 parts by weight, relative to 100 parts by weight of the component (A). When the amount is within the range, a pattern can be sufficiently formed. Also, a uniform solution and excellent storage stability can be obtained. Therefore, an amount within the above range is preferable.

<Component (C)>

In the present invention, the component (C) is a fluorine-containing resin component which contains the structural unit (c1) represented by the general formula (c1-1) shown below. By including the components (A), (B) and (C), the effects of having hydrophobicity suitable for immersion exposure can be obtained, and also excellent lithography properties can be obtained.

[Chemical Formula 47]

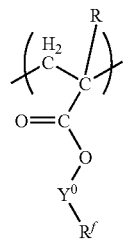

(c1-1)

(In the formula (c1-1), R represents a hydrogen atom, a lower alkyl group, a halogen atom, or a halogenated lower alkyl group; $R^f$ represents a fluorinated alkyl group; and $Y^0$ represents an alkylene group.)

In the formula (c1-1), as the lower alkyl group, halogen atom, or halogenated lower alkyl group for R, R described above in the component (A), that is, the lower alkyl group, halogen atom, or halogenated lower alkyl group described as the substituent group at the α-position of an acrylate ester, can be used.

R is preferably a hydrogen atom, a fluorine atom, a lower alkyl group or a fluorinated alkyl group, and more preferably a hydrogen atom or a methyl group in terms of industrial availability.

$R^f$ represents a fluorinated alkyl group, and may be linear or branched.

$R^f$ preferably contains 1 to 10 carbon atoms, more preferably 1 to 5 carbon atoms, still more preferably 1 to 3 carbon atoms, and most preferably 1 carbon atom.

Also, the fluorination rate of the fluorinated alkyl group for $R^f$ (the proportion (%) of "the number of fluorine atoms", based on "the total number of fluorine atoms and hydrogen atoms" within the fluorinated alkyl group) is preferably within the range of 50 to 100%, more preferably 70 to 100%, and most preferably 100%.

Of these, $R^f$ is most preferably a trifluoromethyl group.

$Y^0$ represents an alkylene group, and may be linear or branched.

$Y^0$ preferably contains 1 to 5 carbon atoms, and more preferably 1 to 3 carbon atoms. Specific examples thereof include a methylene group, an ethylene group, and an n-propylene group, and $Y^0$ is most preferably a methylene group.

Specific examples of the structural unit represented by general formula (c1-1) shown above include the following.

[Chemical Formula 48]

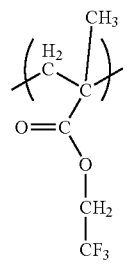

(c1-1-1)

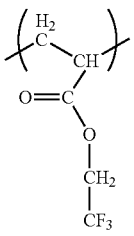

(c1-1-2)

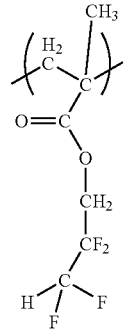

(c1-1-3)

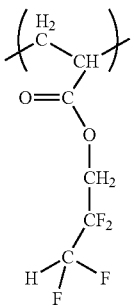

(c1-1-4)

Of these, the structural unit (c1) is preferably at least one kind selected from the group consisting of the structural units represented by the above formulae (c1-1-1) to (c1-1-4) because the effects of the present invention are excellent, and most preferably the structural unit represented by the above formula (c1-1-1) or (c1-1-2).

In the component (C), the proportion of the structural unit (c1) is preferably 50 to 100 mol %, more preferably 70 to 100 mol %, and may be 100 mol %, based on the combined total of all structural units constituting the component (C). When the proportion of the structural unit (c1) is not less than 50 mol %, the effects of the present invention can be improved.

The component (C) may also have a structural unit (hereinafter, referred to as structural unit (c2)) which is different from the structural unit (c1), as long as the effects of the present invention are not impaired.

There is no particular restriction on the structural unit (c2), as long as it can be copolymerized with the monomer corresponding with the structural unit (c1). Specific examples of the structural unit (c2) include the structural units (a1) to (a4) described above in the explanation of the component (A1).

The component (C) can be obtained, for example, by a conventional radical polymerization or the like of the monomers corresponding with each of the structural units, using a radical polymerization initiator such as azobisisobutyronitrile (AIBN) or dimethyl azobis(isobutylate).

Furthermore, in the component (C), by using a chain transfer agent such as HS—$CH_2$—$CH_2$—$CH_2$—$C(CF_3)_2$—OH, a —$C(CF_3)_2$—OH group can be introduced at the terminals of the component (C). When a hydroxyalkyl group in which a part of the hydrogen atoms of the alkyl group has been substituted with fluorine atoms is introduced into a copolymer in this manner, the copolymer thus obtained can have an advantageous effect of reducing the levels of developing defects and LER (line edge roughness: non-uniform irregularities within the line side walls).

The weight average molecular weight (Mw) (the polystyrene equivalent value determined by gel permeation chromatography (GPC)) of the component (C) is not particularly restricted, and is preferably within the range of 2,000 to 50,000, more preferably 3,000 to 30,000, and most preferably 5,000 to 20,000. By ensuring that the weight average molecular weight of the component (C) is not more than the upper limit, solubility sufficient for a resist relative to a resist solvent can be obtained. By ensuring that it is not less than the lower limit, excellent dry-etching resistance and excellent cross-sectional shape of the resist pattern can be obtained.

Further, the dispersity (Mw/Mn) is preferably within the range of 1.0 to 5.0, more preferably 1.0 to 3.0, and most preferably 1.2 to 2.5. Herein, Mn means the number average molecular weight.

As the component (C), one type can be used alone, or two or more types can be used in combination.

In the resist composition for immersion exposure of the present invention, the amount of the component (C) is preferably within the range of 0.1 to 10 parts by weight, more preferably 0.1 to 5 parts by weight, and most preferably 0.5 to 3 parts by weight, relative to 100 parts by weight of the component (A). When this amount is not less than the lower limit in the above range, then hydrophobicity of the resist composition can be effectively improved, whereas when this amount is not more than the upper limit in the above range, then lithography properties can be improved.

<Component (C')>

In the present invention, the component (C') is a fluorine-containing polymeric compound that contains the structural unit (c0) represented by the general formula (c0-1) shown below, and the structural unit (c11) derived from an acrylate ester which contains an acid dissociable, dissolution inhibiting group.

By including the components (A'), (B) and (C'), the effects of having hydrophobicity suitable for immersion exposure can be obtained, and also excellent lithography properties can be obtained.

—Structural Unit (c0)

The structural unit (c0) is represented by the general formula (c0-1) shown below, and contains a fluorine atom within the structure. Therefore, the positive resist composition for immersion exposure which includes the component (C') containing the structural unit (c0) can improve the hydrophobicity.

[Chemical Formula 49]

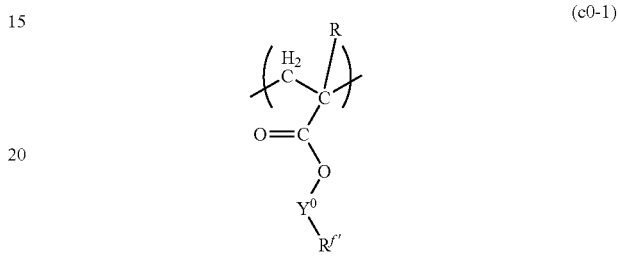

(In the formula (c0-1), R represents a hydrogen atom, a lower alkyl group, or a halogenated lower alkyl group; $R^{f1}$ represents a fluorinated hydrocarbon group which may or may not contain a substituent group, with the proviso that if a hydroxyl group is included as the substituent group, a fluorine atom or a fluorinated alkyl group is not bonded to the carbon atom to which the hydroxyl group is bonded; and $Y^0$ represents an alkylene group.)

In the formula (c0-1), as the lower alkyl group or halogenated lower alkyl group for R, R described above in the component (A), that is, the lower alkyl group or halogenated lower alkyl group described as the substituent group at the α-position of an acrylate ester, can be used.

R is preferably a hydrogen atom, a lower alkyl group or a fluorinated alkyl group, and more preferably a hydrogen atom or a methyl group in terms of industrial availability.

$R^{f1}$ represents a fluorinated hydrocarbon group which may or may not contain a substituent group, with the proviso that if a hydroxyl group is included as the substituent group, a fluorine atom or a fluorinated alkyl group is not bonded to the carbon atom to which the hydroxyl group is bonded. $R^{f1}$ may be a fluorinated saturated hydrocarbon group or a fluorinated unsaturated hydrocarbon group, and is preferably a fluorinated saturated hydrocarbon group. $R^{f1}$ may be linear, branched or cyclic, and is preferably linear or branched.

$R^{f1}$ preferably contains 1 to 10 carbon atoms, more preferably 1 to 5 carbon atoms, still more preferably 1 to 3 carbon atoms, and most preferably 1 carbon atom.

$Y^0$ represents an alkylene group, and may be linear or branched.

$Y^0$ preferably contains 1 to 5 carbon atoms, and more preferably 1 to 3 carbon atoms. Specific examples thereof include a methylene group, an ethylene group, and an n-propylene group, and $Y^0$ is most preferably a methylene group.

Specific examples of the structural unit (c0) include the following.

[Chemical Formula 50]

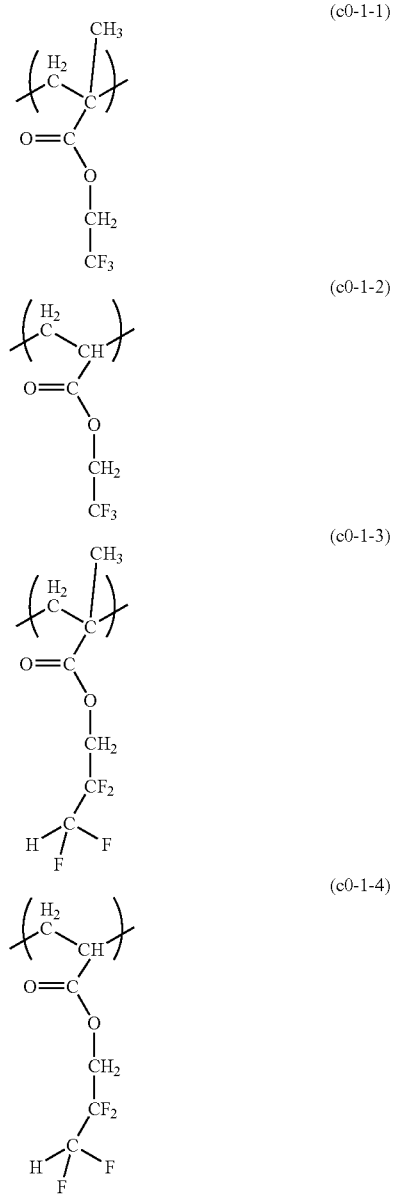

The component (C') preferably contains at least one structural unit selected from the group consisting of the structural units represented by the above formulae (c0-1-1) to (c0-1-4) because the effects of the present invention are excellent, and more preferably contains the structural unit represented by the above formula (c0-1-1) or (c0-1-3).

In the component (C'), the proportion of the structural unit (c0) is preferably 5 to 90 mol %, more preferably 5 to 85 mol %, still more preferably 10 to 80 mol %, and most preferably 15 to 80 mol %, based on the combined total of all structural units constituting the component (C'). When this amount is not less than the lower limit in the above range, then water-shedding properties of the resulting positive resist composition for immersion exposure can be improved, whereas when this amount is not more than the upper limit in the above range, then lithography properties can be improved.

—Structural Unit (c11)

The structural unit (c11) is a structural unit derived from an acrylate ester which contains an acid dissociable, dissolution inhibiting group, and is the same as the structural unit (a1) described above in the component (A).

As the acid dissociable, dissolution inhibiting group included in the structural unit (c11), any of the groups that have been proposed as acid dissociable, dissolution inhibiting groups for the base resins of chemically amplified resists can be used, provided the group has an alkali dissolution inhibiting effect that renders the entire component (C') less soluble in an alkali developing solution prior to exposure, and then following dissociation by action of an acid, increases solubility of the entire component (C') in the alkali developing solution.

That is, since the component (C') includes an acid dissociable, dissolution inhibiting group within the structural unit (c11), the component (C') exhibits increased solubility in an alkali developing solution after the dissociation, and thus development residue can be prevented in the formation of a resist pattern.

In the component (C'), the proportion of the structural unit (c11) is preferably 5 to 90 mol %, more preferably 5 to 85 mol %, still more preferably 10 to 80 mol %, and most preferably 15 to 75 mol %, based on the combined total of all structural units constituting the component (C'). When the proportion is within the above range, solubility in an alkali developing solution after exposure can be improved, and excellent lithography properties can be obtained. Also, development residue can be prevented.

The component (C') may also have a structural unit (hereinafter, referred to as structural unit (c12)) which is different from the structural units (c0) and (c11), as long as the effects of the present invention are not impaired.

There is no particular restriction on the structural unit (c12), as long as it can be copolymerized with the monomer corresponding with the structural unit (c11). Specific examples of the structural unit (c12) include the structural units (a2) to (a4) described above in the explanation of the component (A1).

Specific examples of the fluorine-containing polymeric compound (C') preferably used as the component (C') include the following.

[Chemical Formula 51]

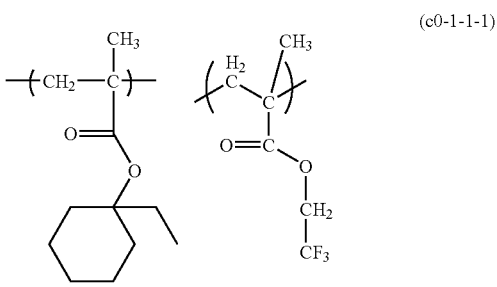

[Chemical Formula 52]
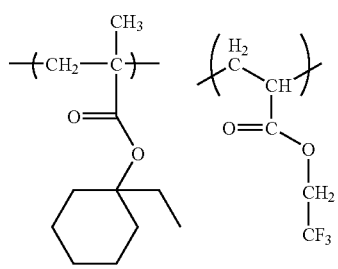
(c0-1-1-2)
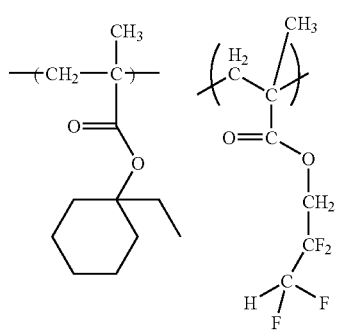
(c0-1-1-3)
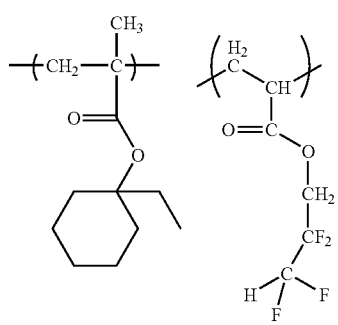
(c0-1-1-4)
[Chemical Formula 53]
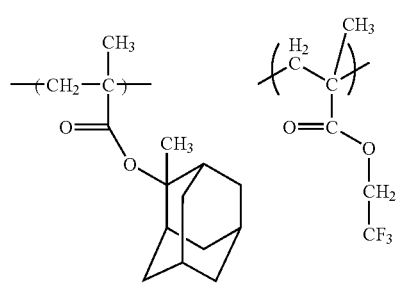
(c0-1-1-5)
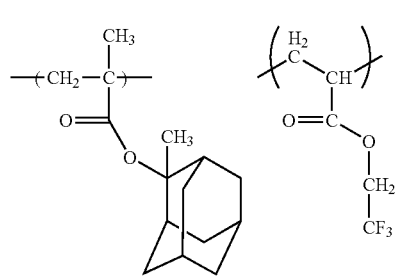
(c0-1-1-6)
[Chemical Formula 54]
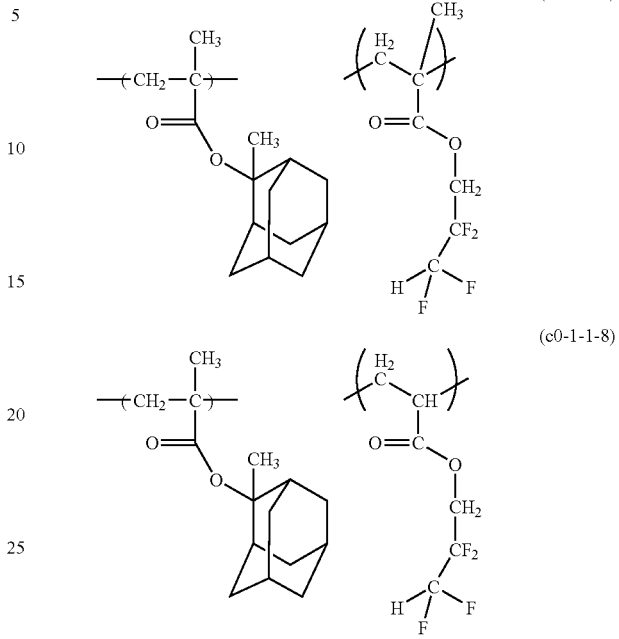
(c0-1-1-7)
(c0-1-1-8)
[Chemical Formula 55]
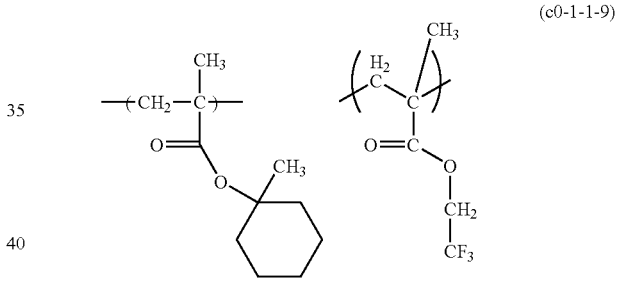
(c0-1-1-9)
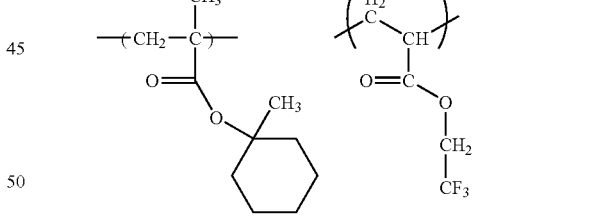
(c0-1-1-10)
[Chemical Formula 56]
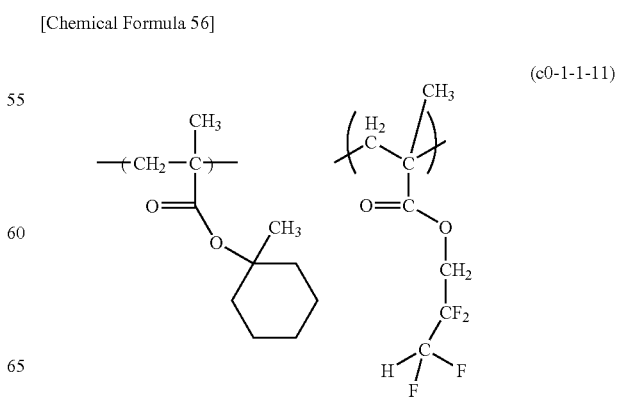
(c0-1-1-11)

-continued (c0-1-1-12)

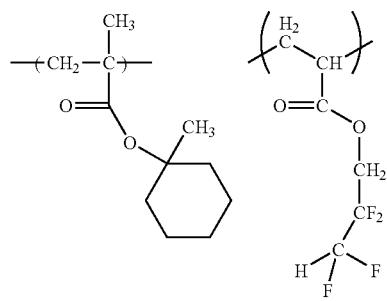

The component (C') can be obtained, for example, by a conventional radical polymerization or the like of the monomers corresponding with each of the structural units, using a radical polymerization initiator such as azobisisobutyronitrile (AIBN) or dimethyl azobis(isobutylate).

Furthermore, in the component (C'), by using a chain transfer agent such as HS—$CH_2$—$CH_2$—$CH_2$—$C(CF_3)_2$—OH, a —$C(CF_3)_2$—OH group may be introduced at the terminals of the component (C'). When a hydroxyalkyl group in which a part of the hydrogen atoms of the alkyl group has been substituted with fluorine atoms is introduced into a copolymer in this manner, the copolymer thus obtained can have an advantageous effect of reducing the levels of developing defects and LER (line edge roughness: non-uniform irregularities within the line side walls).

The weight average molecular weight (Mw) (the polystyrene equivalent value determined by gel permeation chromatography (GPC)) of the polymer compound (C') is not particularly restricted, and is preferably within the range of 2,000 to 50,000, more preferably 3,000 to 30,000, and most preferably 5,000 to 20,000. By ensuring that the weight average molecular weight of the component (C') is not more than the upper limit, solubility sufficient for a resist relative to a resist solvent can be obtained. By ensuring that it is not less than the lower limit, excellent dry-etching resistance and excellent cross-sectional shape of the resist pattern can be obtained.

Further, the dispersity (Mw/Mn) is preferably within the range of 1.0 to 5.0, more preferably 1.0 to 3.0, and still more preferably 1.2 to 2.5. Herein, Mn means the number average molecular weight.

As the component (C'), one type may be used alone, or two or more types may be used in combination.

In the positive resist composition for immersion exposure of the present invention, the proportion of the fluorine-containing polymeric compound (C') relative to the component (A') is preferably within the range of 0.1 to 10.0% by weight, more preferably 0.1 to 7.0% by weight, and particularly preferably 0.1 to 5.0% by weight. When this proportion is not less than the lower limit in the above range, then hydrophobicity of the resist composition can be effectively improved, whereas when this proportion is not more than the upper limit in the above range, then lithography properties can be improved.

<Optional Components>

The resist composition for immersion exposure of the first aspect of the present invention or the positive resist composition for immersion exposure of the second aspect of the present invention preferably further includes a nitrogen-containing organic compound (D) (hereinafter, referred to as component (D)) as an optional component. By including the component (D), the resist pattern shape and the post exposure stability of the latent image formed by the pattern-wise exposure of the resist layer are improved.

Since a multitude of these components (D) have already been proposed, any of these known compounds can be arbitrarily used. Of these, an aliphatic amine, particularly a secondary aliphatic amine or tertiary aliphatic amine is preferred. Here, the term "aliphatic" is a relative concept used in relation to the term "aromatic", and is defined as a group or compound or the like that contains no aromaticity.

The term "aliphatic cyclic group (alicyclic group)" means a monocyclic or polycyclic group that contains no aromaticity. An aliphatic amine is an amine having one or more aliphatic groups, and the aliphatic groups preferably have 1 to 12 carbon atoms.

Examples of the aliphatic amine include an amine (alkylamine or alkylalcoholamine) wherein at least one of the hydrogen atoms of $NH_3$ is substituted with an alkyl or hydroxyalkyl group of 1 to 12 carbon atoms.

Specific examples of the alkylamines or alkylalcoholamines include monoalkylamines such as n-hexylamine, n-heptylamine, n-octylamine, n-nonylamine, or n-decylamine; dialkylamines such as diethylamine, di-n-propylamine, di-n-heptylamine, di-n-octylamine, or dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, or tri-n-dodecylamine; and alkylalcoholamines such as diethanolamine, triethanolamine, diisopropanolamine, triisopropanolamine, di-n-octanolamine, or tri-n-octanolamine. Among these amines, a trialkylamine of 5 to 10 carbon atoms is preferable, tri-n-pentylamine or tri-n-octylamine is more preferable, and tri-n-pentylamine is most preferable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amines include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

As the component (D), one type may be used alone, or two or more types may be used in combination.

If the component (D) is included in the resist composition, the component (D) is typically used in a quantity within the range of 0.01 to 5.0 parts by weight, relative to 100 parts by weight of the component (A) or (A').

In the resist composition for immersion exposure of the first aspect of the present invention or the positive resist composition for immersion exposure of the second aspect of the present invention, in order to prevent any deterioration in sensitivity, and improve the resist pattern shape and the post exposure stability of the latent image formed by the pattern-wise exposure of the resist layer, at least one compound (E) selected from the group consisting of organic carboxylic acids and phosphorus oxo acids or derivatives thereof (hereinafter, referred to as component (E)) can also be added as an optional component.

Suitable examples of organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly preferable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinic esters such as phenylphosphinic acid.

As the component (E), one type may be used alone, or two or more types may be used in combination.

If the component (E) is included in the resist composition, the component (E) is used in a quantity within the range of 0.01 to 5.0 parts by weight, relative to 100 parts by weight of the component (A) or (A').

In the resist composition for immersion exposure of the first aspect of the present invention or the positive resist composition for immersion exposure of the second aspect of the present invention, if desired, additives having miscibility, for example, additive resins for improving performance of a resist film, surfactants for improving coatability, dissolution inhibitors, plasticizers, stabilizers, colorants, antihalation agents, and dyes can be appropriately added.

The resist composition for immersion exposure of the first aspect of the present invention or the positive resist composition for immersion exposure of the second aspect of the present invention can be prepared by dissolving materials in an organic solvent (S) (hereinafter, sometimes referred to as component (S)).

The component (S) may be an organic solvent which can dissolve the respective components used in the present invention to give a uniform solution, and one or more kinds of organic solvents can be used, appropriately selected from those which have been conventionally known as a solvent for a chemically-amplified resist.

Examples thereof include lactones such as γ-butyrolactone; ketones such as acetone, methyl ethyl ketone, cyclohexanone, methyl-n-pentyl ketone, methyl isopentyl ketone, or 2-heptanone; polyhydric alcohols such as ethylene glycol, diethylene glycol, propylene glycol, or dipropylene glycol; derivatives of the polyhydric alcohols, including compounds having ester bonds such as ethylene glycol monoacetate, diethylene glycol monoacetate, propylene glycol monoacetate or dipropylene glycol monoacetate, and compounds having ether bonds such as monoalkyl ethers (for example, monomethyl ether, monoethyl ether, monopropyl ether and monobutyl ether) or monophenyl ether of the above polyhydric alcohols or the above compounds having ester bonds; cyclic ethers such as dioxane; esters such as methyl lactate, ethyl lactate (EL), methyl acetate, ethyl acetate, butyl acetate, methyl pyruvate, ethyl pyruvate, methyl methoxypropionate, or ethyl ethoxypropionate; and aromatic organic solvents such as anisole, ethylbenzyl ether, cresylmethyl ether, diphenyl ether, dibenzyl ether, phenetole, butylphenyl ether, ethylbenzene, diethylbenzene, pentylbenzene, isopropylbenzene, toluene, xylene, cymene, or mesitylene.

These organic solvents may be used either alone, or may be used as a mixed solvent of two or more different solvents. Of these, propylene glycol monomethyl ether acetate (PGMEA), propylene glycol monomethyl ether (PGME) or EL is preferable.

Also, a mixed solvent obtained by mixing PGMEA and a polar solvent is preferable. The mixing ratio (mass ratio) of PGMEA to the polar solvent may be appropriately decided taking account of compatibility, and is preferably adjusted within the range of 1:9 to 9:1, and more preferably 2:8 to 8:2.

More specifically, in the case of using EL as the polar solvent, the mass ratio PGMEA:EL is preferably within the range of 1:9 to 9:1, and more preferably 2:8 to 8:2. Furthermore, in those cases of using PGME as the polar solvent, the mass ratio PGMEA:PGME is preferably within the range of 1:9 to 9:1, more preferably 2:8 to 8:2, and still more preferably 3:7 to 7:3.

Furthermore, as the component (S), mixed solvents of at least one of PGMEA and EL with γ-butyrolactone are also preferred. In such cases, the mass ratio of the former and latter components in the mixed solvents is preferably within the range of 70:30 to 99:1.

Furthermore, as the component (S), a mixed solvent of a mixture of PGMEA and PGME with γ-butyrolactone is also preferable.

There is no particular restriction on the quantity of the component (S), and the quantity should be set in accordance with the required coating film thickness within a concentration that enables favorable application of the solution to a substrate or the like. Typically, the quantity is set so that the solid fraction concentration within the resist composition falls within the range of 2 to 20% by weight, and still more preferably 5 to 15% by weight.

Dissolving of the materials in the component (S) can be conducted by simply mixing and stirring each of the above components together using conventional methods, and if required, the composition may also be mixed and dispersed using a dispersion device such as a dissolver, a homogenizer, or a triple roll mill. Furthermore, following mixing, the composition may also be filtered using a mesh, a membrane filter or the like.

The resist composition for immersion exposure of the first aspect of the present invention or the positive resist composition for immersion exposure of the second aspect of the present invention has excellent lithography properties and has hydrophobicity suitable for immersion exposure, which are properties required as the resist composition for immersion exposure, therefore it can be preferably used for immersion exposure.

That is, as described above, the immersion exposure method is a method in which exposure (immersion exposure) is conducted under the condition where the region between a lens and a resist film on a wafer, which has conventionally been filled with air or an inactive gas such as nitrogen gas, is filled with a solvent (immersion solvent) that has a larger refractive index than the refractive index of air. In immersion exposure, when the resist film and the immersion solvent make contact, elution of substances (such as the component (B) and/or the component (D)) within the resist film into the immersion solvent (namely, substance elution) occurs. This substance elution causes phenomena such as degeneration of the resist layer and variation in the refractive index of the immersion solvent, causing a deterioration in the lithography properties. The amount of this substance elution is affected by the properties of the resist film surface (such as the hydrophilicity or hydrophobicity). Accordingly, it is thought that by increasing the hydrophobicity of the resist film surface, the degree of substance elution can be reduced.

The resist composition for immersion exposure of the first aspect of the present invention includes the component (C) which contains the specific structural unit (c1) containing a fluorine atom, and thus the resist film formed by using the resist composition has hydrophobicity higher than the resist film formed by using a resist composition which does not contain the component (C). Therefore, according to the resist composition for immersion exposure of the present invention, substance elution can be suppressed when immersion exposure is conducted.

Further, the resist composition for immersion exposure described above also exhibits favorable lithography properties, as is evident from the examples presented below. For example, by using the resist composition for immersion exposure of the present invention, a very fine resist pattern can be formed in which the line width within a line and space (L/S) pattern is not more than 120 nm.

Similarly, the positive resist composition for immersion exposure of the second aspect of the present invention includes the component (C') which contains the specific structural unit (c0) containing a fluorine atom and the structural unit (c11), therefore the resist film formed by using the resist composition has hydrophobicity higher than the resist film formed by using a resist composition which does not contain the component (C'). Therefore, according to the positive resist composition for immersion exposure of the present invention, substance elution can be suppressed when immersion exposure is conducted.

Further, the positive resist composition for immersion exposure described above also exhibits favorable lithography properties, as is evident from the examples presented below. For example, by using the positive resist composition for immersion exposure of the present invention, a very fine resist pattern can be formed in which the line width within a line and space (L/S) pattern is not more than 120 nm.

By virtue of containing the component (C), a resist film formed using the resist composition for immersion exposure of the first aspect of the present invention has a resist film with higher hydrophobicity when compared with the case where a resist composition does not contain the component (C), and the contact angles relative to water, such as the static contact angle (the contact angle between the surface of a water droplet on the resist film in a horizontal state and the resist film surface), the dynamic contact angles (the contact angles at which a water droplet starts to slide when the resist film is inclined, including the contact angle at the front-end point of the water droplet in the sliding direction (advancing angle) and the contact angle at the rear-end point of the water droplet in the sliding direction (receding angle)), and the sliding angle (the inclination angle of the resin film at which a water droplet starts to slide when the resist film is inclined), are changed. For example, the higher the hydrophobicity of the resist film, the larger the static contact angle and the dynamic contact angles, and the smaller the sliding angle.

Similarly, by virtue of containing the component (C'), a resist film formed using the positive resist composition for immersion exposure of the second aspect of the present invention has a resist film with higher hydrophobicity when compared with the case where a resist composition does not contain the component (C), and the contact angles relative to water, such as the static contact angle, the dynamic contact angles, and the sliding angle, are changed. For example, the higher the hydrophobicity of the resist film, the larger the static contact angle and the dynamic contact angles, and the smaller the sliding angle.

As shown in FIG. 1, when a flat surface 2 with a liquid droplet 1 placed thereon is gradually inclined, the advancing angle describes the angle $\theta_1$ between the surface of the liquid droplet at the bottom edge 1a of the liquid droplet 1 and the flat surface 2 when the liquid droplet 1 starts to move (slide) down the flat surface 2. Further, at this point (the point when the liquid droplet 1 starts to move (slide) down the flat surface 2), the angle $\theta_2$ between the surface of the liquid droplet at the top edge 1b of the liquid droplet 1 and the flat surface 2 is the receding angle, and the sliding angle $\theta_3$ of the flat surface 2 is the sliding angle.

In the present description, the static contact angle, dynamic contact angles and sliding angle are measured in the following manner.

First, a resist composition solution is spin-coated onto a silicon substrate, and then heated at a temperature of 110° C. for 60 seconds to form a resist film.

Subsequently, the contact angles and the like can be measured using commercially available measurement apparatuses such as a DROP MASTER-700 (product name, manufactured by Kyowa Interface Science Co. Ltd.), AUTO SLIDING ANGLE: SA-30 DM (product name, manufactured by Kyowa Interface Science Co. Ltd.), and AUTO DISPENSER: AD-31 (product name, manufactured by Kyowa Interface Science Co. Ltd.).

With respect to the resist composition for immersion exposure of the first aspect of the present invention or the positive resist composition for immersion exposure of the second aspect of the present invention, the measured value of the receding angle for a resist film obtained using the resist composition is preferably 50 degrees or more, more preferably within the range of 50 to 150 degrees, still more preferably 50 to 130 degrees, and most preferably 53 to 100 degrees. If the receding angle is 50 degrees or more, then the effect of the composition in suppressing substance elution during immersion exposure can be further enhanced. The reasons are not clear, and it can be considered that the hydrophobicity of the resist film is involved as one of the main factors. That is, since an aqueous solvent such as water is used as the immersion solvent, high hydrophobicity enables the immersion solvent to be removed from the surface of the resist film immediately at the time of removing the immersion solvent after conducting immersion exposure. Also, when the receding angle is not more than 150 degrees, lithography properties and the like are excellent.

For similar reasons, with respect to the resist composition for immersion exposure of the first aspect of the present invention, the measured value of the advancing angle for a resist film obtained using the resist composition is preferably at least 80 degrees, and more preferably within the range of 85 to 100 degrees.

For similar reasons, with respect to the resist composition for immersion exposure of the first aspect of the present invention, the measured value of the static contact angle for a resist film obtained using the resist composition is preferably at least 70 degrees, more preferably within the range of 75 to 95 degrees, and still more preferably 80 to 95 degrees.

Also, with respect to the resist composition for immersion exposure of the first aspect of the present invention, the measured value of the sliding angle for a resist film obtained using the resist composition is preferably not more than 36 degrees, more preferably within the range of 10 to 36 degrees, still more preferably 12 to 30 degrees, and most preferably 14 to 27 degrees. If the sliding angle is not more than 36 degrees, then the effect of the composition in suppressing substance elution during immersion exposure can be further enhanced. Also, if the sliding angle is at least 10 degrees, lithography properties or the like can be excellent.

In the first aspect or second aspect of the present invention, angular size of each of the above angles (such as the static contact angle, dynamic contact angles (the advancing angle and receding angle), and sliding angle) can be controlled by adjusting the formulation of the resist composition for immersion exposure, such as the amount of the component (C) blended (or the amount of the component (C')), the proportion of the structural unti (c1) (or the proportion of the structural unit (c0)), or the kinds of the component (A) (or the kinds of the component (A')). For example, the higher the proportion of the structural unit (c1) within the component (C) (or the structural unit (c0) in the component (C')), or the more the amount of the component (C) (or the component (C')), the higher the hydrophobicity of the resulting resist composition, and the larger the static contact angle and dynamic contact angles, and the smaller the sliding angle.

Furthermore, as described above, in the first aspect or the second aspect of the present invention, the elution of substances from the resist film into the immersion solvent can be suppressed during immersion exposure. Accordingly, by using the resist composition for immersion exposure of the first aspect of the present invention or the positive resist composition for immersion exposure of the second aspect of the present invention in an immersion exposure process, degeneration of the resist film and changes in the refractive index of the immersion solvent can be suppressed. By suppressing fluctuation in the refractive index of the immersion solvent, the shape and the like of the resulting resist pattern can be improved.

Furthermore, staining of the lens of the exposure apparatus can also be reduced. As a result, protective measures for preventing such staining need not be performed, which contributes to simplification of both the process and the exposure apparatus.

Moreover, as described above, in those cases where immersion exposure is conducted using the scanning-type immersion exposure apparatus disclosed in Non-Patent Document 1, water tracking ability wherein the immersion medium is capable of tracking the movement of the lens is required, and in the present invention, the hydrophobicity of the resist film is high, resulting in a superior water tracking ability. Further, the resist composition for immersion exposure of the first aspect of the present invention exhibits favorable lithography properties, and when used as a resist in an immersion exposure process, the resist composition is capable of forming a resist pattern without any practical problems.

In this manner, the resist composition for immersion exposure of the first aspect of the present invention or the positive resist composition for immersion exposure of the second aspect of the present invention not only exhibits favorable lithography properties (such as sensitivity or resolution), but also has superior hydrophobicity, capability of suppressing substance elution, and water tracking ability, and therefore satisfies the properties required of a resist material for use with immersion exposure.

<<Method of Forming Resist Pattern>>

Next, the method of forming a resist pattern of the present invention will be described below.

The method of forming a resist pattern of the present invention is a method including: forming a resist film on a substrate using the resist composition for immersion exposure of the first aspect of the present invention, or the positive resist composition for immersion exposure of the second aspect of the present invention; conducting immersion exposure of the resist film; and developing the resist film to form a resist pattern.

A preferable mode of the method of forming a resist pattern of the present invention will be described below.

Firstly, the resist composition for immersion exposure of the first aspect of the present invention or the positive resist composition for immersion exposure of the second aspect of the present invention is applied on a substrate using a spinner or the like, and then a prebake (post applied bake (PAB)) treatment is conducted, thereby forming a resist film.

The substrate is not specifically limited and a conventionally known substrate can be used. For example, substrates for electronic components, and such substrates having prescribed wiring patterns formed thereon can be used. Specific examples thereof include a silicon wafer; a substrate made of a metal such as copper, chromium, iron or aluminum; and a substrate made of glass. As materials for the wiring pattern, for example, copper, aluminum, nickel or gold can be used.

Further, as the substrate, any one of the above-mentioned substrates provided with an inorganic and/or organic film on the surface thereof may be used. As the inorganic film, an inorganic anti-reflection film (inorganic BARC) can be used. As the organic film, organic films such as an organic anti-reflection film (organic BARC) or a lower-layer organic film used in a multilayer resist method can be used.

Here, a "multilayer resist method" is method in which at least one layer of an organic film (lower-layer organic film) and at least one layer of a resist film (upper-layer resist film) are provided on a substrate, and a resist pattern formed on the upper-layer resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers containing an upper-layer resist film, a lower-layer organic film and at least one intermediate layer (thin metal film or the like) provided between the upper-layer resist film and the lower-layer organic film.

After formation of a resist film, an organic antireflection film may be provided on the resist film, thereby forming a triple layer laminate consisting of the substrate, the resist film and the antireflection film. The anti-reflection film provided on top of the resist film is preferably soluble in an alkali developing solution.

The steps so far can be conducted by using a conventional method. It is preferable that the operating conditions or the like be arbitrarily set depending on the formulation or properties of the resist composition for immersion exposure of the first aspect or the positive resist composition for immersion exposure of the second aspect.

Subsequently, the resist film obtained above is selectively subjected to immersion exposure (liquid immersion lithography) through a desired mask pattern. Here, the region between the resist film and the lens at the lowermost point of the exposure apparatus is pre-filled with a solvent (immersion solvent) that has a larger refractive index than the refractive index of air, and then, keeping such a condition, the exposure (immersion lithography) is conducted.

There is no particular restriction on the wavelength used for the exposure, and the exposure can be conducted using radiation such as ArF excimer lasers, KrF excimer lasers, or $F_2$ lasers. The resist composition for immersion exposure of the present invention is effective for a KrF excimer laser or an ArF excimer laser, and particularly effective for an ArF excimer laser.

The immersion solvent is preferably a solvent that has a refractive index larger than the refractive index of air but smaller than the refractive index of the resist film formed by using the resist composition for immersion exposure of the first aspect of the present invention, or the positive resist composition for immersion exposure of the second aspect of the present invention. There is no restriction on the refractive index of the immersion solvent, as long as the solvent has a refractive index within the above range.

Examples of the solvent which has a refractive index larger than that of air but smaller than that of a resist film include water, a fluorine-based inactive liquid, a silicon-based solvent, and a hydrocarbon-based solvent.

Specific examples of the fluorine-based inactive liquid include a liquid which has a fluorine-based compound as a main component, such as $C_3HCl_2F_5$, $C_4F_9OCH_3$, $C_4F_9OC_2H_5$, and $C_5H_3F_7$. The fluorine-based inactive liquid preferably has a boiling point within the range of 70 to 180° C., and more preferably 80 to 160° C. If the fluorine-based inactive liquid has a boiling point within the above range, the solvent used for the immersion lithography can be removed by a convenient method after exposure, and consequently it is preferable.

The fluorine-based inactive liquid is particularly preferably a perfluoroalkyl compound in which all of the hydrogen atoms within an alkyl group are substituted with fluorine atoms. Specific examples of the perfluoroalkyl compound include perfluoroalkylether compounds and perfluoroalkylamine compounds.

Specific examples of the perfluoroalkylether compounds include perfluoro(2-butyl-tetrahydrofuran) (boiling point: 102° C.), and specific examples of the perfluoroalkylamine compounds include perfluorotributylamine (boiling point: 174° C.).

Since the resist composition for immersion exposure of the present invention is particularly resistant to any adverse effects caused by water, and thus excels in sensitivity and shape of the resist pattern profile, water is preferably used as the immersion solvent. Furthermore, water is also preferred in terms of cost, safety, environmental friendliness, and versatility.

After conducting immersion exposure, a post exposure bake (PEB) treatment is conducted, and then a developing treatment is conducted using an alkali developing solution composed of an aqueous alkali solution. Then, water rinse is preferably conducted with pure water. This water rinse can be conducted by dripping or spraying water onto the surface of the substrate while rotating the substrate, and washes away the developing solution and those portions of the resist composition for immersion exposure of the first aspect or the positive resist composition for immersion exposure of the second aspect that have been dissolved by the developing solution. Further, a drying treatment is conducted, thereby obtaining a resist pattern in which the resist film (coating of the resist composition for immersion exposure of the first aspect or the positive resist composition for immersion exposure of the second aspect) has been patterned with a shape faithful to the mask pattern.

EXAMPLES

The following is a description of examples of the present invention, although the scope of the present invention is by no way limited by these examples.

Example (1)

<Base component (A)>

The resin (A)-1 used as the component (A) in Examples 1 to 6, and Comparative Example 1 described below was obtained by copolymerizing the monomers (1) to (3) shown below using a conventional dropwise polymerization method.

[Chemical Formula 57]

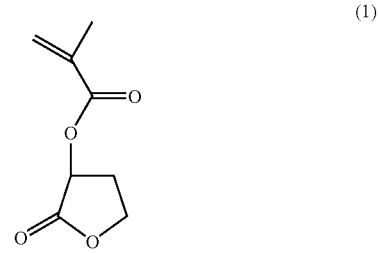

(1)

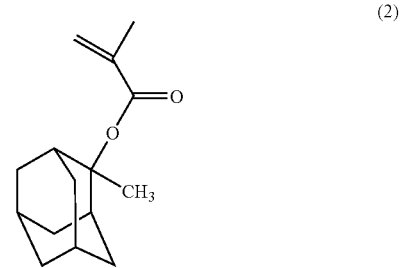

(2)

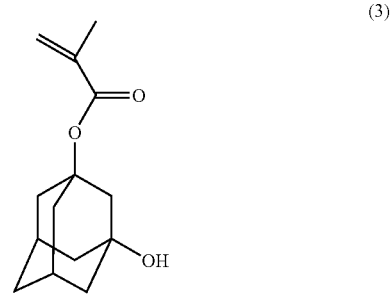

(3)

The weight average molecular weight (Mw) and the dispersity (Mw/Mn) of the obtained resin (A)-1 were determined by gel permeation chromatography (GPC). As a result, Mw was 7,000, and Mw/Mn was 2.0.

The structure of the resin (A)-1 is shown below. In the formula, each of the values at the bottom right of the brackets ( ) represents the proportion (mol %) of the structural unit based on the combined total of all structural units constituting the resin.

[Chemical Formula 58]

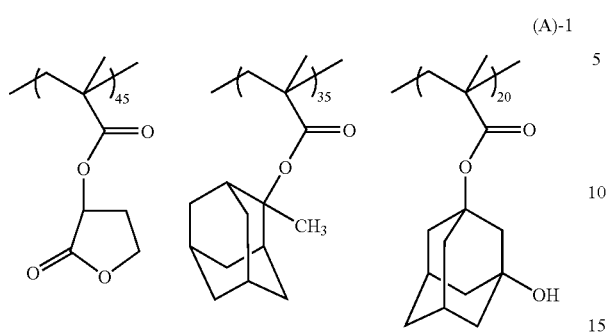

(A)-1

<Fluorine-Containing Resin Component (C)>

The resin (C)-1 used as the component (C) in Examples 1 to 6 below was synthesized by using 2,2,2-trifluoroethyl methacrylate (monomer represented by the formula (C)-0 shown below) as a monomer in accordance with Synthesis Example 1 below.

The structures of the resin (C)-1 and monomer (C)-0 are shown below. In the formula, each of the values at the bottom right of the brackets ( ) represents the proportion (mol %) of the structural unit based on the combined total of all structural units constituting the resin. That is, the resin (C)-1 is a homopolymer.

Synthesis Example 1

10.00 g of 2,2,2-trifluoroethyl methacrylate and 0.68 g of dimethyl azobis(isobutylate) (product name: V-601, manufactured by Wako Pure Chemical Industries, Ltd.) were added to a pear-shaped flask, and then dissolved in 70 g of anhydrous tetrahydrofuran (THF). The obtained solution was refluxed for three hours, and then cooled to room temperature. The solution was dropwise added to 1,160 g of a mixed solution of methanol/water (9:1 in mass ratio), thereby obtaining 4.79 g of the intended resin (C)-1.

[Chemical Formula 59]

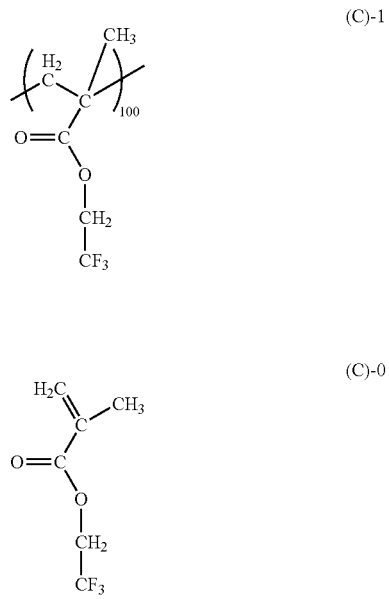

The weight average molecular weight (Mw) and the dispersity (Mw/Mn) of the obtained resin (C)-1 were determined by gel permeation chromatography (GPC). As a result, Mw was 16,100, and Mw/Mn was 1.44.

Also, the heat decomposition temperature (Td) and the glass transition temperature (Tg) of the resin (C)-1 were measured. As a result, the heat decomposition temperature (Td) thereof was 252.2° C., and the glass transition temperature (Tg) thereof was 207.5° C. Here, the Td (° C.) was measured at a heating rate of 10° C./min using a thermal analysis equipment DSC6200 (manufactured by Seiko Instrument Co., Ltd.). Tg (° C.) was measured at a heating rate of 10° C./min using a thermal analysis equipment TG/DTA6200 (manufactured by Seiko Instrument Co., Ltd.).

Examples 1 to 6, and Comparative Example 1

Each component shown in Table 1 was mixed and dissolved, thereby preparing positive resist compositions.

TABLE 1

|  | Component (A) | Component (B) | Component (C) | Component (D) | Component (S) |
| --- | --- | --- | --- | --- | --- |
| Comparative Example 1 | (A)-1 [100] | (B)-1 [8.0] | — | (D)-1 [1.20] | (S)-1 [2200] |
| Example 1 | (A)-1 [100] | (B)-1 [8.0] | (C)-1 [0.5] | (D)-1 [1.20] | (S)-1 [2200] |
| Example 2 | (A)-1 [100] | (B)-1 [8.0] | (C)-1 [1.0] | (D)-1 [1.20] | (S)-1 [2200] |
| Example 3 | (A)-1 [100] | (B)-1 [8.0] | (C)-1 [2.0] | (D)-1 [1.20] | (S)-1 [2200] |
| Example 4 | (A)-1 [100] | (B)-1 [8.0] | (C)-1 [3.0] | (D)-1 [1.20] | (S)-1 [2200] |
| Example 5 | (A)-1 [100] | (B)-1 [8.0] | (C)-1 [5.0] | (D)-1 [1.20] | (S)-1 [2200] |
| Example 6 | (A)-1 [100] | (B)-1 [8.0] | (C)-1 [10.0] | (D)-1 [1.20] | (S)-1 [2200] |

In Table 1, the abbreviations represent the following. The values within the brackets [ ] represent blending amount (parts by weight). The term "-" represents that nothing was blended.

(B)-1: (4-methylphenyl)diphenylsulfonium nonafluorobutanesulfonate.

(D)-1: tri-n-pentylamine.

(S)-1: a mixture solvent of PGMEA/PGME=6/4 (mass ratio).

Using each of the resist compositions obtained above, the hydrophobicity of the resist film was evaluated using the procedure described below, by measuring the static contact angle, the dynamic contact angles (the advancing angle and receding angle) and the sliding angle for the resist film surface prior to exposure and after exposure (hereinafter, this combination of angles is referred to jointly as "the contact angles").

<Evaluation of Hydrophobicity>

Each of the resist compositions of Examples 1 to 6, and Comparative Example 1 was applied onto an 8-inch silicon wafer using a spinner, and was then prebaked (PAB) on a hotplate at 110° C. for 60 seconds and dried, thereby forming a resist film having a film thickness of 140 nm.

Subsequently, 50 μL of water was dropwise added to the surface of the resist film (resist film before exposure), and the contact angles thereof were measured using a DROP MASTER-700 (product name, manufactured by Kyowa Interface Science Co. Ltd.).

Further, each of the resist films was formed in the same manner as described above, and then open frame exposure (exposure without a mask) was performed using an ArF exposure apparatus NSR-S302 (product name, manufactured by Nikon Corporation, NA (numerical aperture)=0.60, σ=0.75) with an ArF excimer laser (193 nm) (exposure dose: 20 mJ/cm$^2$). Thereafter, the contact angles of the surface of the resist film (the resist film after exposure) were measured in the same manner as described above.

The results of measuring the contact angles of the resist films before and after exposure are shown in Tables 2 and 3. Further, the proportion (parts by weight) of the component (C) blended relative to 100 parts by weight of the component (A) in each of the resist compositions (hereinafter, simply referred to as "the proportion of the component (C)") is also shown in Tables 2 and 3.

Figure 2:
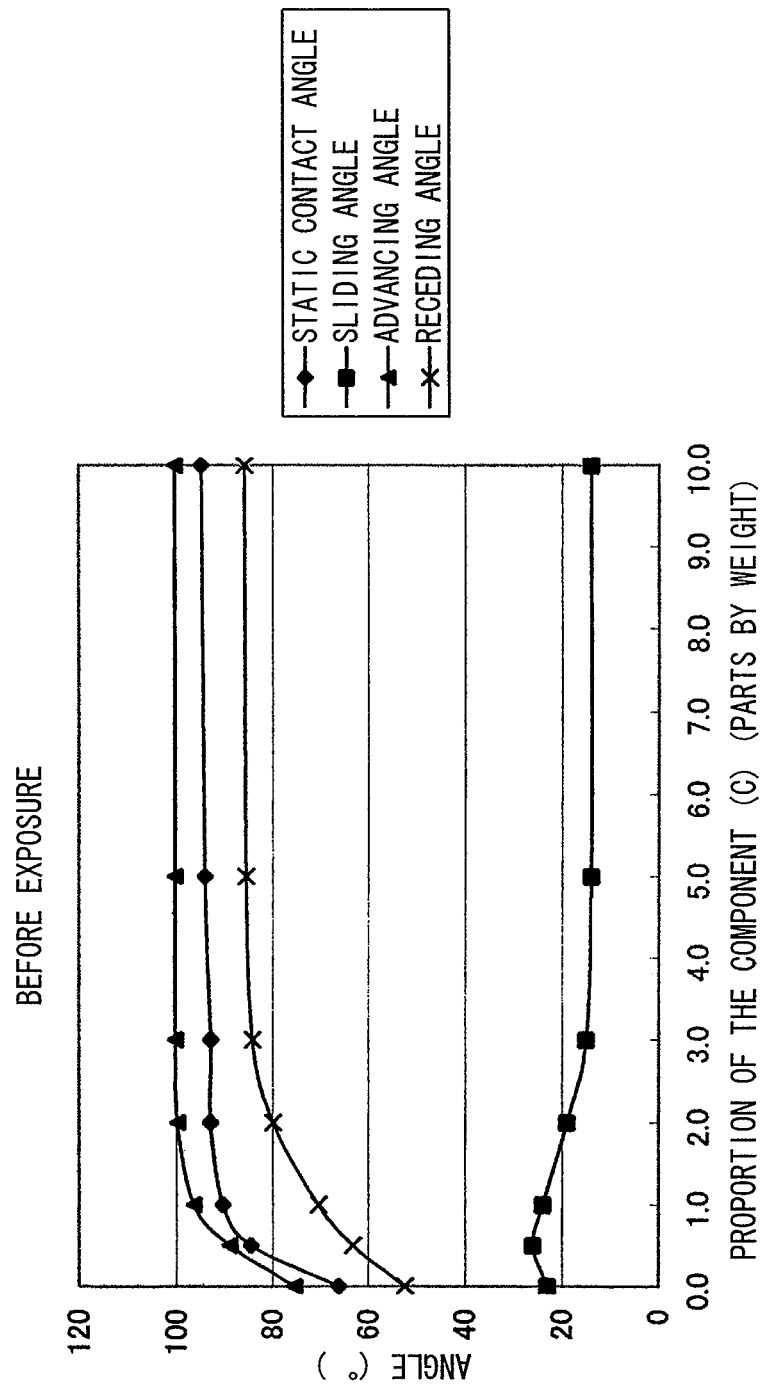
FIG. 2 is a graph showing the relationship between the proportion of the component (C) (parts by weight) and the contact angles or the like (°) of the resist film before exposure in Example (1).
Figure 3:
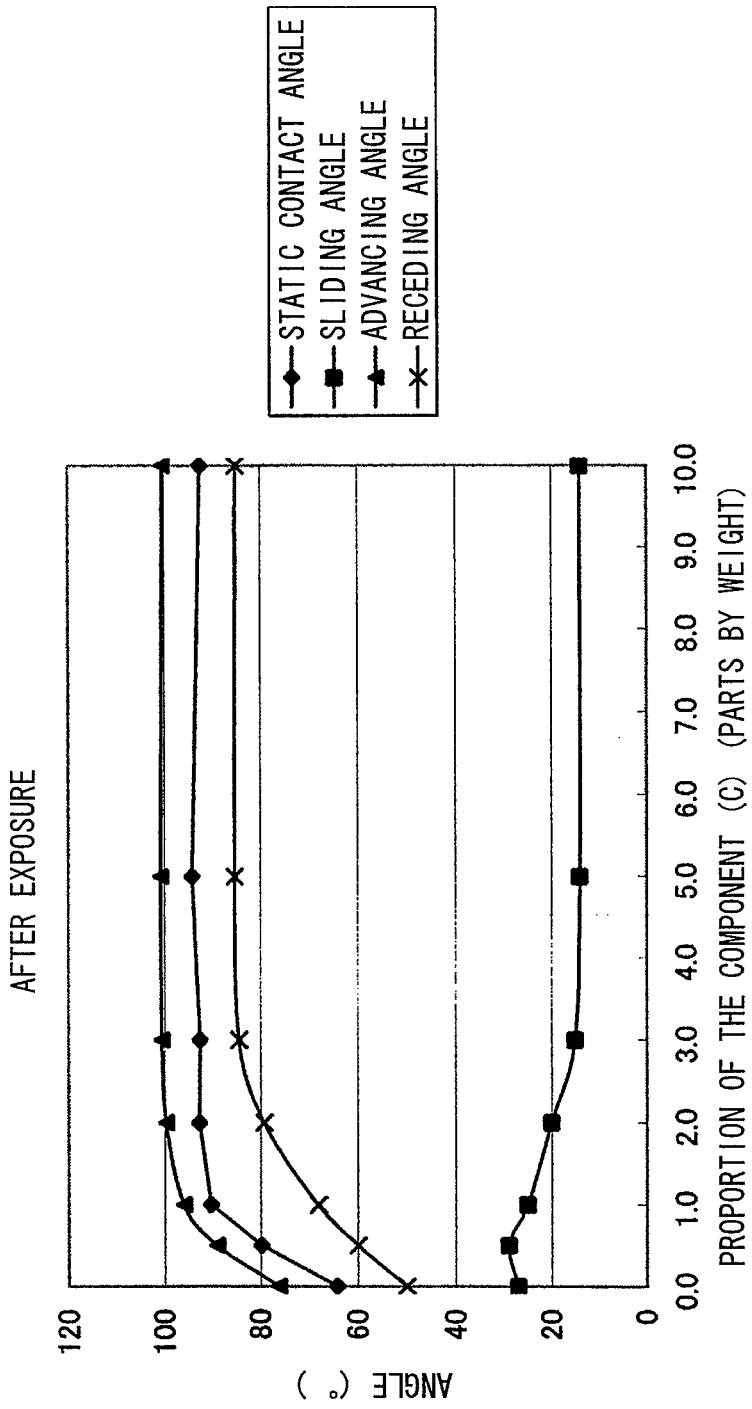
FIG. 3 is a graph showing the relationship between the proportion of the component (C) (parts by weight) and the contact angles or the like (°) of the resist film after exposure in Example (1).

Furthermore, from these results, with respect to each of before and after exposure, the proportion of the component (C) (parts by weight) is plotted along the abscissa axis and the angles (°) such as the contact angles are plotted along the longitudinal axis, thereby making graphs. These graphs are shown in FIGS. 2 and 3.

TABLE 2

|  | Before exposure | | | | |
|---|---|---|---|---|---|
|  | The proportion of the | Static | | Dynamic contact angles | |
|  | component (C) (parts by weight) | contact angle (°) | Sliding angle (°) | Advancing angle (°) | Receding angle (°) |
| Comparative Example 1 | 0 | 66.1 | 23.0 | 75.4 | 52.4 |
| Example 1 | 0.5 | 84.5 | 26.0 | 88.9 | 63.2 |
| Example 2 | 1.0 | 90.3 | 24.0 | 96.4 | 70.4 |
| Example 3 | 2.0 | 92.9 | 19.0 | 99.8 | 79.9 |

TABLE 2-continued

|  | Before exposure | | | | |
|---|---|---|---|---|---|
|  | The proportion of the | Static | | Dynamic contact angles | |
|  | component (C) (parts by weight) | contact angle (°) | Sliding angle (°) | Advancing angle (°) | Receding angle (°) |
| Example 4 | 3.0 | 92.8 | 15.0 | 100.2 | 84.2 |
| Example 5 | 5.0 | 94.0 | 14.0 | 100.3 | 85.5 |
| Example 6 | 10.0 | 94.7 | 14.0 | 100.3 | 85.8 |

TABLE 3

|  | After exposure | | | | |
|---|---|---|---|---|---|
|  | The proportion of the | Static | | Dynamic contact angles | |
|  | component (C) (parts by weight) | contact angle (°) | Sliding angle (°) | Advancing angle (°) | Receding angle (°) |
| Comparative Example 1 | 0 | 64.2 | 27.0 | 76.2 | 50.0 |
| Example 1 | 0.5 | 79.8 | 29.0 | 89.1 | 59.9 |
| Example 2 | 1.0 | 90.3 | 25.0 | 96.0 | 68.1 |
| Example 3 | 2.0 | 92.7 | 20.0 | 99.7 | 79.3 |
| Example 4 | 3.0 | 92.6 | 15.0 | 100.6 | 84.5 |
| Example 5 | 5.0 | 94.2 | 14.0 | 100.8 | 85.4 |
| Example 6 | 10.0 | 92.4 | 14.0 | 100.4 | 85.1 |

From the results shown in Tables 2 and 3, it was confirmed that the resist film obtained by using each of the resist compositions of Examples 1 to 6 was a resist film having hydrophobicity higher than the resist film obtained by using the resist composition of Comparative Example 1.

<Evaluation of Lithography Properties>

With respect to each of the resist compositions of Examples 1 to 6 and Comparative Example 1, a resist pattern was formed by the following procedure.

An organic anti-reflection film composition (product name: ARC29A, manufactured by Brewer Science Ltd.) was applied onto an 8-inch silicon wafer using a spinner, and the composition was then baked on a hotplate at 205° C. for 60 seconds, thereby forming an organic anti-reflection film having a film thickness of 77 nm.

Then, each of the resist compositions of Examples 1 to 6 and Comparative Example 1 was applied onto the anti-reflection film using a spinner, and was then prebaked (PAB) on a hotplate at 120° C. for 60 seconds and dried, thereby forming a resist film having a film thickness of 150 nm.

Subsequently, the resist film was selectively exposed with an ArF excimer laser (193 nm) through a mask pattern, using an ArF exposure apparatus NSR-S302 (product name, manufactured by Nikon Corporation, NA (numerical aperture)=0.60, ⅔ annular illumination). A post exposure baking (PEB) treatment was then conducted at 110° C. for 60 seconds, the resist film was subjected to alkali developing for 30 seconds at 23° C. in a 2.38% by weight aqueous solution of tetramethylammonium hydroxide (TMAH), and was then rinsed with water for 20 seconds and dried by shaking. Thereafter, the resist film was heated at 100° C. for 60 seconds to be dried.

(Resolution)

As a result, in each example, a line and space resist pattern (L/S pattern) was formed with a line width of 120 nm and a space width of 120 nm (pitch: 240 nm).

From the above evalution results, it was confirmed that each of the resist compositions of Examples 1 to 6 containing the components (A), (B) and (C) had excellent lithography properties, and had a hydrophobicity suitable for immersion exposure.

Example (2)

<Component (A')>

The polymeric compound (A')-1 and the polymeric compound (A')-2 used as the component (A') in Examples 7 to 21 and Comparative Example 2 described below were obtained by copolymerizing the monomers (1) to (4) shown below using a conventional dropwise polymerization method.

[Chemical Formula 60]

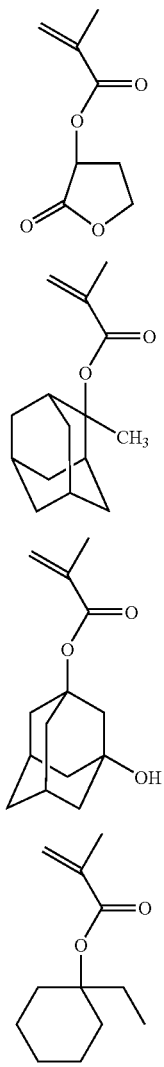

(1)
(2)
(3)
(4)

The weight average molecular weight (Mw) and the dispersity (Mw/Mn) of the obtained polymeric compound (A')-1 were determined by gel permeation chromatography (GPC). As a result, Mw was 7,000, and Mw/Mn was 1.8.

The weight average molecular weight (Mw) and the dispersity (Mw/Mn) of the obtained polymeric compound (A')-2 were determined by gel permeation chromatography (GPC). As a result, Mw was 10,000, and Mw/Mn was 1.6.

The structures of the polymeric compounds (A')-1 and (A')-2 are shown below. In the formula, each of the values at the bottom right of the brackets ( ) represents the proportion (mol %) of the structural unit based on the combined total of all structural units constituting the polymeric compound.

[Chemical Formula 61]

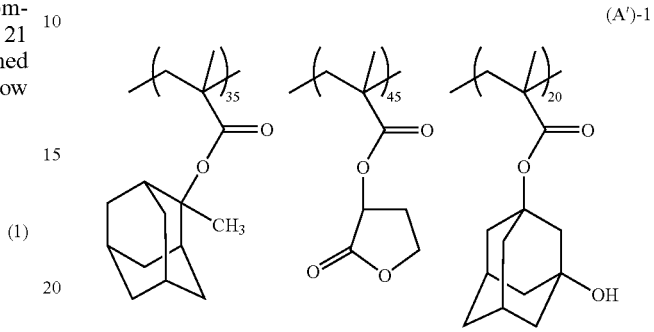

(A')-1

[Chemical Formula 62]

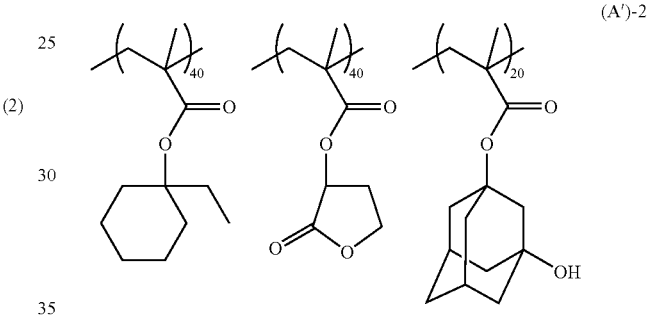

(A')-2

<Component (C')>

The component (C') used in Examples 7 to 21 below was synthesized by using 1-ethylcyclohexyl methacrylate (monomer represented by the formula (4) shown above) and 2,2,2-trifluoroethyl methacrylate (monomer represented by the formula (5) shown below) as monomers in accordance with Synthesis Examples 2 to 4 below.

The structure of the component (C') obtained is shown below. In the formula(c0-1-1-1) shown below, x at the bottom right of the brackets ( ) represents the proportion(mol %) of the structural unit (c11) based on the combined total of all structural units constituting the component (C'), and y at the bottom right of the brackets ( ) represents the proportion (mol %) of the structural unit (c0) based on the combined total of all structural units constituting the component (C').

[Chemical Formula 63]

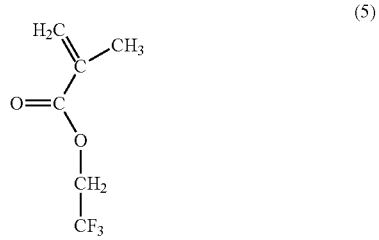

(5)

[Chemical Formula 64]
-continued

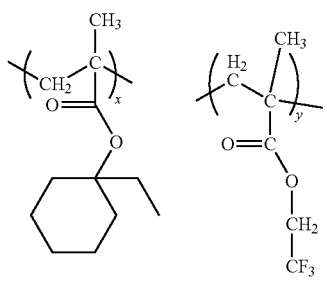

(c0-1-1-1)

Synthesis Examples 2 to 4

A predetermined amount of 2,2,2-trifluoroethyl methacrylate, a predetermined amount of 1-ethylcyclohexyl methacrylate, and dimethyl azobis(isobutylate) (product name: V-601, manufactured by Wako Pure Chemical Industries, Ltd.) were added to a pear-shaped flask, and then dissolved in anhydrous tetrahydrofuran (THF). The resultant solution was refluxed for about 3 hours, and then cooled to room temperature. Thereafter, it was dropwise added to a mixed solution of methanol/water (9/1 in mass ratio), thereby synthesizing the intended fluorine-containing polymeric compound (C')-i in which x:y was 27:73 in the above general formula (c0-1-1-1) (Synthesis Example 2). Similarly, the fluorine-containing polymeric compound (C')-ii was synthesized in which x:y was 52:48 in the above general formula (c0-1-1-1) (Synthesis Example 3), and the fluorine-containing polymeric compound (C')-iii was synthesized in which x:y was 76:24 in the above general formula (c0-1-1-1) (Synthesis Example 4).

The weight average molecular weight (Mw) and the dispersity (Mw/Mn) of each the obtained fluorine-containing polymeric compounds (C')-i, (C')-ii, and (C')-iii were determined by gel permeation chromatography (GPC).

TABLE 4

|  | x:y | Mw | Mw/Mn |
| --- | --- | --- | --- |
| (C')-i | 27:73 | 17,770 | 1.57 |
| (C')-ii | 52:48 | 15,300 | 2.02 |
| (C')-iii | 76:24 | 15,100 | 2.02 |

Examples 7 to 21, and Comparative Example 2

Each of the components shown in Tables 5 to 7 were mixed and dissolved, thereby providing positive resist compositions for immersion exposure.

TABLE 5

|  | Component (A') | | Component (B) | | Component (C') | Component (D) | Component (E) | Component (S) | |
| --- | --- | --- | --- | --- | --- | --- | --- | --- | --- |
| Comparative Example 2 | (A')-1 [80] | (A')-2 [20] | (B)-1 [3.3] | (B)-2 [6.8] | — | (D)-1 [0.85] | (E)-1 [1.32] | (S)-1 [2200] | (S)-2 [10.0] |
| Example 7 | (A')-1 [80] | (A')-2 [20] | (B)-1 [3.3] | (B)-2 [6.8] | (C')-i [0.5] | (D)-1 [0.85] | (E)-1 [1.32] | (S)-1 [2200] | (S)-2 [10.0] |
| Example 8 | (A')-1 [80] | (A')-2 [20] | (B)-1 [3.3] | (B)-2 [6.8] | (C')-i [1.0] | (D)-1 [0.85] | (E)-1 [1.32] | (S)-1 [2200] | (S)-2 [10.0] |
| Example 9 | (A')-1 [80] | (A')-2 [20] | (B)-1 [3.3] | (B)-2 [6.8] | (C')-i [2.0] | (D)-1 [0.85] | (E)-1 [1.32] | (S)-1 [2200] | (S)-2 [10.0] |
| Example 10 | (A')-1 [80] | (A')-2 [20] | (B)-1 [3.3] | (B)-2 [6.8] | (C')-i [3.0] | (D)-1 [0.85] | (E)-1 [1.32] | (S)-1 [2200] | (S)-2 [10.0] |
| Example 11 | (A')-1 [80] | (A')-2 [20] | (B)-1 [3.3] | (B)-2 [6.8] | (C')-i [5.0] | (D)-1 [0.85] | (E)-1 [1.32] | (S)-1 [2200] | (S)-2 [10.0] |

TABLE 6

|  | Component (A') | | Component (B) | | Component (C') | Component (D) | Component (E) | Component (S) | |
| --- | --- | --- | --- | --- | --- | --- | --- | --- | --- |
| Comparative Example 2 | (A')-1 [80] | (A')-2 [20] | (B)-1 [3.3] | (B)-2 [6.8] | — | (D)-1 [0.85] | (E)-1 [1.32] | (S)-1 [2200] | (S)-2 [10.0] |
| Example 12 | (A')-1 [80] | (A')-2 [20] | (B)-1 [3.3] | (B)-2 [6.8] | (C')-ii [0.5] | (D)-1 [0.85] | (E)-1 [1.32] | (S)-1 [2200] | (S)-2 [10.0] |
| Example 13 | (A')-1 [80] | (A')-2 [20] | (B)-1 [3.3] | (B)-2 [6.8] | (C')-ii [1.0] | (D)-1 [0.85] | (E)-1 [1.32] | (S)-1 [2200] | (S)-2 [10.0] |
| Example 14 | (A')-1 [80] | (A')-2 [20] | (B)-1 [3.3] | (B)-2 [6.8] | (C')-ii [2.0] | (D)-1 [0.85] | (E)-1 [1.32] | (S)-1 [2200] | (S)-2 [10.0] |
| Example 15 | (A')-1 [80] | (A')-2 [20] | (B)-1 [3.3] | (B)-2 [6.8] | (C')-ii [3.0] | (D)-1 [0.85] | (E)-1 [1.32] | (S)-1 [2200] | (S)-2 [10.0] |
| Example 16 | (A')-1 [80] | (A')-2 [20] | (B)-1 [3.3] | (B)-2 [6.8] | (C')-ii [5.0] | (D)-1 [0.85] | (E)-1 [1.32] | (S)-1 [2200] | (S)-2 [10.0] |

TABLE 7

|  | Component (A') | | | | Component (B) | | Component (C') | Component (D) | Component (E) | Component (S) | |
|---|---|---|---|---|---|---|---|---|---|---|---|
| Comparative Example 2 | (A')-1 [80] | (A')-2 [20] | (B)-1 [3.3] | (B)-2 [6.8] | | | — | (D)-1 [0.85] | (E)-1 [1.32] | (S)-1 [2200] | (S)-2 [10.0] |
| Example 17 | (A')-1 [80] | (A')-2 [20] | (B)-1 [3.3] | (B)-2 [6.8] | | | (C')-iii [0.5] | (D)-1 [0.85] | (E)-1 [1.32] | (S)-1 [2200] | (S)-2 [10.0] |
| Example 18 | (A')-1 [80] | (A')-2 [20] | (B)-1 [3.3] | (B)-2 [6.8] | | | (C')-iii [1.0] | (D)-1 [0.85] | (E)-1 [1.32] | (S)-1 [2200] | (S)-2 [10.0] |
| Example 19 | (A')-1 [80] | (A')-2 [20] | (B)-1 [3.3] | (B)-2 [6.8] | | | (C')-iii [2.0] | (D)-1 [0.85] | (E)-1 [1.32] | (S)-1 [2200] | (S)-2 [10.0] |
| Example 20 | (A')-1 [80] | (A')-2 [20] | (B)-1 [3.3] | (B)-2 [6.8] | | | (C')-iii [3.0] | (D)-1 [0.85] | (E)-1 [1.32] | (S)-1 [2200] | (S)-2 [10.0] |
| Example 21 | (A')-1 [80] | (A')-2 [20] | (B)-1 [3.3] | (B)-2 [6.8] | | | (C')-iii [5.0] | (D)-1 [0.85] | (E)-1 [1.32] | (S)-1 [2200] | (S)-2 [10.0] |

In Tables 5 to 7, the reference characters indicate the following. Also, the values within the brackets [ ] represent the blending amount (parts by weight). The term "-" represents that nothing was blended.

(A')-1: a copolymer represented by the above formula (A')-1.

(A')-2: a copolymer represented by the above formula (A')-2.

(B)-1: (4-methylphenyl)diphenylsulfonium nonafluorobutanesulfonate.

(B)-2: di(1-naphthyl)phenylsulfonium nonafluorobutanesulfonate.

(D)-1: tri-n-pentylamine.

(E)-1: salicylic acid.

(S)-1: a mixture solvent of PGMEA/PGME=6/4 (mass ratio).

(S)-2: γ-butyrolactone.

Using each of the resist compositions obtained above, the hydrophobicity of the resist film was evaluated using the procedure described below, by measuring the static contact angle, the dynamic contact angle (the receding angle) and the sliding angle for the resist film surface prior to exposure and after exposure (hereinafter, this combination of angles is referred to jointly as "the contact angles").

<Evaluation of Hydrophobicity>

Each of the resist compositions of Examples 7 to 21 and Comparative Example 2 was applied onto an 8-inch silicon wafer using a spinner, and was then prebaked (PAB) on a hotplate at 110° C. for 60 seconds and dried, thereby forming a resist film having a film thickness of 140 nm.

Subsequently, 50 µL of water was dropwise added to the surface of the resist film (resist film before exposure), and the contact angles thereof were measured using a DROP MASTER-700 (product name, manufactured by Kyowa Interface Science Co. Ltd.).

Further, a resist film was formed in the same manner as described above, and then open frame exposure (exposure without a mask) was performed using an ArF exposure apparatus NSR-S302 (product name, manufactured by Nikon Corporation, NA (numerical aperture)=0.60, σ=0.75) with an ArF excimer laser (193 nm) (exposure dose: 20 mJ/cm$^2$). Thereafter, the contact angles of the resist film (the resist film after exposure) were measured in the same manner as described above.

The results of measuring the contact angles of the resist films before and after exposure are shown in Tables 8 to 10. Further, the proportion (parts by weight) of the component (C') blended relative to 100 parts by weight of the component (A') in each of the resist compositions (hereinafter, simply referred to as "the proportion of the component (C')") is also shown in Tables 8 to 10.

TABLE 8

| | | Before exposure | | | After exposure | | |
|---|---|---|---|---|---|---|---|
| | The proportion of the component (C') (parts by weight) | Sliding angle (°) | Contact angle (°) | Receding angle (°) | Sliding angle (°) | Contact angle (°) | Receding angle (°) |
| Comparative Example 2 | 0 | 26 | 67.7 | 53.5 | 27 | 66.3 | 53.0 |
| Example 7 | 0.5 | 24 | 81.2 | 66.1 | 24 | 81.8 | 65.8 |
| Example 8 | 1.0 | 20 | 90.8 | 74.6 | 20 | 90.3 | 75.0 |
| Example 9 | 2.0 | 18 | 92.7 | 82.1 | 17 | 93.1 | 82.3 |
| Example 10 | 3.0 | 16 | 92.5 | 82.7 | 16 | 90.7 | 83.6 |
| Example 11 | 5.0 | 15 | 91.5 | 84.5 | 15 | 93.2 | 83.9 |

TABLE 9

| | | Before exposure | | | After exposure | | |
|---|---|---|---|---|---|---|---|
| | The proportion of the component (C') (parts by weight) | Sliding angle (°) | Contact angle (°) | Receding angle (°) | Sliding angle (°) | Contact angle (°) | Receding angle (°) |
| Comparative Example 2 | 0 | 26 | 67.7 | 53.5 | 27 | 66.3 | 53.0 |
| Example 12 | 0.5 | 23 | 76.3 | 64.2 | 24 | 77.3 | 63.4 |

TABLE 9-continued

| | The proportion of the component (C') (parts by weight) | Before exposure | | | After exposure | | |
|---|---|---|---|---|---|---|---|
| | | Sliding angle (°) | Contact angle (°) | Receding angle (°) | Sliding angle (°) | Contact angle (°) | Receding angle (°) |
| Example 13 | 1.0 | 20 | 86.3 | 72.7 | 21 | 87.0 | 72.5 |
| Example 14 | 2.0 | 16 | 91.4 | 78.8 | 17 | 92.6 | 80.9 |
| Example 15 | 3.0 | 15 | 91.3 | 83.2 | 15 | 90.7 | 83.0 |
| Example 16 | 5.0 | 14 | 92.4 | 84.5 | 15 | 93.5 | 83.2 |

TABLE 10

| | The proportion of the component (C') (parts by weight) | Before exposure | | | After exposure | | |
|---|---|---|---|---|---|---|---|
| | | Sliding angle (°) | Contact angle (°) | Receding angle (°) | Sliding angle (°) | Contact angle (°) | Receding angle (°) |
| Comparative Example 2 | 0 | 26 | 67.7 | 53.5 | 27 | 66.3 | 53.0 |
| Example 17 | 0.5 | 25 | 69.5 | 56.2 | 26 | 68.0 | 54.8 |
| Example 18 | 1.0 | 26 | 70.1 | 57.4 | 27 | 70.1 | 56.1 |
| Example 19 | 2.0 | 25 | 71.8 | 58.8 | 26 | 70.9 | 57.7 |
| Example 20 | 3.0 | 25 | 71.9 | 60.0 | 26 | 72.7 | 58.8 |
| Example 21 | 5.0 | 25 | 74.4 | 61.9 | 27 | 75.8 | 60.4 |

From the results shown in Tables 8 to 10, it was confirmed that the resist film obtained by using each of the resist compositions of Examples 7 to 21 was a resist film having a hydrophobicity higher than the resist film obtained by using the resist composition of Comparative Example 2.

<Evaluation of Lithography Properties>

With respect to each of the resist compositions of Examples 7 to 21 and Comparative Example 2, a resist pattern was formed by the following procedure.

An organic anti-reflection film composition (product name: ARC29A, manufactured by Brewer Science Ltd.) was applied onto an 8-inch silicon wafer using a spinner, and the composition was then baked on a hotplate at 205° C. for 60 seconds to be dried, thereby forming an organic anti-reflection film having a film thickness of 82 nm. Then, each of the resist compositions of Examples 7 to 21 and Comparative Example 2 was applied onto the anti-reflection film using a spinner, and was then prebaked (PAB) on a hotplate at 110° C. for 60 seconds and dried, thereby forming a resist film having a film thickness of 120 nm.

Subsequently, the resist film was selectively exposed with an ArF excimer laser (193 nm) through a mask pattern, using an ArF exposure apparatus NSR-S302 (product name, manufactured by Nikon Corporation, NA (numerical aperture) =0.60, ⅔ annular illumination). A post exposure baking (PEB) treatment was then conducted at 110° C. for 60 seconds, the resist film was subjected to alkali developing for 30 seconds at 23° C. in a 2.38% by weight aqueous solution of tetramethylammonium hydroxide (TMAH), and was then rinsed with water for 20 seconds and dried by shaking.

(Resolution)

As a result, in each example, a line and space resist pattern (L/S pattern) was formed with a line width of 120 nm and a space width of 120 nm (pitch: 240 nm).

From the above evaluation results, it was confirmed that each of the resist compositions of Examples 7 to 21 containing the components (A'), (B) and (C') had excellent lithography properties and had hydrophobicity suitable for immersion exposure.

Industrial Applicability

According to the present invention, there can be provided a resist composition for immersion exposure which has excellent lithography properties and has hydrophobicity suitable for immersion exposure; and a method of forming a resist pattern.

The invention claimed is:

1. A resist composition for immersion exposure, comprising: a base component (A) which exhibits changed solubility in an alkali developing solution under action of an acid, and contains no structural unit (c1) represented by the general formula (c1-1) shown below; an acid generator component (B) which generates an acid upon exposure; and a fluorine-containing resin component (C) which is a monoacrylate polymer, wherein the fluorine-containing resin component (C) contains the structural unit (c1) and a structural unit (a1) derived from an acrylate ester which contains an acid dissociable, dissolution inhibiting group:

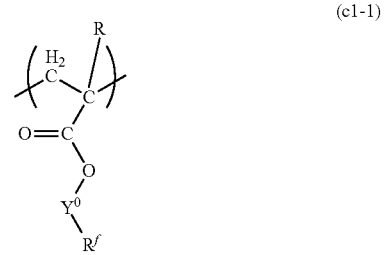

(c1-1)

(in the formula (c1-1), R represents a hydrogen atom, a lower alkyl group, a halogen atom, or a halogenated lower alkyl group; $R^f$ represents a linear fluorinated alkyl group; and $Y^0$ represents a linear alkylene group), wherein in the component (C), the proportion of the structural unit (c1) is at least 50 mol %, based on the combined total of the structural unit (c1) and the structural unit (a1), and the measured value of the static contact angle for a resist film obtained using the resist composition is within the range of 70 to 95 degrees.

2. The resist composition for immersion exposure according to claim 1, wherein the content of the fluorine-containing resin component (C) is within the range of 0.1 to 10 parts by weight, relative to 100 parts by weight of the base component (A).

3. The resist composition for immersion exposure according to claim 1, wherein the base component (A) is a resin (A1) which contains an acid dissociable, dissolution inhibiting group and exhibits increased solubility in an alkali developing solution under action of an acid.

4. The resist composition for immersion exposure according to claim 3, wherein the resin (A1) comprises a structural unit (a1) derived from an acrylate ester which contains an acid dissociable, dissolution inhibiting group.

5. The resist composition for immersion exposure according to claim 4, wherein the resin component (A1) further comprises a structural unit (a2) derived from an acrylate ester which has a lactone-containing cyclic group.

6. The resist composition for immersion exposure according to claim 5, wherein the resin component (A1) further comprises a structural unit (a3) derived from an acrylate ester which has a polar group-containing aliphatic hydrocarbon group.

7. The resist composition for immersion exposure according to claim 4, wherein the resin component (A1) further comprises a structural unit (a3) derived from an acrylate ester which has a polar group-containing aliphatic hydrocarbon group.

8. The resist composition for immersion exposure according to claim 1, further comprising a nitrogen-containing organic compound (D).

9. A method of forming a resist pattern comprising: forming a resist film on a substrate using the resist composition of any one of claims 1 to 8; conducting immersion exposure of the resist film; and developing the resist film to form a resist pattern.

* * * * *